US011097633B1

(12) United States Patent
Kohn et al.

(10) Patent No.: US 11,097,633 B1
(45) Date of Patent: Aug. 24, 2021

(54) USING BATTERY STATE EXCITATION TO MODEL AND CONTROL BATTERY OPERATIONS

(71) Applicant: Veritone Alpha, Inc., Costa Mesa, CA (US)

(72) Inventors: Wolf Kohn, Seattle, WA (US); Yanfang Shen, Bellevue, WA (US); Xiaofeng Zhang, Bellevue, WA (US)

(73) Assignee: Veritone Alpha, Inc., Costa Mesa, CA (US)

( * ) Notice: Subject to any disclaimer, the term of this patent is extended or adjusted under 35 U.S.C. 154(b) by 275 days.

(21) Appl. No.: 16/289,602

(22) Filed: Feb. 28, 2019

Related U.S. Application Data

(60) Provisional application No. 62/796,581, filed on Jan. 24, 2019.

(51) Int. Cl.
*B60L 58/12* (2019.01)
*B60L 15/20* (2006.01)
(Continued)

(52) U.S. Cl.
CPC ............. *B60L 58/12* (2019.02); *B60L 15/20* (2013.01); *G01R 31/36* (2013.01); *G05B 13/0265* (2013.01); *H02J 7/00* (2013.01)

(58) Field of Classification Search
CPC .. B60L 58/12; B60L 15/20; H02J 7/00; G01R 31/36; G05B 13/0265
(Continued)

(56) References Cited

U.S. PATENT DOCUMENTS

| 5,724,239 A | 3/1998 | Kaneko |
| 5,727,128 A | 3/1998 | Morrison |

(Continued)

FOREIGN PATENT DOCUMENTS

| JP | 2008-546370 A | 12/2008 |
| JP | 2015-025685 A | 2/2015 |

(Continued)

OTHER PUBLICATIONS

Hyndman, "Forecasting: Principles & Practice", Workshop at University of Western Australia (robjhyndman.com/uwa), 138 pages, Sep. 23-25, 2014.

(Continued)

*Primary Examiner* — M Baye Diao
(74) *Attorney, Agent, or Firm* — VLP Law Group LLP; James A. D. White

(57) ABSTRACT

Techniques are described for implementing automated control systems to control operations of target physical systems including batteries, such as based at least in part on models of the batteries' dynamic behaviors that are generated by gathering and analyzing information about the batteries' operations under varying conditions. The techniques may include, for each of multiple charge levels of a battery and for each of multiple resistive loads, injecting multi-frequency microvolt pulses into the battery, and using sensors to collect time changes of the responses to these pulses. Information about the inputs and the responses is then analyzed and used to generate an incremental parametric state model representing the internal dynamics of the battery, which is further used to control additional ongoing battery operations (e.g., to control whether and how much power is supplied to and/or extracted from the battery in a current or future time period).

30 Claims, 22 Drawing Sheets

(51) Int. Cl.
  *G05B 13/02* (2006.01)
  *G01R 31/36* (2020.01)
  *H02J 7/00* (2006.01)
(58) Field of Classification Search
  USPC .......................................................... 320/129
  See application file for complete search history.

(56) References Cited

U.S. PATENT DOCUMENTS

| | | | |
|---|---|---|---|
| 5,755,378 A | 5/1998 | Dage | |
| 5,963,447 A | 10/1999 | Kohn et al. | |
| 6,088,689 A | 7/2000 | Kohn et al. | |
| 6,694,044 B1 | 2/2004 | Pavlovic et al. | |
| 7,052,105 B2 * | 5/2006 | Ushigome | B41J 3/36 |
| | | | 346/113 |
| 7,072,723 B2 | 7/2006 | Kohn et al. | |
| 7,216,004 B2 | 5/2007 | Kohn et al. | |
| 7,574,383 B1 | 8/2009 | Parasnis et al. | |
| RE42,284 E * | 4/2011 | Severson | H02J 13/00009 |
| | | | 318/280 |
| 8,261,283 B2 | 9/2012 | Tsafrir et al. | |
| 8,429,106 B2 | 4/2013 | Downs et al. | |
| 8,606,788 B2 | 12/2013 | Chen et al. | |
| 8,949,772 B1 | 2/2015 | Talby et al. | |
| 8,977,874 B2 * | 3/2015 | Rabii | G06F 11/3062 |
| | | | 713/320 |
| 9,946,517 B2 | 4/2018 | Talby et al. | |
| 10,223,656 B2 * | 3/2019 | Kopp | G05B 19/042 |
| 10,386,422 B2 * | 8/2019 | Christensen | B60L 58/16 |
| 10,424,961 B1 * | 9/2019 | Maluf | G01R 31/378 |
| 10,452,045 B1 * | 10/2019 | Kohn | G05B 19/042 |
| 10,520,905 B2 * | 12/2019 | Cross | G05B 13/048 |
| 10,601,316 B2 * | 3/2020 | Kohn | H02J 7/0063 |
| 2002/0049899 A1 | 4/2002 | Kenworthy | |
| 2003/0069868 A1 | 4/2003 | Vos | |
| 2003/0234812 A1 | 12/2003 | Drucker et al. | |
| 2004/0260666 A1 | 12/2004 | Pestotnik et al. | |
| 2005/0102044 A1 | 5/2005 | Kohn et al. | |
| 2005/0273413 A1 | 12/2005 | Vaudrie | |
| 2006/0218074 A1 | 9/2006 | Kohn | |
| 2006/0229769 A1 | 10/2006 | Grichnik et al. | |
| 2008/0167756 A1 | 7/2008 | Golden et al. | |
| 2009/0113049 A1 | 4/2009 | Nasle | |
| 2011/0035071 A1 | 2/2011 | Sun | |
| 2011/0178622 A1 | 7/2011 | Tuszynski | |
| 2011/0298626 A1 | 12/2011 | Fechalos et al. | |
| 2012/0072181 A1 | 3/2012 | Imani | |
| 2012/0143356 A1 | 6/2012 | Berg-Sonne | |
| 2012/0274281 A1 | 11/2012 | Kim | |
| 2012/0283887 A1 | 11/2012 | Goldsmith et al. | |
| 2013/0080530 A1 | 3/2013 | Frees et al. | |
| 2013/0099576 A1 | 4/2013 | Chuah et al. | |
| 2013/0119916 A1 | 5/2013 | Wang et al. | |
| 2013/0253942 A1 | 9/2013 | Liu et al. | |
| 2013/0274936 A1 | 10/2013 | Donahue et al. | |
| 2014/0114517 A1 | 4/2014 | Tani et al. | |
| 2014/0217976 A1 | 8/2014 | McGrath | |
| 2014/0250377 A1 | 9/2014 | Bisca et al. | |
| 2014/0277600 A1 | 9/2014 | Kolinsky et al. | |
| 2015/0032394 A1 | 1/2015 | Kimura et al. | |
| 2015/0058078 A1 | 2/2015 | Ehrenberg et al. | |
| 2015/0184550 A1 | 7/2015 | Wichmann | |
| 2015/0253749 A1 | 9/2015 | Kniazev et al. | |
| 2015/0279182 A1 | 10/2015 | Kanaujia et al. | |
| 2015/0370228 A1 | 12/2015 | Kohn et al. | |
| 2015/0370232 A1 | 12/2015 | Kohn et al. | |
| 2016/0004228 A1 | 1/2016 | Kohn | |
| 2016/0018806 A1 | 1/2016 | Kohn et al. | |
| 2016/0125435 A1 | 5/2016 | Kohn et al. | |
| 2016/0216708 A1 | 7/2016 | Krivoshein et al. | |
| 2016/0239759 A1 * | 8/2016 | Sung | G06N 7/005 |
| 2017/0219660 A1 * | 8/2017 | Christensen | B60L 58/16 |
| 2017/0271984 A1 | 9/2017 | Kohn et al. | |
| 2017/0315517 A1 | 11/2017 | da Silva et al. | |
| 2017/0315523 A1 | 11/2017 | Cross et al. | |

FOREIGN PATENT DOCUMENTS

| | | | |
|---|---|---|---|
| JP | 2016-105672 A | 6/2016 | |
| JP | 6584040 B2 * | 10/2019 | H02J 7/0068 |
| WO | 2014030349 | 2/2014 | |
| WO | 2014089959 A1 | 6/2014 | |
| WO | 2016025080 A1 | 2/2016 | |

OTHER PUBLICATIONS

Leng et al., "Effect of Temperature on the Aging Rate of Li Ion Battery Operating Above Room Temperature," Scientific Reports 5:12967, Aug. 2015, 12 pages.

Shim et al., "Past, present, and future of decision support technology", Decision Support Systems 33 (2002), 16 pages (pp. 111-126).

Liserre et al., "Future Energy Systems", IEEE Industrial Electronics Magazine, Mar. 2010, 20 pages (pp. 18-37).

Sarkis, "A strategic decision framework for green supply chain management", Journal of Cleaner Production 11 (2003) 13 pages (pp. 397-409).

Chong et al., "Sensor Networks: Evolution, Opportunities, and Challenges", Proceedings of the IEEE, vol. 91, No. 8, Aug. 2003, 10 pages (pp. 1247-1256).

Gu et al., "Hybrid Systems: Chattering Approximation to Relaxed Controls," *Lecture Notes in Computer Science vol. 1066: Hybrid Systems III*, 1996, 25 pages.

Kohn et al., "Multiple Agent Hybrid Control: Carrier Manifolds and Chattering Approximations to Optimal Control," 33$^{rd}$ Conference on Decision and Control Lake Buena Vista, FL, Dec. 1994, 7 pages.

Kohn et al., "A Hybrid Systems Approach to Computer-Aided Control Engineering," *IEEE Control Systems* 15(2), 1995, 30 pages.

Kohn et al., "Hybrid Systems as Finsler Manifolds: Finite State Control as Approximation to Connections," *Lecture Notes in Computer Science vol.: 999: Hybrid Systems II*, 1995, 28 pages.

Kohn et al., "Viability in Hybrid Systems," *Theoretical Computer Science 138*, 1995, 28 pages.

Kohn et al., "Digital to Hybrid Program Transformations," IEEE International Symposium on Intelligent Control, Dearborn, MI, Sep. 15-18, 1996, 6 pages.

Kohn et al., "Hybrid Dynamic Programming," *Lecture Notes in Computer Science vol. 1201: Hybrid and Real-Time Systems*, 1997, 7 pages.

Kohn et al., "Implementing Sensor Fusion Using a Cost-Based Approach," American Control Conference, Albuquerque, NM, Jun. 1997, 5 pages.

Kohn et al., "Control Synthesis in Hybrid Systems with Finsler Dynamics," *Houston Journal of Mathematics* 28(2), 2002, 23 pages.

Kohn et al., "A Micro-Grid Distributed Intelligent Control and Management System," *IEEE Transactions on Smart Grid* 6(6), Nov. 2015, 11 pages.

Uddin, K., "The effects of high frequency current ripple on electric vehicle battery performance," Applied Energy 178 (2016), 13 pages.

Schutter, B. De "Minimal state-space realization in linear system theory: an overview", Journal of Computational and Applied Mathematics, 121 (2000) 331-354.

* cited by examiner

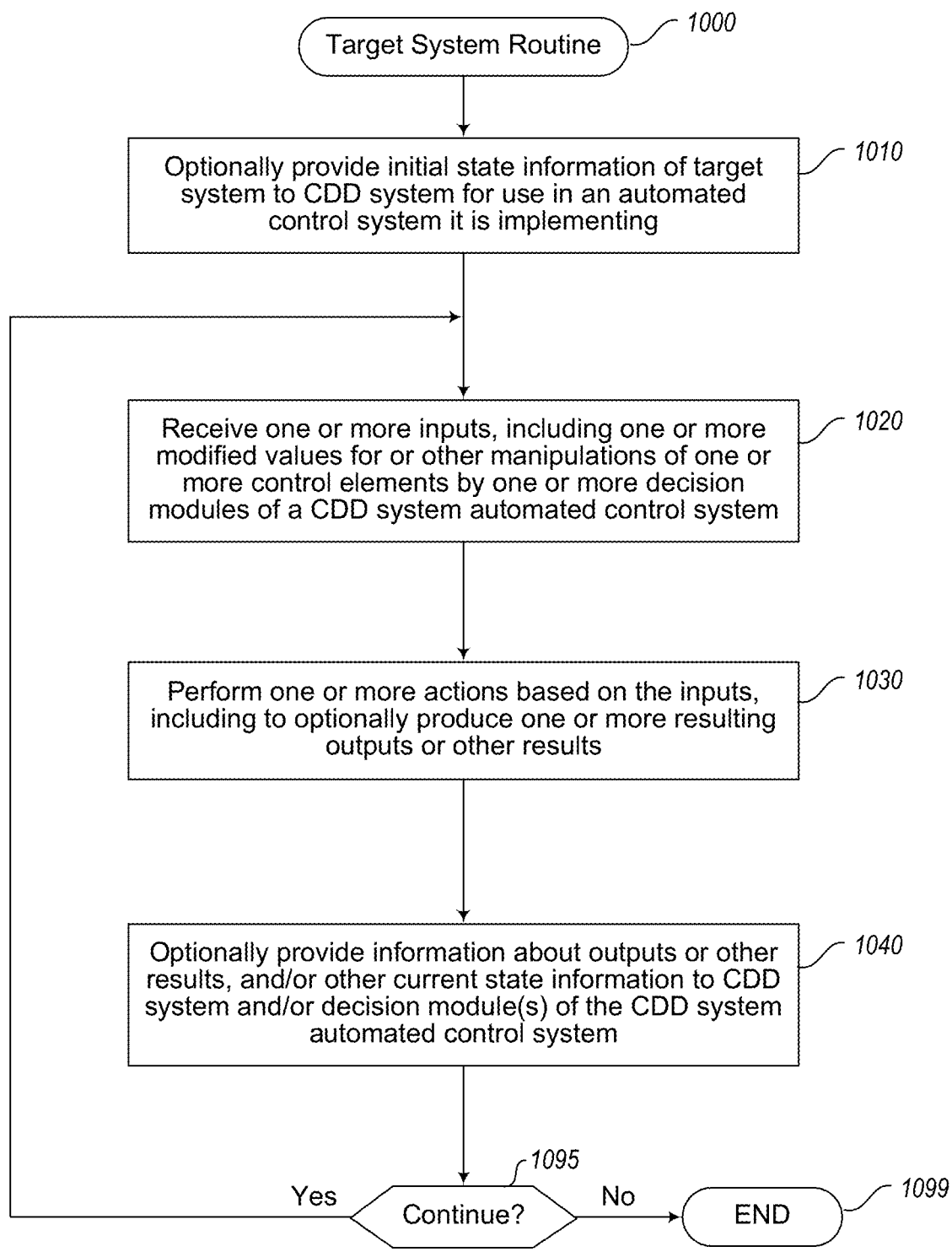

US 11,097,633 B1

USING BATTERY STATE EXCITATION TO MODEL AND CONTROL BATTERY OPERATIONS

CROSS-REFERENCE TO RELATED APPLICATIONS

This application claims the benefit of U.S. Provisional Patent Application No. 62/796,581, filed Jan. 24, 2019 and entitled "Using Battery State Excitation To Model And Control Battery Operations," which is hereby incorporated by reference in its entirety.

TECHNICAL FIELD

The following disclosure relates generally to techniques for controlling operations of one or more batteries whose behavioral responses are modeled using information gathered from active excitation of the batteries, such as to maximize battery life while performing other battery power use activities.

BACKGROUND

Attempts have been made to implement automated control systems for various types of physical systems having inputs or other control elements that the control system can manipulate in an attempt to provide desired output or other behavior of the physical systems—one example of such automated control is to manage operations of a battery that is discharging electrical power to support a load and/or is charging using electrical power from a source, while uncertainty exists about an internal temperature and/or chemical state of the battery, and potentially with ongoing changes in load, source and/or internal state of the battery. Such automated control systems have used various types of architectures and underlying computing technologies to attempt to implement such functionality.

However, various difficulties exist with existing automated control systems and their underlying architectures and computing technologies for battery systems, including with respect to determining how the systems will respond in different situations and to managing uncertainty in a current state of a system being controlled and in how different types of inputs will affect operation of the automated control systems.

BRIEF DESCRIPTION OF THE DRAWINGS

FIG. 10 illustrates a flow diagram of an example embodiment of a routine for a target system being controlled.

DETAILED DESCRIPTION

Figure 1A:
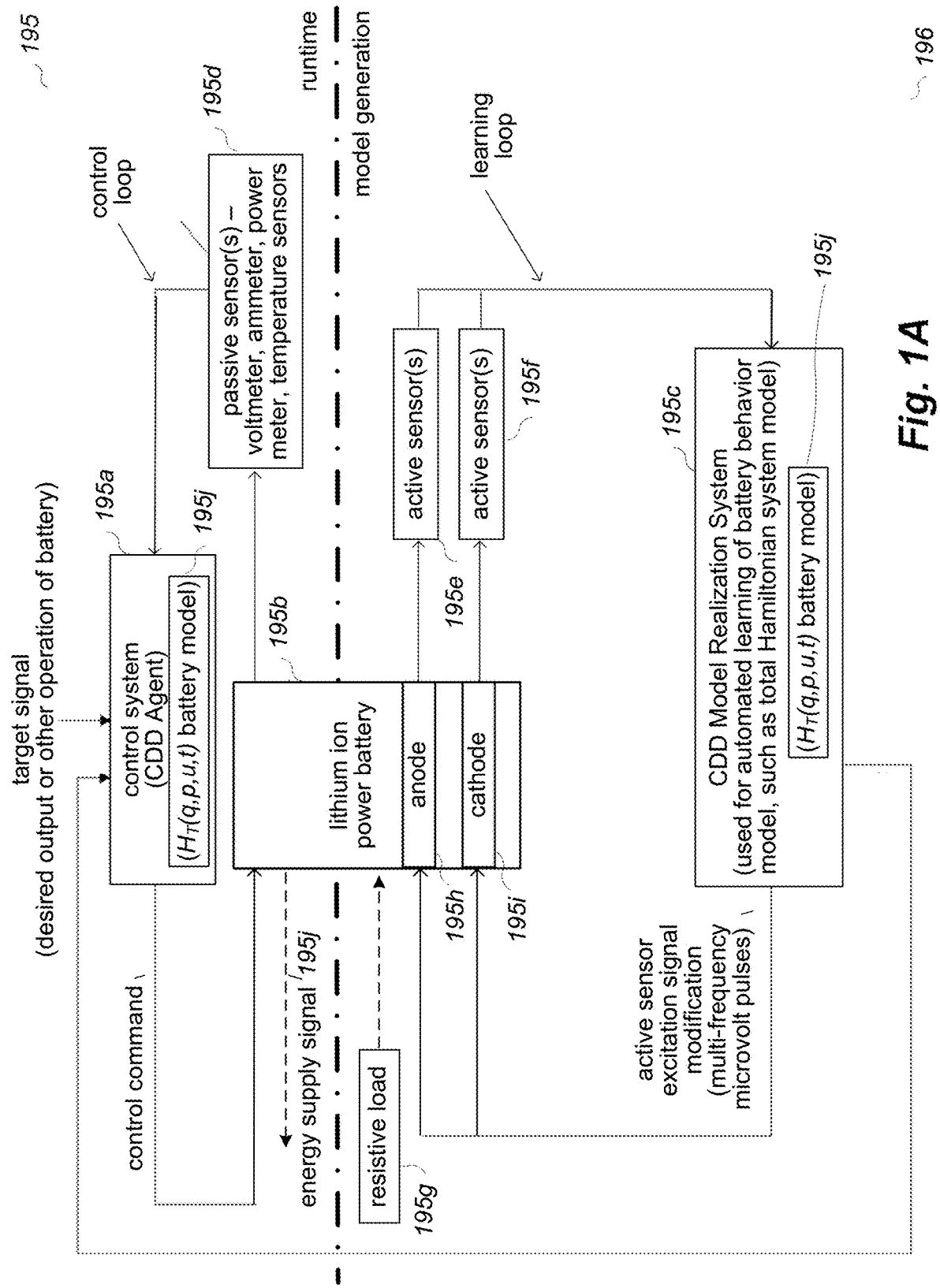
FIG. 1A includes a diagram illustrating use of a model realization system to perform active excitation of a battery of a target system to generate a parametric model that reflects behavior of the battery under varying conditions.

Techniques are described for implementing automated control systems to control or otherwise manipulate at least some operations of batteries and of target physical systems that use them, such as based at least in part on models of the batteries' dynamic behaviors that are generated by gathering and analyzing information about the batteries' operations under varying conditions (e.g., under varying battery charge levels and/or loads). In at least some embodiments, the described techniques include performing excitation of a target battery system (e.g., for a lithium ion battery cell) by, for each of multiple charge levels of the battery and for each of multiple resistive loads, injecting multi-frequency microvolt pulses into the battery (e.g., separate pulses for each of the battery's anode and cathode), and using intelligent sensors (also referred to generally as "active sensors" herein) to collect time changes of the responses to those pulses. Information about the inputs and the responses is then analyzed and used to generate a model of the battery's behavior, such as an incremental parametric non-linear state model representing the internal dynamics of the battery (e.g., with parameters such as voltage, current, power, etc.), which is further used to control additional ongoing battery operations (e.g., to determine further control actions to perform for the battery), including in some cases to update a previously existing model of the battery (e.g., an existing model that is based at least in part on other types of information about the battery) and to use the updated battery model to control whether and how much power is supplied to and/or extracted from the battery (e.g., in a current or future time period). Additional details are described below related to performing such improved modeling of a target system's state and operational characteristics via battery excitation activities, and to using a resulting model of the target system in particular manners, and some or all of the described techniques are performed in at least some embodiments by automated operations of one or more Model Realization System (MRS) components, optionally as part of or in conjunction with one or more CDD (Collaborative Distributed Decision) systems controlling specific target systems that include one or more batteries.

In at least some embodiments, the described techniques include learning and generating a dynamic model (e.g., a parametric linear model) of a battery (e.g., a lithium ion battery cell) that characterizes flow of its internal state and the corresponding effect of control operations performed on the battery, such as during or before operations to control the battery operations. By injecting electrical pulses into the battery to generate responses, internal dynamics of the battery may be measured (e.g., to reflect the internal battery chemistry, such as number of free ions at the anode and cathode; internal battery temperature; etc.) and used for generating the dynamic battery model with values for one or more parameters (e.g., voltage, current, power, etc.). Furthermore, by measuring battery responses at different charge levels and using different resistive loads, the generated parametric model better represents operations of the battery across a range of operating conditions.

In at least some embodiments, the described techniques are further used to provide a feedback control system for a target system having one or more batteries that dynamically change during operation, including to generate and use a model of the target system that is improved in real-time by generating and using updated models based on information generated by active sensors. The described techniques include injecting signals into the target system in such a manner that they do not substantially alter the behavior of the target system (referred to herein as a "non-demolition" strategy), but with the injected signals eliciting a response that reflects the internal characteristics of the target system. In at least some such embodiments, the described techniques encode the dynamics of the target system under control in a function of the state of the target system referred to as a data Hamiltonian model, and further generate updates in real-time to the model of the dynamics of the target system. Some characteristics of the target system under control may not be completely known (e.g., internal state of the battery), with a data Hamiltonian model encoding the known information based at least in part on modeling performed by a model realization system.

The described techniques may provide a variety of benefits and advantages in various situations. In particular, many traditional control system approaches involving batteries have been ineffective for controlling complex systems in which internal state information cannot be determined and/or in which models of the batteries' behavior are difficult or impossible to obtain (e.g., via conventional techniques for attempting to describe dynamics via encoding physical principles and empirical relationships in complex mathematical representations), while the use of the described techniques overcome such problems based at least in part by actively gathering and analyzing information about operations of batteries under varying conditions such as battery charge levels and/or loads (e.g., by probing the internal state of the batteries being controlled in a non-demolition manner). Such traditional control system approaches typically involve the system designers beginning with requirements for battery system behavior, using the requirements to develop a static model of the system with constraints and other criteria, and attempting to optimize the run-time battery system operations in light of the constraints and other criteria. Conversely, in at least some embodiments, the described techniques do not need to use such constraints and other criteria, nor to develop such a resulting static model, nor to do such optimization—instead, actual behavior of a battery system is measured and used to generate a corresponding behavioral model. Additional non-exclusive examples of such benefits and advantages include the following (with further details provided herein): improving how a current state of a target system is modeled, such as to generate a function and/or or structure that models internal operations of the target system based on actual data that is collected from active excitation of the target system rather than merely attempting to estimate target system state; increasing capabilities for handling uncertainty management and/or optimal dispatch and commitment and/or anomaly detection and response; etc.

For illustrative purposes, some embodiments are described below in which specific types of data is gathered and used in particular manners to perform specific types of control actions for specific types of target systems, including via active excitation and corresponding measurement of particular types of components. However, it will be understood that such described techniques may be used in other manners in other embodiments, including with other types of target systems and active excitation techniques, and that the invention is thus not limited to the exemplary details provided.

FIG. 1A includes an example diagram illustrating information 196 regarding how a model realization system may be used to generate a model for a battery of a target system, and information 195 regarding how the generated model may be used for runtime control of the battery in the target system—in some embodiments, the model generation may be completed before the runtime control is performed, while in other embodiments the model generation may occur concurrently with at least some runtime control activities.

In this example, FIG. 1A illustrates a model realization system 195c that participates in a learning loop to generate a current response behavioral model of the battery 195b (e.g., a lithium ion battery cell), such as for use in generating a battery model 195j that is later used by the control system 195a to control the battery—the generated model 195j in this example is in the form of an overall total system model encoded as a data Hamiltonian function $H_T$ (which in this example is a function of the state q, the momentum p and the control u at current time t). The learning loop further includes active sensors 195e and 195f that measure responses of the battery to excitation signals sent to battery anode 195h and cathode 195i, respectively, in order to provide information about responses of the battery that depend on the current internal state of the battery 195b and on an amount of resistive load applied to the battery by load element 195g (which in this example is a variable load that is controlled by the system 195c), and in at least some cases on the external temperature. While not separately illustrated in FIG. 1A, the active sensors may further include one or more temperature sensors (e.g., an external thermocouple) to measure the external temperature for the battery, such as to enable the generated model to further model battery behavior as a function of temperature. The excitation signals supplied to the battery anode and cathode are generated by the model realization system 195c, and in this example are multi-frequency microvolt pulses that are sent for some or all combinations of multiple battery charge levels or charge level ranges (e.g., approximately 20% charged, approximately 35% charged, approximately 50% charged, approximately 75% charged, approximately 90% charged, etc.) and for multiple resistive loads or load ranges, such as at multiple specified levels of microamps and/or milliamps and/or amps (e.g., at approximately 10% of the maximum load, or maximum permissible current output from the battery; approximately 30% of the maximum load; approximately 50% of the maximum load; approximately 75% of the maximum load; approximately 100% of the maximum load; etc.), with the pulses interacting with internal dynamics of the battery 195b in a non-demolition form (so as to provide internal information about dynamics of the battery without causing changes on the output 195j or control loop for the target system that exceed a defined threshold). Thus, if 5 example charge levels and 6 example load levels are used, the pulses may be used for 30 (5*6) combinations of charge and load levels. In addition, in some embodiments, the model may further be conditioned on one or more other factors (e.g., for multiple different external temperatures or temperature ranges), and if so the number of combinations will increase accordingly (e.g., for 10 example temperature levels, 5 example charge levels and 6 example load levels, the pulses will be used for 300 (10*5*6) combinations of temperature and charge and load levels. Additional details are included below regarding generating a battery model and other operations of the model realization system.

With respect to such an overall total system model $H_T$ of a target system that includes an battery, the target system may, for example, include one or more batteries used to store and provide electrical power (e.g., for a local load, for an electrical grid that supports various loads in various locations, etc.), and the automated operations to control the target system may include using characteristics of at least one such battery in the target system to perform automated control of DC (direct current) power that is provided from and/or stored by that battery. In such embodiments, the automated operations of one or more CDD agents may include generating an overall total system model of battery performance by receiving information about inputs to, outputs from, and other attributes related to the one or more batteries (e.g., electrical current and/or voltage being output for use, electrical current and/or voltage being input for storage, temperature readings external to the one or more batteries as part of their surrounding environment, etc.), and using such information as part of modeling current response behavior characteristics of the one or more batteries—given such modeled information, the CDD agent(s) that control the one or more batteries may then use such information to make decisions on current and/or future control actions in a manner that reflects actual behavior of the target system. In at least some embodiments, the response behavior of the battery is modeled as follows:

$$\dot{x}=A_{q_i}L_i x+B_{q_i}L_i u \; y=C_{q_i}L_i x$$

where x is the state of the battery, u is a vector of input (control), y is a vector of responses, $q_i$ represents one of multiple battery charge levels, $L_i$ represents one of multiple resistive load levels, and A, B and C represent learned modeled factors (e.g., constants).

In this example, the control system 195a further performs a control loop to control operation of the battery 195b of the target system, such as to drive the target system to a desired dynamic behavior. In particular, the control system may include a CDD agent (as discussed in greater detail below with respect to FIG. 1B, as well as elsewhere herein), and an overall total model 195j of the target system that was previously generated by the Model Realization System 195c based in part on data obtained from actual operation of the target system. As part of the operation of the control system 195a, it receives a target signal that indicates a desired output or other desired operation of the battery 195b of the target system, and uses information from its overall total system model $H_T$ to determine an energy supply control command to send to the battery (e.g., to an actuator, not shown, that controls output of the battery) that satisfies defined constraints and other goals of the control system in light of its current state, while attempting to satisfy the desired output or other desired operation of the target signal if possible. The battery receives the energy supply control signal, and optionally performs a corresponding output 195j, with that output and/or other characteristics of the battery being measured at least in part by the one or more passive sensors 195d (e.g., a suite of multiple passive sensors, such as to measure operational characteristics (e.g., volts, amps, power, temperature, etc.). As one example, the automated operations to control the target system may include using characteristics of each battery's state to perform automated control of DC (direct current) power that is provided from the battery—in some such embodiments, such control may include using a DC-to-DC amplifier (e.g., a field-effect transistor, or FET, amplifier) connected to the battery to control an amount of electrical current and/or voltage being output from the battery (e.g., in a real-time manner and to optimize long-term operation of the battery), although such an amplifier is not illustrated in FIG. 1A. Such a DC-to-DC amplifier may, for example, be part of a buck converter (or step-down converter) that steps down voltage while stepping up current from its input (supply) to its output (load) and/or be part of a boost converter (or step-up converter) that steps up voltage while stepping down current from its input (supply) to its output (load), referred to generally at times herein as a "boost/buck controller" or "buck/boost controller". In addition, the control system may use an actuator for actively controlling the impedance that the battery system "sees". The battery output (charging or discharging) is optimized for factors such as load satisfaction and/or longevity, with economic factors also optionally used. The impedance actuator may be directly controlled by the control system and in series with the battery, such that the impedance is decreased when more power is desired from the battery, and is increased when less power is desired. In at least some embodiments, the impedance is implemented electronically with switches that do not increase the dissipation. A system that includes one or more batteries to be controlled may further include additional components in some embodiments and situations, such as one or more electrical sources and/or one or more electrical loads, with one non-exclusive example of such a type of system being one or more home or business electrical power systems that may optionally include electrical generation sources (e.g., solar panels, wind turbines, etc.) as well as electrical load from the house or business. The passive sensors 195d may further supply their measured readings to the control system 195a, such as to update corresponding state information in the overall system model $H_T$, with the control system 195a continuing to control operation of the battery 195b for a next target signal (e.g., in a continuous or substantially continuous manner, and such as based on an overall system model that is updated in a continuous or substantially continuous manner based at least in part on readings from the passive sensors 195d).

As part of controlling use of a lithium ion battery system in FIG. 1A, various illustrated components interact to control operations of the battery according to one or more defined goals in light of defined constraints, rules and other criteria, as discussed elsewhere herein. In some embodiments, the automated activities to control the battery may be performed in a real-time manner and/or to optimize long-term operation of the battery (e.g., the life of the battery), while satisfying as many external requests for power (e.g., from a utility or other load to which the battery can supply power) as is possible (e.g., at least a defined percentage or quantity of such requests)—for example, the control system may attempt to fully or partially satisfy a request from the utility for power in a real-time manner if the request can be satisfied in a way that also satisfies other constraints on the battery performance given the current state of the battery and the defined goal(s), such as to enable the battery to operate in a desired non-saturation range or level (e.g., with respect to an internal temperature of the battery and/or internal chemistry of the battery). In addition, the control commands sent from the control system to the battery may have various forms in various embodiments, such as to specify an amount of power to be generated as DC output of the battery, and/or for the battery to receive electrical power from one or more sources (not shown) to be stored for later use (e.g., at different time periods, or otherwise at different times). The specified power amount to be generated may include information indicating, for example, to increase or decrease the power being output by a specified amount, or to not change the power output. The output of the battery may serve to provide power to one or more loads (e.g., an electrical grid associated with the utility), and in at least some embodiments may be connected to an inverter/rectifier component (not shown) to convert the power output of the battery to AC power to support corresponding loads—such an inverter may, for example, control power being provided from the battery by regulating voltage and/or frequency of the AC power. Similarly, input of the battery may serve to receive power from one or more sources (not shown), and in at least some embodiments may be connected to an inverter/rectifier component (not shown) to convert AC power input from the sources to DC power for the battery—such a rectifier may, for example, control power being provided to the battery by regulating voltage and/or frequency of the AC power.

In addition, while in some embodiments the model realization system and control agent may be implemented as separate components (e.g., with the model realization system implemented in whole or in part at the location of the battery, and/or in whole or in part at a remote location), in other embodiments the control agent and model realization system may be implemented as a single component (whether at the location of the battery or remote from it). Further details regarding operation of the control agent to determine operations to take for the battery are discussed in greater detail below.

However, before further discussion of the model realization system and its functionality, a more general description of the control of target systems using such representations and other models is provided.

Figure 1B:
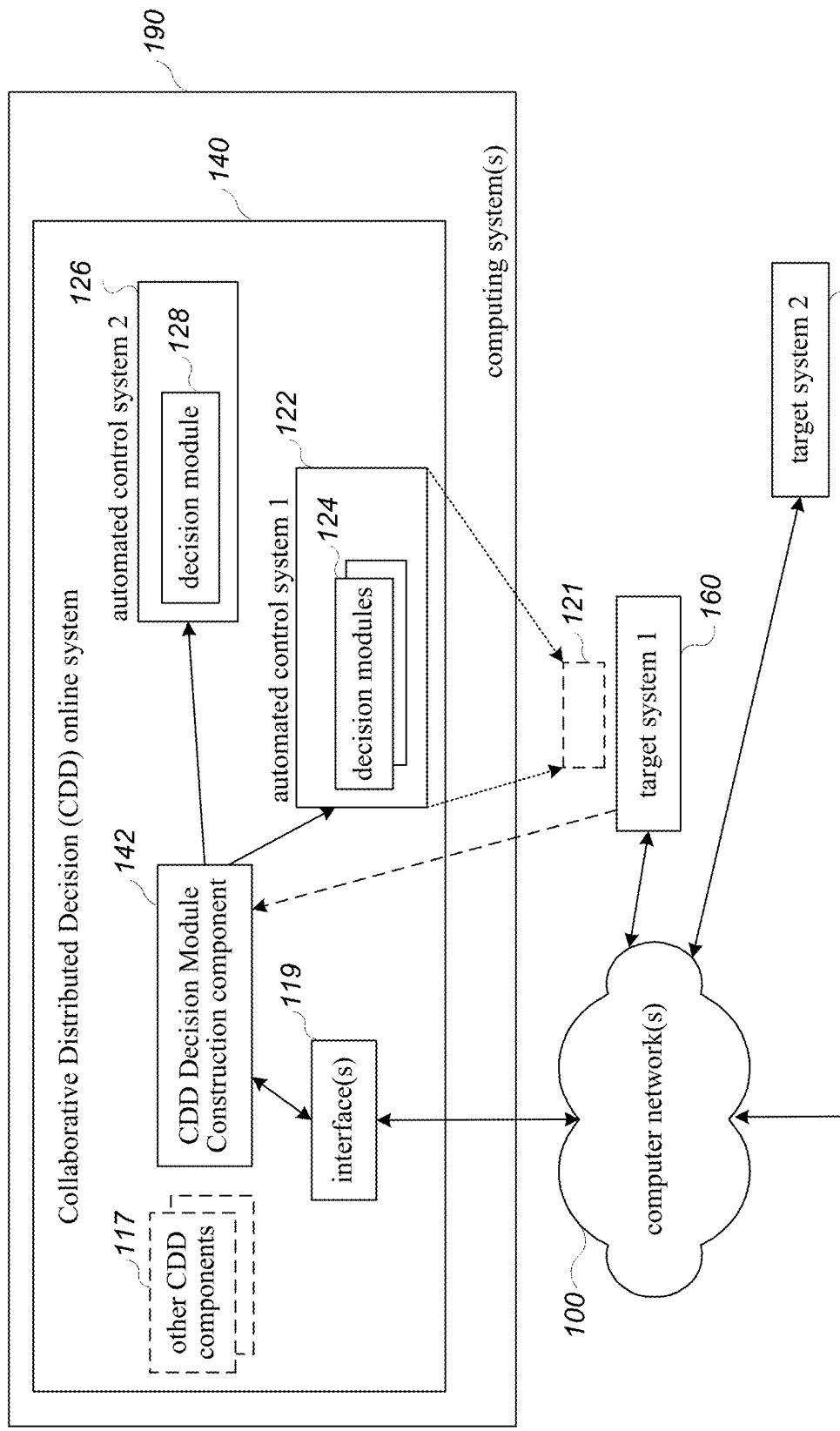
FIG. 1B is a network diagram illustrating an example environment in which a system for performing cooperative distributed control of target systems may be configured and initiated.

In particular, FIG. 1B is a network diagram illustrating an example environment in which a system for performing cooperative distributed control of one or more target systems may be configured and initiated. In particular, an embodiment of a CDD system 140 is executing on one or more computing systems 190, including in the illustrated embodiment to operate in an online manner and provide a graphical user interface (GUI) (not shown) and/or other interfaces 119 to enable one or more remote users of client computing devices 110 to interact over one or more intervening computer networks 100 with the CDD system 140 to configure and create one or more decision modules to include as part of an automated control system to use with each of one or more target systems to be controlled. While not illustrated in FIG. 1B, the CDD system 140 may include and use one or more model realization system as discussed herein, such as to include one or more such model realization systems in one or both of the automated control systems 1 and 2. As discussed further below, each decision module may have a model of a target system being controlled that includes various information about target system state, control actions, goals, etc.—such target system models of decision modules may be separate from the generated battery models of the model realization system(s) in at least some embodiments, while in other embodiments a target system that includes one or more batteries may include, in the target system's decision module's model, some or all of the generated battery models for those included one or more batteries.

In particular, target system 1 160 and target system 2 170 are example target systems illustrated in this example, although it will be appreciated that only one target system or numerous target systems may be available in particular embodiments and situations, and that each such target system may include a variety of mechanical, electronic, chemical, biological, and/or other types of components to implement operations of the target system in a manner specific to the target system. In this example, the one or more users (not shown) may interact with the CDD system 140 to generate an example automated control system 122 for target system 1, with the automated control system including multiple decision modules (or "agents") 124 in this example that will cooperatively interact to control portions of the target system 1 160 when later deployed and implemented. The interactions of the users with the CDD system 140 to create the automated control system 122 may involve a variety of interactions over time, including in some cases independent actions of different groups of users. In addition, as part of the process of creating and/or training or testing automated control system 122, it may perform one or more interactions with the target system 1 as illustrated, such as to obtain partial initial state information, although some or all training activities may in at least some embodiments include simulating effects of control actions in the target system 1 without actually implementing those control actions at that time. In some embodiments and situations, such initial user interactions may be used to generate an initial rule-based overall system model of a target system that is based at least in part on binary rules.

After the automated control system 122 is created, the automated control system may be deployed and implemented to begin performing operations involving controlling the target system 1 160, such as by optionally executing the automated control system 122 on the one or more computing systems 190 of the CDD system 140, so as to interact over the computer networks 100 with the target system 1. In other embodiments and situations, the automated control system 122 may instead be deployed by executing local copies of some or all of the automated control system 122 (e.g., one or more of the multiple decision modules 124) in a manner local to the target system 1, as illustrated with respect to a deployed copy 121 of some or all of automated control system 1, such as on one or more computing systems (not shown) that are part of or otherwise associated with the target system 1. In addition, in embodiments and situations in which initial user interactions are used to generate an initial rule-based system model of a target system using binary rules, the initially deployed automated control system 122 may be based on such an initial rule-based system model, and data from the operation of the target system under control of that initially deployed automated control system 122 may be gathered and used to include information about current characteristics of the target system in a revised model of the target system. Furthermore, in at least some embodiments, a model realization system may further generate a model of a battery within a target system in the manner discussed herein, whether before or during other operations of an automated control system for a target system that includes the battery, and whether for use instead of or in addition to any user-specified battery model (e.g., to replace or supplement/ update any such user-specified battery model, to update an existing battery model with additional details, etc.).

In a similar manner to that discussed with respect to automated control system 122, one or more users (whether the same users, overlapping users, or completely unrelated users to those that were involved in creating the automated control system 122) may similarly interact over the computer network 100 with the CDD system 140 to create a separate automated control system 126 for use in controlling some or all of the target system 2 170. In this example, the automated control system 126 for target system 2 includes only a single decision module (or "agent") 128 that will perform all of the control actions for the automated control system 126. The automated control system 126 may similarly be deployed and implemented for target system 2 in a manner similar to that discussed with respect to automated control system 122, such as to execute locally on the one or more computing systems 190 and/or on one or more computing systems (not shown) that are part of or otherwise associated with the target system 2, although a deployed copy of automated control system 2 is not illustrated in this example. It will be further appreciated that the automated control systems 122 and/or 126 may further include other components and/or functionality that are separate from the particular decision modules 124 and 128, respectively, although such other components and/or functionality are not illustrated in FIG. 1B.

The network 100 may, for example, be a publicly accessible network of linked networks, possibly operated by various distinct parties, such as the Internet, with the CDD system 140 available to any users or only certain users over the network 100. In other embodiments, the network 100 may be a private network, such as, for example, a corporate or university network that is wholly or partially inaccessible to non-privileged users. In still other embodiments, the network 100 may include one or more private networks with access to and/or from the Internet. Thus, while the CDD system 140 in the illustrated embodiment is implemented in an online manner to support various users over the one or more computer networks 100, in other embodiments a copy of the CDD system 140 may instead be implemented in other manners, such as to support a single user or a group of related users (e.g., a company or other organization), such as if the one or more computer networks 100 are instead an internal computer network of the company or other organization, and with such a copy of the CDD system optionally not being available to other users external to the company or other organizations. In addition, the CDD system 140, each of its components (including component 142 and optional other components 117, such as one or more CDD Control Action Determination components and/or one or more CDD Coordinated Control Management components and/or one or more CDD Model Realization Systems), each of the decision modules, and/or each of the automated control systems may include software instructions that execute on one or more computing systems (not shown) by one or more processors (not shown), such as to configure those processors and computing systems to operate as specialized machines with respect to performing their programmed functionality.

As noted above, various types of data may be obtained and used as part of modeling operational characteristics of a target system in a general overall model, including information about prior input data to the target system and resulting behavior of the target system. In some embodiments and situations, such data may include data that is gathered in an automated manner from one or more types of passive hardware sensors that do not use the types of excitation information discussed elsewhere herein, and in some embodiments and situations, such data may include information about actions of human users or otherwise information about such humans. The term "sensor" and "sensor data" as used herein generally refers to such data regardless of source or type, including data from hardware sensors, unless otherwise indicated with respect to a particular situation. In addition, the modeling of the current overall characteristics of a target system and/or of current internal state of the target system's batteries via excitation activities may in at least some embodiments be performed to complete or repair or otherwise address conflicts in state information for one or more parts of the target system, such as from lack of sufficient internal state structure information or other information, and to enable learning of or other improvements to a function or other model of the target system's internal state and operational characteristics. Additional details are included below related to obtaining and using such sensor data.

While not illustrated in FIG. 1B, the distributed nature of operations of automated control systems such as those of 122 allow partially decoupled operations of the various decision modules, include to allow modifications to the group of decision modules 124 to be modified over time while the automated control system 122 is in use, such as to add new decision modules 124 and/or to remove existing decision modules 124. In a similar manner, changes may be made to particular decision modules 124 and/or 128, such as to change rules or other restrictions specific to a particular decision module and/or to change goals specific to a particular decision module over time, with a new corresponding model being generated and deployed within such a decision module, including in some embodiments and situations while the corresponding automated control system continues to control operations of a corresponding target system. As one example, at least some such modifications may reflect operations of one or more model realization systems to create or improve a model of a battery of a target system at one or more times, such as to automatically learn and provide updates about an internal state model determined for the target system battery from generated excitation signals (whether automatically or in response to additional user instructions or interactions) that is used to update and produce the improved target system model for further use. In addition, while each automated control system is described as controlling a single target system in the example of FIG. 1B, in other embodiments and situations, other configurations may be used, such as for a single automated control system to control multiple target systems (e.g., multiple inter-related target systems, multiple target systems of the same type, etc.), and/or for multiple automated control systems to operate together to control a single target system, such as by each operating independently to control different portions of that target control system. It will be appreciated that other configurations may similarly be used in other embodiments and situations.

As noted above, in at least some embodiments, the model of a target system to be controlled is encoded as a data Hamiltonian model that is a function of three types of variables (state variables, momentum variables and control variables), and is composed of three additive elements (the physical model, the constrained model and the learned model). The physical and constrained models are determined respectively by the physical principles characterizing the system and operational requirements. The learned model is generated by a model realization system from the active sensor signals. In particular, the three types of variables used in the function for the data Hamiltonian model include a vector defining the state of the battery, a vector defining the momentum of the battery, and a vector of action variables that control the battery. The three additive elements that compose the data Hamiltonian model include three Hamiltonians ($H_O$, $H_C$ and $\Delta H_B$), where $H_O$ is the physical Hamiltonian of the battery, $H_C$ is the constrained Hamiltonian representing the known operational and requirement constraints, and $\Delta H_B$ is the learned Hamiltonian as a function of collecting data from the active sensors, with the total Hamiltonian model in the following form:

$$H_T = H_O + H_C + \Delta H_B.$$

$H_O$ and $H_C$ are determined from stored operational rules and historical data of the battery. The total Hamiltonian model $H_T$ has the same properties of the Hamiltonian of classic mechanics, but adapted to electrical devices. In addition to the total Hamiltonian model $H_T$ that characterizes the dynamic target system, a control system implemented by the described techniques may in some embodiments use a specified desired behavior Hamiltonian $H_D$, which reflects the desired behavior of the system under control, and affects the dynamics of the control signal produced by the control system.

The total Hamiltonian model $H_T$ encodes the evolution of the battery system under control, with the evolution represented in the form of the extended Hamilton Jacobi equations, as follows:

$$\frac{dq(t)}{dt} = \frac{\partial H_T}{\partial p(t)}$$

$$\frac{dp(t)}{dt} = -\frac{\partial H_T}{\partial q(t)}$$

$$\frac{du(t)}{dt} = -\Gamma * \frac{\partial}{\partial u}\left(\frac{d(H_T - H_D)^2}{dt}\right)$$

where q(t) is the state vector of the battery being learned, p(t) is their momentum, and u(t) is the control action vector. The first two equations are classic evolution equations of the dynamics of the dynamic target system, and the last equation describes control of the battery on the DC side to satisfy constraints and approximate the desired behavior represented by $H_D$. The parameter is an empirical parameter to ensure stability of the control system.

Turning now to FIGS. 2A-2H, these figures illustrate examples of performing described techniques of the model realization system to model a current internal state of a battery via corresponding excitation and analysis activities (e.g., to improve a total system model of the battery and use it to perform further automated control of DC power from the battery).

Figure 2A:
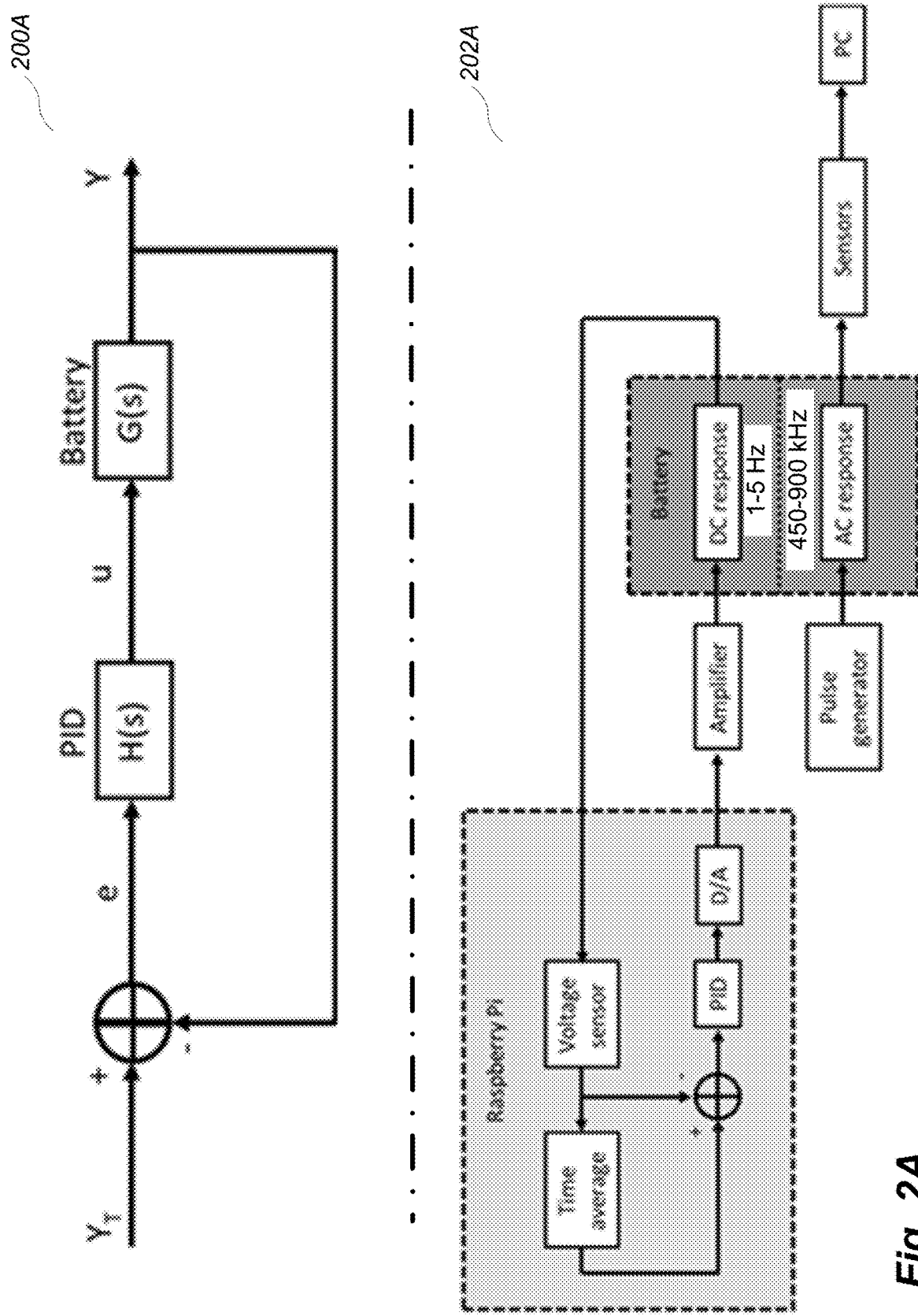
FIGS. 2A-2H illustrate examples of performing described techniques to determine a current internal state of a battery via corresponding excitation and analysis activities, in order to generate an incremental parametric non-liner model of the battery for use in further automated control of DC power from the battery.

With respect to FIG. 2A, it illustrates information 200A providing a high-level system diagram example, as well as information 202A with additional details regarding an example logical diagram of impulse response measurement—it will be appreciated that, while various specific details are provided for the sake of the examples, the invention is not limited to such details unless otherwise indicated.

As previously noted, in at least some embodiments, a model of a battery's dynamic behavior is generated by gathering and analyzing information about the batteries' operations under varying conditions (e.g., under varying battery charge levels and/or loads). As part of doing so, a pulse signal is injected for each range of charge level, and sensors' time response is measured and used for generating a parametric dynamic model of the battery. This process is repeated for each range of charge level, for each of several resistive loads. The range may be determined, for example, by selecting the largest range for each level that is consistent with the sensitivity of the battery to charge and load changes. In addition, the operations of the model realization system may be carried out in some embodiments by real-time software that includes the computation of the estimated battery charge, and generates a linear parametric model of the dynamics of the voltage, current and power of the battery as a function of load and temperature. The generating of the parametric linear model may use dynamic realization and filtering algorithms to estimate the parameters of the model for each range of charge and load, and also include a process for determining the quality of the generated model, and whether the selected charge and load ranges are correct. For the purpose of these examples, a battery cell is considered standard (e.g., acceptable for use) if its' model parameters generate a metric by simulation that is within the acceptable value for the corresponding metric of the base battery cell of its kind.

It is noted that the use of an impulse response method to measure the system transfer function leads to potential safety risks to the battery as low-frequency oscillations may occur inside the battery. The frequency of these oscillations is typically on the order of 1-5 Hz. If not properly controlled, irreversible damages to the battery can quickly occur. To prevent such damages, a PID (proportional-integral-derivative) controller with feedback control may be used (e.g., implemented in the Raspberry Pi architecture). To achieve safety control, a PID controller may be used in such embodiments to drive a power amplifier in order to counter-act the voltage induced on the battery by the low-frequency oscillation. The battery voltage is measured in real-time and is used as the feedback signal to compare with the expected target voltage (e.g., time-average voltage). A digital low-pass filter may further be implemented to avoid interference with high-frequency response of the battery, to improve efficacy of the impulse response measurement.

Turning to information 200A of FIG. 2A, the system diagram results in the following:

$$Y(s) = G(s)u(s)$$

$$u(s) = H(s)e(s)$$

$$e(s) = Y_T(s) - Y(s)$$

where Y is the instantaneous output voltage of the battery, and $Y_T$ is the target voltage for the PID controller, which can be the moving time-averaged value of Y. Therefore, the system transfer function is $$F(s) = \frac{Y(s)}{Y_T(s)} = \frac{G(s)H(s)}{1 + G(s)H(s)} = \frac{P(s)^{(k)}}{Q(s)^{(m)}} \quad (A)$$

where $P(s)^{(k)}$ and $Q(s)^{(m)}$ are k-th and m-th order polynomials with k<=m. In this particular example, only proportional and integral controls are used for the PID controller:

$$u(t) = k_p e(t) k_1 \int e(t) dt$$

$$u(s) = k_p e(s) + k_1 \frac{e(s)}{s} = \left(k_p + \frac{k_1}{s}\right) e(s)$$

i.e., $$H(s) = \frac{u(s)}{e(s)} = \frac{k_p s + k_1}{s} \quad (B)$$

And the transfer function of the battery is known (e.g., is given by the manufacturer), and takes the following general form:

$$G(s) = \frac{1}{s^2} \frac{k_1}{s-\alpha} \frac{s-\beta}{s-\gamma} \frac{k_2}{s^2 + 2\xi\omega + \omega^2} \quad (C)$$

where the terms $$\frac{k_1}{s-\alpha}, \frac{s-\beta}{s-\gamma},$$

and $$\frac{k_2}{s^2 + 2\xi\omega + \omega^2}$$

grossly describe the chemistry, phase, and low-pass filtering characteristics of the battery, respectively. The parameters $\alpha$, $\beta$, $\gamma$, $\xi$, $\omega$, $k_1$, $k_2$ are battery-specific and are known. Note that the double-pole at s=0 ensures sufficient attenuation at DC. By plugging Equations (B) and (C) into (A), the overall system transfer function should take the following form:

$$F(s) = \frac{\beta_3 s^3 + \beta_2 s^2 + \beta_1 s + \beta_0}{s^4 + \alpha_3 s^3 + \alpha_2 s^2 + \alpha_1 s + \alpha_0} \quad (D)$$

where $\alpha_i$(i=0 . . . 3) and $\beta_j$(j=0 . . . 3) are given by the parameters $\alpha$, $\beta$, $\gamma$, $\xi$, $\omega$, $k_1$, $k_2$, $k_p$, $k_l$ in Equations (B) and (C). Note that, as shown in Equation (C), G(s) is a function of the voltage signal frequency, which is different from the frequency component of s=$\sigma$+j$\omega$ in Laplace transform. A pole localization strategy given by $$F(s) = k \frac{(s-\delta)^3}{(s-\epsilon)^4} \quad (E)$$

is used, which matches the polynomial orders in Equation (D). The zero- and pole-locations of Equation (E) are chosen in this example as design parameters to satisfy the following design objectives:
 Low-frequency band-pass filtering
 Zero phase-shift for the overall system
 Guaranteed stability within the frequency pass-band.

Finally, by equating the fractional polynomials given in Equations (D) and (E), the governing parameters of the PID controller (i.e., $k_p$ and $k_1$) can be expressed in terms of battery-specific and design parameters $\alpha$, $\beta$, $\gamma$, $\xi$, $\omega$, $k_1$, $k_2$, k, $\delta$, $\epsilon$, all of which are known. In this example, the term AC is used to refer to voltage (or current) that varies rapidly in time (i.e., high frequency signal, e.g., >100 kHz), and DC is used to refer to voltage (or current) that changes slow in time (i.e., low frequency, e.g., <10 Hz). The intermediate frequencies can take various forms.

Information 202A of FIG. 2A illustrates a logical diagram of the AC and DC circuitry, where D/A is a digital/analog converter implemented in the Raspberry Pi architecture. The actual battery bank may, for example, consist of a 2-D array of identical cells connected in series and in parallel. The overall model of the battery bank is derived in this example from the model of a single cell, by multiplying the voltage response function with the number of serial cell stages, and by multiplying the current response function with the number of parallel stages.

In one example of the systems illustrated in information 202A of FIG. 2A, they may include a programmable signal generator, a storage scope, a micro-processor data acquisition, pulse generation, and an interface to database system. The programmable signal generator may be commanded by the micro-processor to generate the multi-frequency pulses that drive the active sensors exciting the two electrodes of the battery cell. The response of these excitations is collected into the micro-processor and sent to a database (not shown). Time stamped data is used to construct the parametric dynamic model of the battery cell. In addition, the active sensors may include an external thermocouple to determine the dynamical effects of temperature, and the battery may be provided with an impedance low frequency PID (proportional-integral-derivative) controller (e.g., implemented digitally in the micro-processor) to prevent the battery cell from overheating.

Figure 2B:
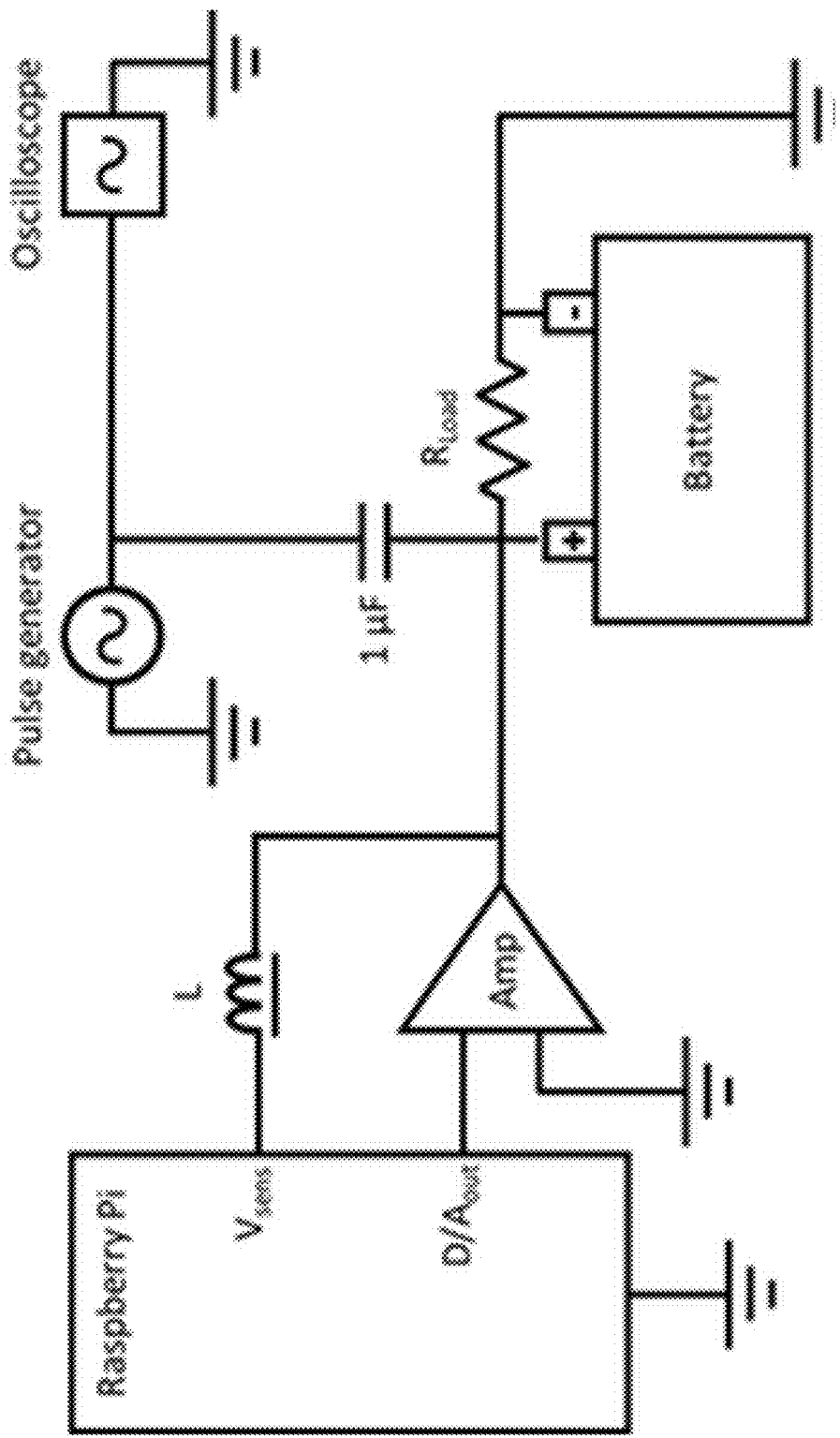

Information 200B of FIG. 2B continues the examples of FIG. 2A, and illustrates an example electronic diagram of AC and DC circuitry that may be used in some embodiments. The time-domain impulse response will be measured and digitized by the oscilloscope, and subsequently exported to a computing system for signal processing.

With respect to the examples of FIGS. 2A-2B, an incremental model may be applied to derive u(t+$\Delta$) in terms of the previous values of u(t) and e(t), such as by using a two-step Adams-Bashforth method. In at least some implementations, only proportional and integral controls (P and I) are used, as differential control is more susceptible to the influence of noise. As a result, control is given in the form of the following:

$$u(t) = k_p e(t) + k_1 \int_0^t e(T) dT \quad (F)$$

where e(t) is the time-dependent error function (the input to H in information 200A of FIG. 2A). Its transformation in the Laplace domain is $$u(s) = k_p e(s) + \frac{k_1}{s} e(s)$$

Therefore, the transfer function is given by $$H(s) = \frac{u(s)}{e(s)} = \frac{k_p s + k_1}{s}$$

Using Equation (F), the following can be written:

$$\dot{u}(t) = k_p \dot{e}(t) + k_1 e(t) = k_p \frac{e(t) - e(t-\Delta)}{\Delta} + k_1 e(t)$$

Using the Adams-Bashforth method gives $$u(t+\Delta) = u(t) + \frac{3}{2}\Delta\left[k_p \frac{e(t)-e(t-\Delta)}{\Delta} + k_1 e(t)\right] - 1/2\Delta\left[k_p \frac{e(t-\Delta) - e(t-2\Delta)}{\Delta} + k_1 e(t-\Delta)\right].$$

After rearranging the terms, the following equation results:

$$u(t+\Delta) = u(t) + \frac{3}{2}(k_p + \Delta k_1)e(t) + (-2k_p - 1/2\Delta k_1)e(t-\Delta) + 1/2k_p e(t-2\Delta) \quad (G)$$

which gives an example formula for implementation of the PID incremental control model.

Figure 2C:
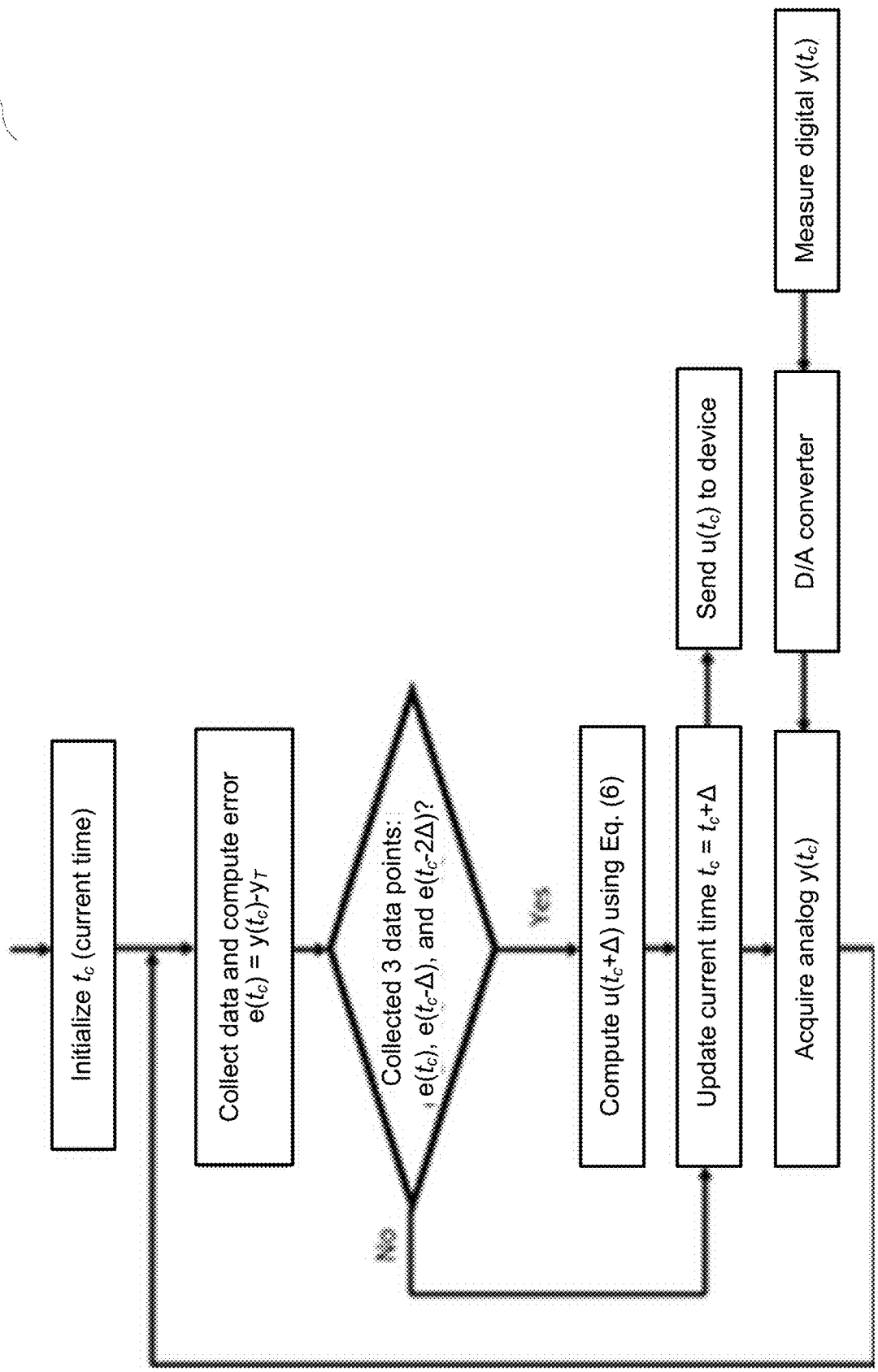

Information 200C of FIG. 2C continues the examples of FIGS. 2A-2B, and illustrates a logic diagram for implementing techniques of these examples.

In at least some situations, an incremental model used to describe system dynamics is considered linear within a specified incremental time interval. With respect to the described techniques for the examples above involving generating a numerical model of a given system via learning, they may use characterization of the system using experimentally obtained data to train a predetermined generalized system model. In the context of modeling an electrical system, carefully designed small "perturbative signals" may be used as the input to the electric circuit without disrupting the existing system states. By doing so, an input-output relation is established for the given system. The output signals in response to the perturbative input signals are subsequently detected as the system response, which fully characterizes a locally linear time-invariant (LTI) system.

As part of studying an electrical system, a fundamental question may include what would the output signal be for any given input signal. As there is an infinite number of possible input signals in the time domain, the input-output relationship may be analyzed in the frequency domain via Fourier transform. For this reason, it is beneficial to probe the system with input at multiple frequencies that cover the spectrum of interest, and detect the output at frequencies of interest. Note that the input and output spectrum are not necessarily the same for any given system. To achieve efficient sampling in the frequency domain, an impulse response method can be used to characterize the system in the frequency domain, which is sufficient to fully characterize any LTI system. For nonlinear systems, such as the battery discussed in these examples, this technique is still valid for incremental models as the changes in system states are small compared to the system nonlinearity.

Mathematically, an impulse can be treated as a Dirac delta function. Using an impulse as the input, the response of the system is termed the impulse response. As an impulse in the time domain translates to a constant value (unity for all frequencies) in the frequency domain, the impulse response gives the full-frequency response of the system. In the time domain, the impulse response is the convolution of the transfer function and the Dirac delta function, which gives the same result:

$$h(t) = \int h(t-T)\delta(T)dT$$

i.e., the impulse response of the system is the system transfer function in time domain. For a given dynamic system defined as $$\delta\dot{x} = A\delta x + B\delta u$$

$$\delta y = C\delta x$$

where $\delta y$ is an observation of state $\delta y$ for the input $\delta u$. In the incremental model, $$x(t+\Delta) = x(t) + \delta x(t+\Delta)$$

$$u(t+\Delta) = u(t) + \delta u(t+\Delta)$$

The relationship between the impulse response function (i.e. the transfer function) and the parameters of the system dynamics (A, B, and C) can then be determined.

The time domain transfer function of the system dynamics described by the incremental model can be expressed in the following form:

$$h(t) = Ce^{At}B \quad (1)$$

This can be shown as follows below. For the dynamic system described above without the external control u, the homogeneous equation results as follows:

$$\delta\dot{x} = A\delta x$$

The solution of this homogeneous equation is $$\delta x(t) = e^{At}\delta x(0)$$

Including the external control u provides the following:

$$\delta\dot{x} = A\delta x + B\delta u \quad (2)$$

If an intermediate variable z is defined, such that $$\delta x = e^{At}z \quad (3)$$

the time derivative of Equation (3) is $$\delta\dot{x} = Ae^{At}z + e^{At}\dot{z} \quad (4)$$

Plugging Equation (3) into Equation (2) gives $$\delta\dot{x} = Ae^{At}z + Bu \quad (5)$$

Comparing Equations (4) and (5) yields $$e^{At}\dot{z} = Bu \quad (6)$$

From Equation (6), $$\dot{z} = e^{-At}Bu \quad (7)$$

Integrating Equation (7) provides $$z(t) = z(0) + \int_0^t e^{-At}Bu(T)dT \quad (8)$$

Multiplying both sides of Equation (8) by $e^{-At}$ provides $$e^{At}z(t) = e^{At}z(0) + \int_0^t e^{A(t-T)}Bu(T)dT \quad (9)$$

Plugging Equation (3) into Equation (9) and knowing that $z(0)=\delta x(0)$ by evaluating Equation (3) at $t=0$ gives $$\delta x(t) = e^{At}\delta x(0) + \int_0^t e^{A(t-T)}Bu(T)dT \quad (10)$$

Let the initial incremental state be zero $\delta x(0)=0$

Equation (10) becomes $$\delta x(t) = \int_0^t e^{A(t-T)}Bu(T)dT \quad (11)$$

As the observable is related to the state by $\delta y(t) = C\delta x(t)$

Equation (10) can be written as $$\delta y(t) = \int_0^t [Ce^{A(t-T)}B]u(T)dT \quad (12)$$

According to the impulse response theory, when the input is a delta function, i.e., $u(t)=\delta(t)$ the output, i.e., $\delta y(t)$, in Equation (12) becomes the time domain transfer function of the system: i.e., $h(t)=Ce^{At}B$ Note: A, B, and C are parametric matrices whose initial values can be obtained through Kalman minimum-state realization algorithm. C is the same as the observation matrix H used in Kalman Filter Model (not to be confused with Hamiltonian notation discussed elsewhere herein).

With respect to Kalman minimal-state realization, in the Laplace domain, Equation (1) becomes the following:

$h(s)=C(sI-A)^{-1}B$ (13)

Suppose the system has n states, m inputs/controls, and k outputs/observables: the dimensions of h, A, B, and C are k×m, n×n, n×m, and k×n, respectively. In general, the transfer function in time domain is $$h(t) = \begin{bmatrix} h_{11}(t) & \cdots & h_{1m}(t) \\ \vdots & \ddots & \vdots \\ h_{k1}(t) & \cdots & h_{km}(t) \end{bmatrix}_{k \times m}$$

For each $h_{ij}$, where $i=1, \ldots, k$ and $j=1, \ldots, m$, its Laplace transform can be written in the form of $$h_{ij}(s) = \frac{pij(s)}{qij(s)}$$

where $p_{ij}$ and $q_{ij}$ are polynomials.

Therefore, the complete system transfer function in Laplace domain is $$h(s) = \begin{bmatrix} \frac{p_{11}(s)}{q_{11}(s)} & \cdots & \frac{p_{1m}(s)}{q_{1m}(s)} \\ \vdots & \ddots & \vdots \\ \frac{p_{kl}(s)}{q_{n1}(s)} & \cdots & \frac{p_{nm}(s)}{q_{km}(s)} \end{bmatrix} k \times m$$

which can be rewritten as $$h(s) = \begin{bmatrix} \frac{\tilde{p}_{11}(s)}{\Delta(s)} & \cdots & \frac{\tilde{p}_{1m}(s)}{\Delta(s)} \\ \vdots & \ddots & \vdots \\ \frac{\tilde{p}_{k1}(s)}{\Delta(s)} & \cdots & \frac{\tilde{p}_{km}(s)}{\Delta(s)} \end{bmatrix} k \times m$$

where $\Delta(s)$ is the minimum common multiple of $q_{ij}$'s, i.e., all of the polynomial denominators. Using Cramer's rule gives $$(sI - A)^{-1} = \frac{cof(sI - A)}{\det(sI - A)} \quad (14)$$

where cof(A) is the cofactor matrix of A, and det(A) is its determinant. It is noteworthy that $\Delta(s)=\det(sI-A)$.

Providing $\det(sI-A)=s^n+p_{n-1}s^{n-1}+\ldots+p_1s+p_0$ (15)

and $\text{cof}(sI-A)=\beta_{n-1}s^{n-1}+\ldots+\beta_1s+\beta_0$ (16)

where $p_i$ ($i=0, \ldots, n-1$) is scalar and $\beta_j$ ($j=0, \ldots, n-1$) is n-by-n matrix.

From Equation (14), $\det(sI-A)I=(sI-A)\text{cof}(sI-A)$

Therefore $(s^n+p_{n-1}s^{n-1}+\ldots+p_1s+p_0)I=(sI-A)(\beta_{n-1}s^{n-1}+\ldots+\beta_1s+\beta_0)$ (17)

Equating same-order terms on both sides of Equation (17) gives $s_n: I=\beta_{n-1} \Rightarrow \beta_{n-1}=I$ $s^{n-1}: p_{n-1}I=-A\beta_{n-1}+\beta_{n-2} \Rightarrow \beta_{n-2}=A+p_{n-1}I$ $\ldots$ $s^{n-k+1}: \beta_{n-k}=A^{k-1}+p_{n-1}A^{k-2}+\ldots+p_{n-(k-1)}A+p_{n-k}I$ $\ldots$ $s_1: \beta_0=A^{n-1}+p_{n-1}A^{n-2}+\ldots+p_1A+p_0I$ (18)

From Equations (13-16), $$h(s) = C(sI-A)^{-1}B = C\frac{cof(sI-A)}{det(sI-A)}B = \frac{C(\sum \beta_i s^i)B}{\sum p_j s^j} \quad (19)$$

Note that if h(t) is linear, h(s) is rational. Using polynomial regression (and specifying an appropriate polynomial order), the experimental data (i.e., the time-domain system impulse response) can be described by $$h(s) = \frac{[\sum h_i s^i]_{k \times m}}{\sum \alpha_j s^j} \quad (20)$$

For each of the m input/control signals, k output/observation signals are acquired. Therefore, $\sum \alpha_j s^j$ is a scalar polynomial and $[\sum h_i s^i]_{k \times m}$ is a k-by-m matrix of polynomials. Equating Equations (19) and (20) gives $$\Delta(s) = \sum \alpha_j s^j = \sum p_j s^j \quad (21)$$

and $$[\Sigma h_i s^i]_{k \times m} = c(\Sigma \beta_i s^i)B \quad (22)$$

Therefore, polynomial regression of experimental data gives $h_i$ and $\alpha_j$, the latter of which is equal to $p_j$ according to Equation (21). For the chosen controllability form, $p_j$ uniquely determines the A matrix. Plugging A and $p_j$ into Equation (18), $\beta_i$ can be computed, and matrices C and B can be solved for by plugging $\beta_i$ into Equation (22) and equating same-order terms. Note that the solutions of C and B are not unique, but if B is given/chosen, C becomes unique. Suppose the system has a dimension of n with m inputs and k outputs, A would be an n-by-n matrix, B would be n-by-m, C would be k-by-n, and $h_i$ would be n-by-n. For a canonical controllable system with n states, m inputs/controls, and k outputs/observables, $$A = \begin{bmatrix} 0 & 1 & \cdots & 0 \\ 0 & 0 & 1 & \cdots & 0 \\ \vdots & & & & \vdots \\ 0 & \cdots & & 0 & 1 \\ -p_0 & -p_1 & -p_2 & \cdots & -p_{n-1} \end{bmatrix}_{n \times n}$$

$$B = \begin{bmatrix} 0 & \cdots & 0 \\ 0 & \cdots & 0 \\ \vdots & \cdots & \vdots \\ b_1 & \cdots & b_m \end{bmatrix}_{n \times m}$$

$$C = \begin{bmatrix} c_{11} & \cdots & c_{1n} \\ \vdots & & \vdots \\ c_{k1} & \cdots & c_{kn} \end{bmatrix}_{k \times n}$$

To construct A, B, and C, solve n+m+k×m unknowns, the number of which is typically smaller than that of knowns obtained from the measurement.

As one specific example, consider a number of dimension/states of a battery system to be 4, namely: voltage, current, power, and temperature. Using the canonical controllable form gives $$A = \begin{bmatrix} 0 & 1 & 0 & 0 \\ 0 & 0 & 1 & 0 \\ 0 & 0 & 0 & 1 \\ -p_0 & -p_1 & -p_2 & -p_3 \end{bmatrix}$$

If 2 controls are used and 3 observables are made, $$B = \begin{bmatrix} 0 & 0 \\ 0 & 0 \\ 0 & 0 \\ b_1 & b_2 \end{bmatrix}$$

$$C = \begin{bmatrix} c_{11} & c_{12} & c_{13} & c_{14} \\ c_{21} & c_{22} & c_{23} & c_{24} \\ c_{31} & c_{32} & c_{33} & c_{34} \end{bmatrix}$$

and $$h = \begin{bmatrix} h_{11} & h_{12} \\ h_{21} & h_{22} \\ h_{31} & h_{32} \end{bmatrix}.$$

The general form of the system impulse response is known in the time domain, Equation (1). An alternative to Kalman minimal-state realization method described above is to generate the system model by data regressions on experimental data h(t) directly. If A, B, and C are scalars, taking natural logarithms of both sides of Equation (1) yields $$\ln(h(t)) = \ln C + At + \ln B = At + (\ln C + \ln B) \quad (23)$$

where h(t) is the time-domain impulse response (experimental data), and A, B, C define the system dynamics, controls, and observations, respectively. Using Equation (23), the system impulse response function (i.e., the system model) becomes linearized with respect to t. Through linear data regressions, the parameters A, B, and C can be determined. However, as A, B, and C are matrices/vectors in general, taking logarithms becomes problematic algebraically. The following method can be used to achieve the same direct data regression. Consider the power expansion of an exponential function $$e^x = 1 + x + \frac{x^2}{2!} + \frac{x^3}{3!} + \ldots = \sum_{k=0}^{\infty} \frac{x^k}{k!}.$$

In matrix algebra, the same relationship holds $$e^{At} = I + At + \frac{A^2 t^2}{2!} + \frac{A^3 t^3}{3!} + \ldots = \sum_{k=0}^{\infty} \frac{A^k t^k}{k!}.$$

where I is the identity matrix, A is an n-by-n system matrix, and t is scalar time variable. Taking only the first 3 low-order terms, for example, gives $$\tilde{h}(t) = C\left[I + At + \frac{A^2t^2}{2}\right]B.$$

Subsequently, the data regression problem becomes the following nonlinear quadratic minimization problem $$\min([h(t)-\tilde{h}(t)]^T Q[h(t)-\tilde{h}(t)])$$

where Q is the weight matrix for optimization algorithm. Note that, although C and B are mathematically inseparable in general, C can be uniquely determined by specifying/choosing a specific form of B (e.g., canonical controllable form). If desirable, higher-order terms may be included, e.g., $$\tilde{h}(t) = C\left[I + At + \frac{A^2t^2}{2} + \frac{A^3t^3}{6}\right]B.$$

As the exact response of a battery is dependent on the charge level, the impulse response of the battery may be measured at different charge levels (e.g., 10%, 25%, 50%, 75%, and 90%). In computational models, the charge level is given by the time integral of current and the initial conditions (i.e., the known charge levels at time-zero).

Additional details regarding an example algorithm for generating the battery model are included in some embodiments in U.S. Patent Application No. 62/796,521, filed Jan. 24, 2019 and entitled "Model Realization Algorithm," which is incorporated herein by reference in its entirety, and other example details are included elsewhere herein, including with respect to the examples of FIGS. 2A-2H.

For example, in some embodiments, the following applies. Impulse response: $h(t)=Ce^{At}B$ (if continuous time) or $h(N)=CA^{N-1}B$ (if discrete time)

↓

Markov parameter blocks m×k matrix $[G_0, G_1, G_2, \ldots G_N]$ with m controls and k sensors

↓

Hankel matrix $H = \begin{bmatrix} G_1 & G_2 & \ldots & G_{r2} \\ G_2 & G_3 & & \\ \vdots & & \ddots & \\ G_{r1} & & & G_{r1+r2-1} \end{bmatrix}_{r1*r2}$ shifted Hankel matrix $\overline{H} = \begin{bmatrix} G_2 & G_3 & \ldots & G_{r2+1} \\ G_3 & G_4 & & \\ \vdots & & \ddots & \\ G_{r1+1} & & & G_{r1+r2} \end{bmatrix}_{r1*r2}$ Find decomposition P and Q, such that $PHQ = \begin{bmatrix} I_p & 0 \\ 0 & 0 \end{bmatrix}$ where P=rank of H.

$A = E_{p,rk}\overline{P}HQE_{p,rm}^T = [\overline{P}HQ]_{p \times p}$ – (take the first $p_x p$ $rows_x columns$)

where $E_{p,q} = [I_p, O_{p,q-p}]$ $B = E_{p,rk}PHE_{m,rm}^T = [PH]_{p_xm}$ $C = E_{k,rk}HQE_{p,rm}^T = [HQ]_{k,p}$ $D = G_0$ Decomposition $SVD \Rightarrow U\sum V =$ (1)

$H = >\left(U\sum^{1/2}\right)\left(\sum^{1/2} V\right) = H \Rightarrow P \triangleq \left(U\sum^{1/2}\right)^{-1},$ $Q \triangleq \left(\sum^{1/2} V\right)^{-1}$, s.t. $PHQ = I$ Decomposition can be implemented in various manners, without restrictions.

⇒ infinite number of decompositions⇒ infinite redirections (A,B,C).

(2) Discrete-time and continuous-time system parameters are related by $A_d = e^{Ac\Delta}$ $B_d = e^{Ac\Delta} B_c$ $C_d = C_c$ where d is discrete, c is continuous, and Δ is the sampling interval $\dot{x}(t) = Ax(t) + Bu(t)$ $x(t+\Delta) = e^{A\Delta}x(t) + \int_t^{t+\Delta} e^{A(t+\Delta-\tau)} Bu(\tau-t)\sigma\tau$ $u(\tau-t) = u_k \delta(\tau-t)$ $\because \int \delta(t-a)f(t)\delta t = f(a)$ $\therefore x(t+\Delta) = e^{A\Delta}x(t) + e^{A\Delta}Bu_k$ $\because x(N+1) \triangleq \tilde{A}x(N) + \tilde{B}u(N)$ $\therefore \tilde{A} = e^{A\Delta}$ $\tilde{B} = e^{A\Delta}B$ State-Space of Discrete-Time Linear Systems:

Digital $\boxed{\begin{array}{l} y(n) = \tilde{C}x[n] + \tilde{D}u[n] \\ x[n+1] = \tilde{A}x[n] + \tilde{B}u[n] \end{array}}$ Markov Parameter Sequence (Matrix Impulse Response)

$h[0] = \tilde{C}x[0] + \tilde{D}\delta[0] = \tilde{D}$  $(x[0] = 0, \delta[0] = 1)$ $x[1] = \tilde{A}x[0] + \tilde{B}\delta[0] = \tilde{B}$ $h[1] = \tilde{C}x[1] + \tilde{D}\delta[1] = \tilde{C}\tilde{B}$  $(x[1] = \tilde{B}, \delta[1] = 1)$ $x[2] = \tilde{A}x[1] + \tilde{B}\delta[1] = \tilde{A}\tilde{B}$ -continued $$h[2] = \tilde{C}x[2] + \tilde{D}\delta[2] = \tilde{C}\tilde{A}\tilde{B} \quad (x[2] = \tilde{A}\tilde{B}, \delta[2] = 1)$$

$$x[3] = \tilde{A}x[1] + \tilde{B}\delta[1] = \tilde{A}^2\tilde{B}$$

$$\vdots$$

$$h[n] = \tilde{C}\tilde{A}^{n-1}\tilde{B}, n > 0 \qquad \text{Impulse Response}$$

Continuous-Time Systems:

$$\underline{\text{Analog}} \boxed{\begin{array}{l} y(t) = Cx(t) + Du(t) \\ \dot{x}(t) = Ax(t) + Bu(t) \end{array}}$$

$$h(t) = Ce^{At}B \stackrel{\Delta}{=} Ce^{A(n)\Delta}B, \text{ where } \Delta = t/n, \text{ and where } \Delta \text{ is the sampling interval}$$

$$= C(e^{A\Delta})^n B = C(e^{A\Delta})^{n-1}(e^{A\Delta}B)$$

$$=> \tilde{A} = e^{A\Delta}, \tilde{B} = e^{A\Delta}B, \tilde{C} = C$$

Figure 2D:
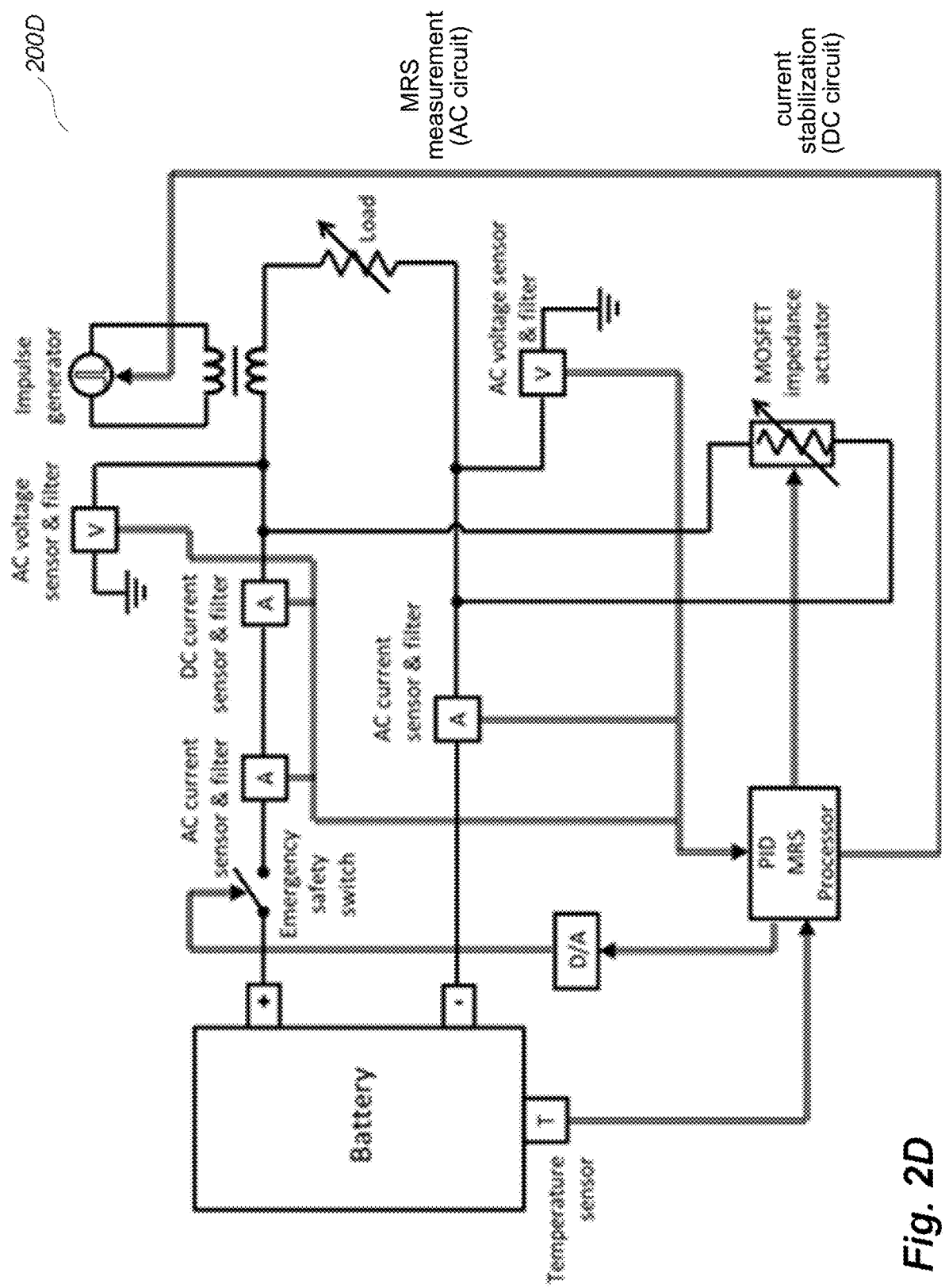
Figure 2E:
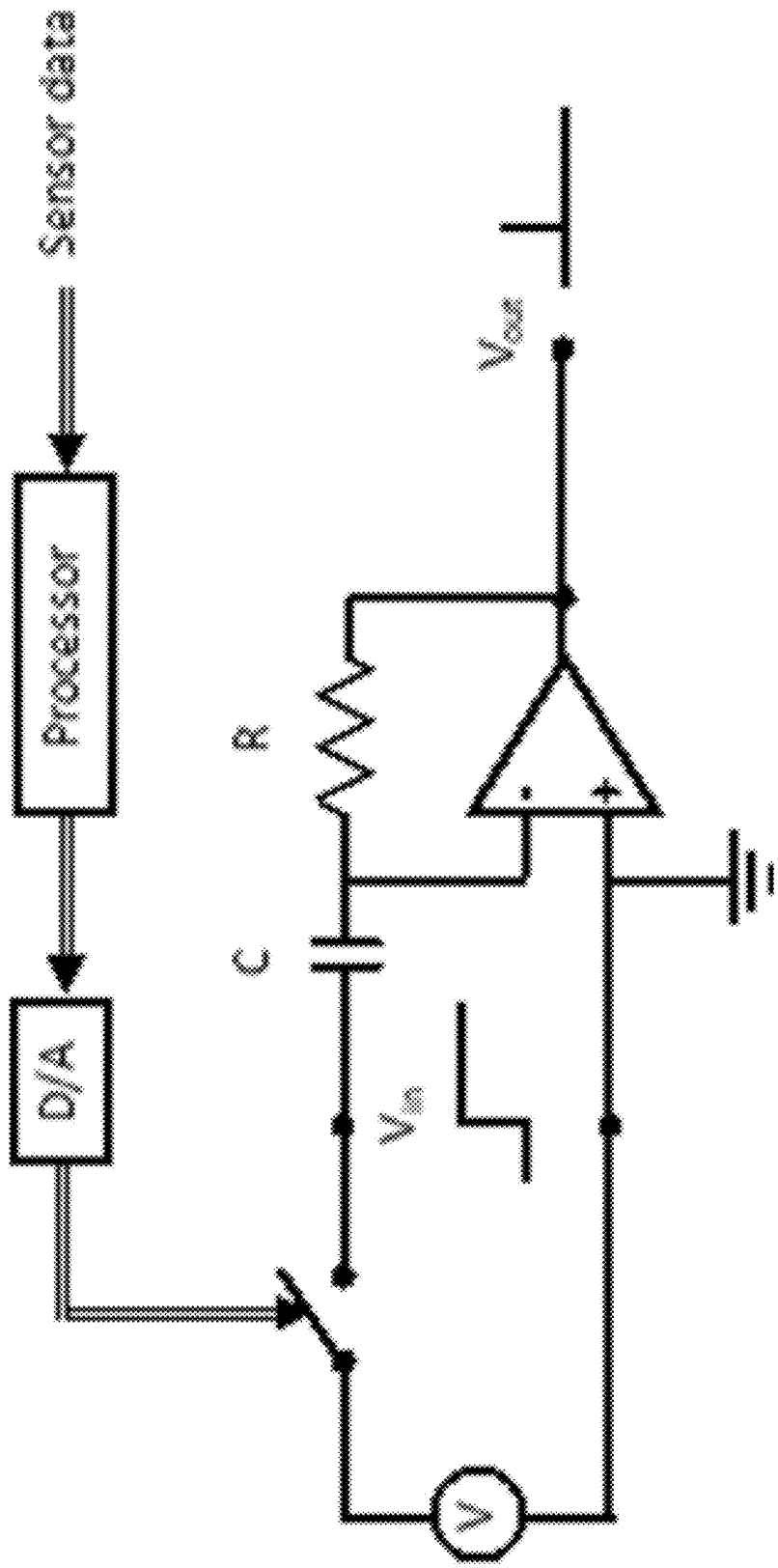
Figure 2F:
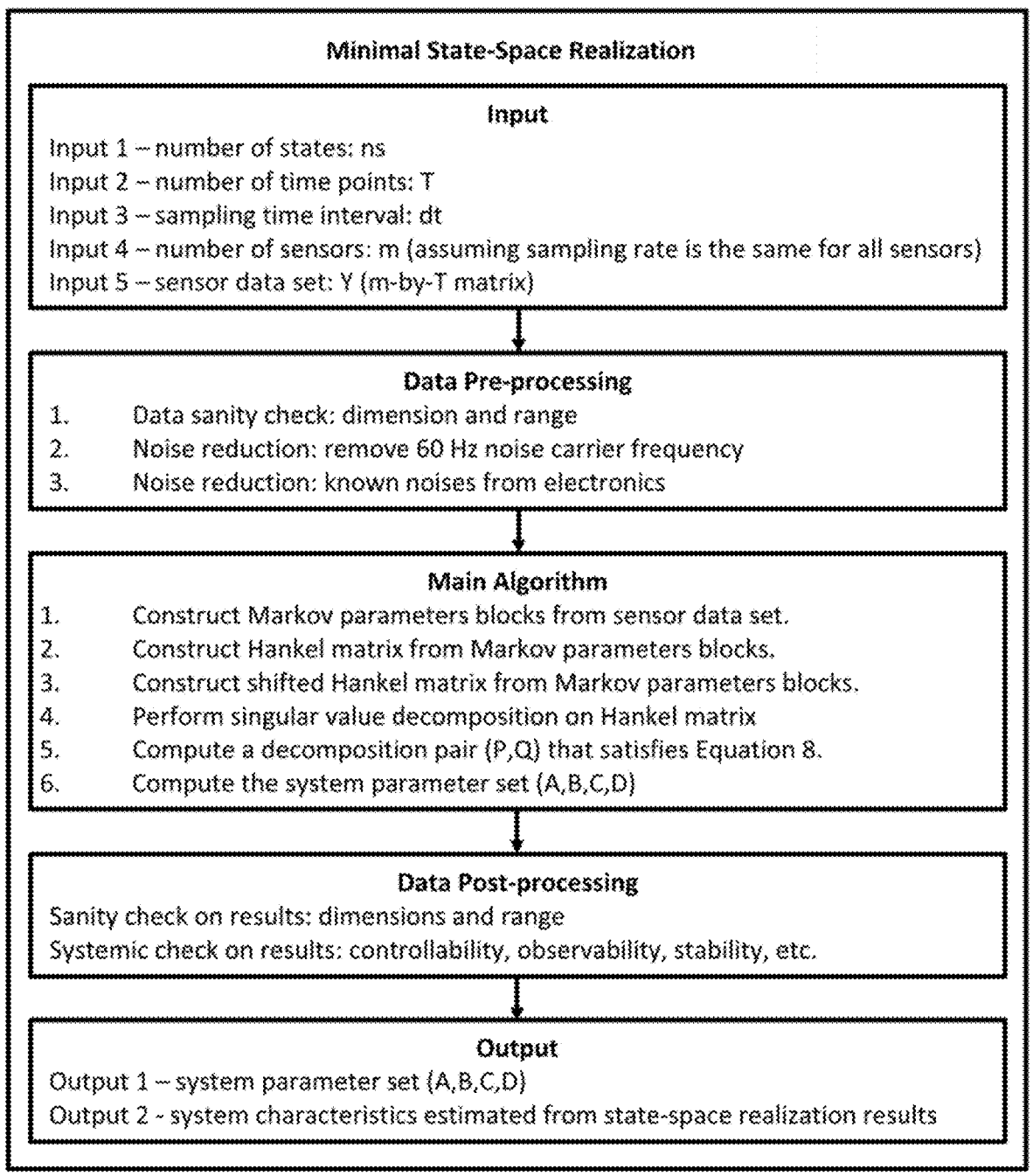
Figure 2G:
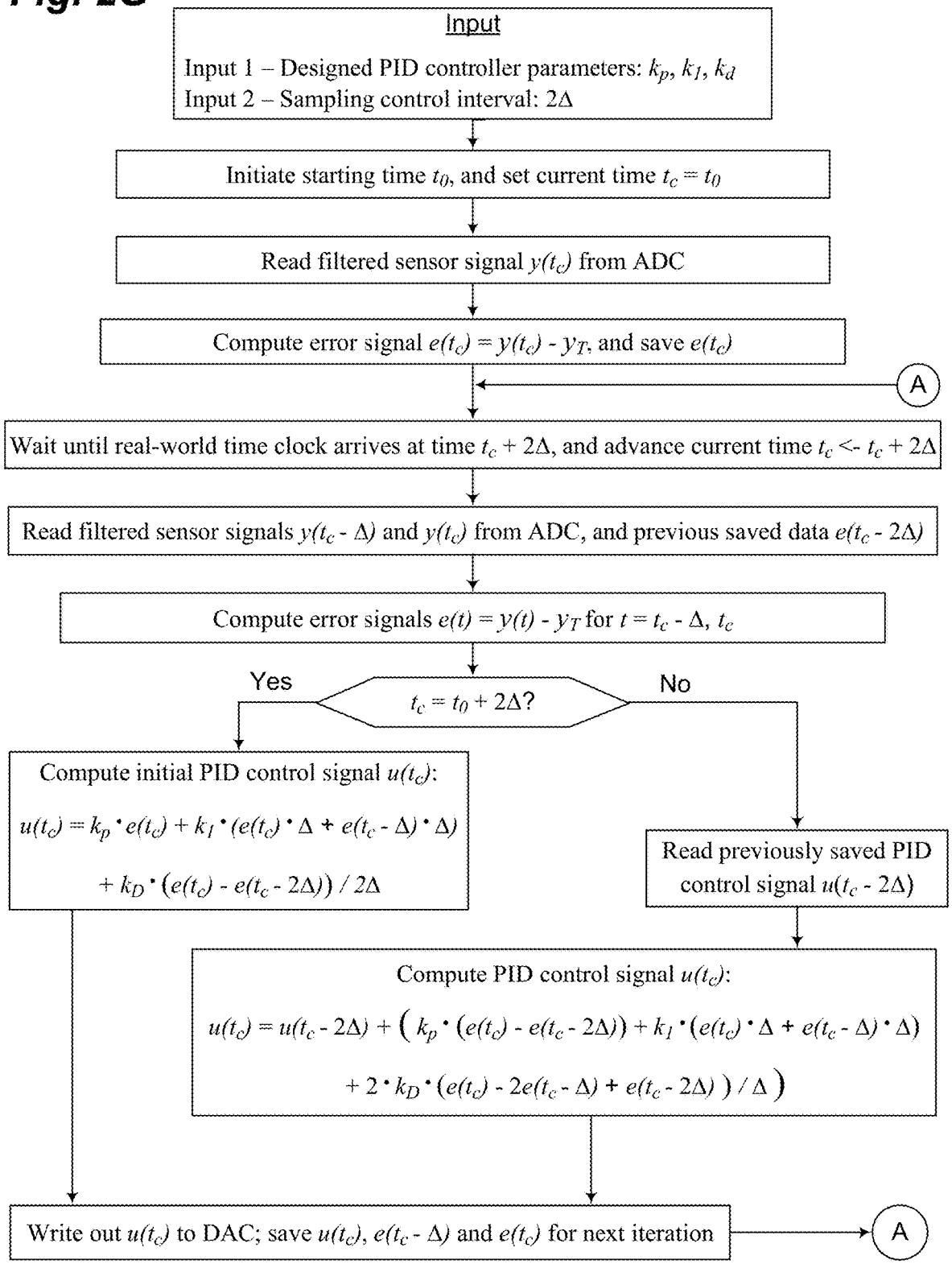
Figure 2H:
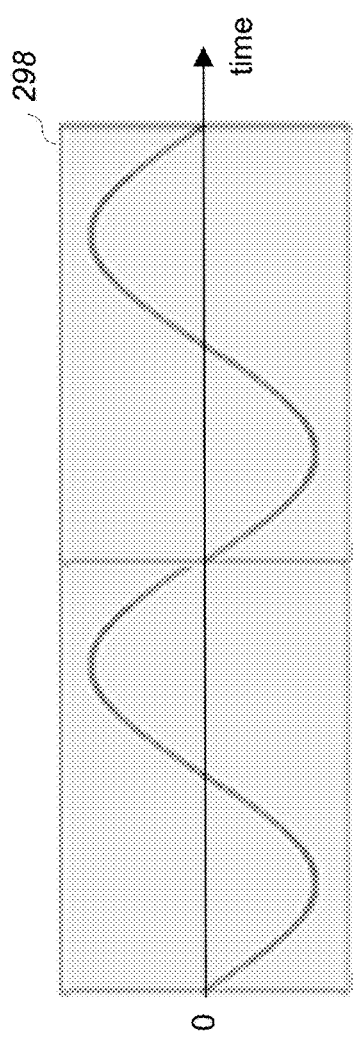
Figure 2H:
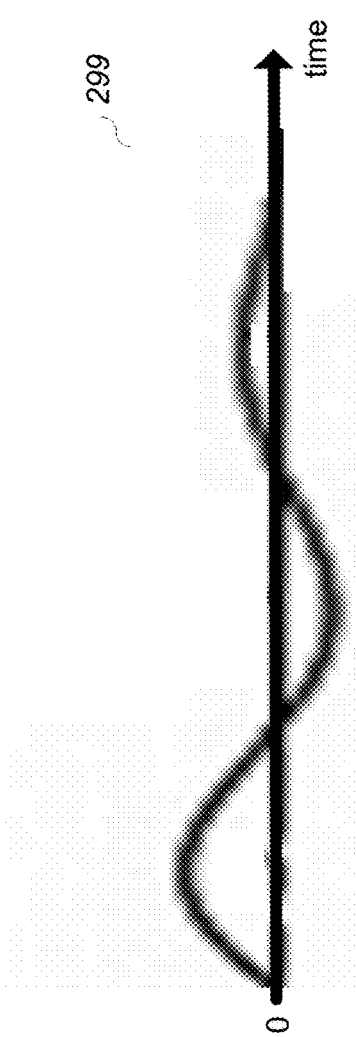

Example (1) system $\ddot{x} + w^2 x = u$ $$=> \begin{bmatrix} \dot{x}_1 = x_2 \\ \dot{x}_2 = -w^2 x_1 + u \end{bmatrix}$$

$$\text{system } \ddot{x} + w^2 x = u \qquad (1)$$

$$\Rightarrow \begin{bmatrix} \dot{x}_1 = x_2 \\ \dot{x}_2 = -w^2 x_1 + u \end{bmatrix}$$

i.e. $\dot{x}_1 = 0 + x_2 + 0 \quad \Rightarrow A = \begin{bmatrix} 0 & 1 \\ -w^2 & 0 \end{bmatrix}$ $\dot{x}_2 = -w^2 x_1 + 0 + u \quad B = \begin{bmatrix} 0 \\ 1 \end{bmatrix}$ $y = x_1 \quad \Rightarrow C = [1 \ 0]$ Impulse response $h(t) = Ce^{At}B$ See example chart 298 of FIG. 2H.

(2) system $\ddot{x} + 2\zeta w\dot{x} + w^2 x = u$
($2^{nd}$-order filter) $\zeta = 0.707$ $x_1 = x$ $\dot{x}_1 = x_2 = \dot{x}$ $\dot{x}_2 = \ddot{x}_1 = -2\zeta w x_2 - w^2 x_1 + u$ $\text{system } \ddot{x} + 2\zeta w\dot{x} + w^2 x = u \qquad (2)$ ($2^{nd}$-order filter) $\zeta = 0.707$ $x_1 = x$ $\dot{x}_1 = x_2 = \dot{x}$ $\dot{x}_2 = \ddot{x}_1 = -2\zeta w x_2 - w^2 x_1 + u$ $\Rightarrow A = \begin{bmatrix} 0 & -w^2 \\ 1 & -2\zeta w \end{bmatrix}, B = \begin{bmatrix} 0 \\ 1 \end{bmatrix}, C = [1 \ 0]$ See example chart 299 of FIG. 2H.

Additional non-exclusive examples of techniques for generating a battery model and implementing a model realization system in at least some embodiments include the following.

In at least some embodiments, a learning approach is used to develop parametric linear models of dynamical systems, such as for systems that each includes one or more batteries and/or for other types of systems. The approach selects an appropriate state as a parameter to characterize the model. For example, in a battery system, the selected state is battery charge, such as with the battery charge discretized into a finite number of levels (e.g., with the number of levels selected so that the linear approximation between levels is valid), and a linear model is learned for each level interval. The linear model between levels is generated by exciting the device with an impulse and reading out the response of the system via sensors, with the response called an impulse response signal. This signal, which is usually a vector signal, is used to algorithmically generate a linear state representation of the input/output dynamics of the system under study. The minimum state realization for each level of the characteristic state of the model (for a battery it is the charge) is a linear dynamic model with constant coefficients.

With respect to this approach in the current example, which may be implemented by an embodiment of a model realization system, a first step is to select the characteristic state to use, such as charge for a battery system. In this approach, the characteristic state is not determined by direct measurements—instead, for a battery, the charge is computed from measurements of current i(t) using the following equation (I):

$$q(t + \Delta) = q(t) + \int_t^{t+\Delta} i(\tau)d\tau \qquad (I)$$

where $\Delta$ is a small positive quantity, and q(t) is the computed charge at time t. If $q(t+\Delta) \geq q_l$, where $q_l$ is a level of the characteristic state, then an impulse is generated and fed to the battery. The corresponding signals of the outputs are measured and recorded over a period of time T, where T is called the relaxation time. This process is repeated a few times to obtain an average response for the level $q_l$. The impulse signals are wide-sense frequency response, but the system is usually a low-pass frequency system. Therefore, the outputs at normal operation are not significantly changed by the impulses.

In this example, the model realization system embodiment uses a state-space realization approach to generate the parametric linear dynamics of the system of minimum state dimension, as follows:

$$\dot{x} = A_{q_l} x + B_{q_l} u$$

$$y = C_{q_l} x \qquad (II)$$

where x(t) is the state of the model of the current characteristics interval with initial value of the level $q_l$. In general, $x(t) \in R^n$, where n is finite, and $u(t) \in R^k$ is the signal vector corresponding to the inputs to the parametric mode; $y(t) \in R^m$ is the vector signal of outputs. The n×n matrix $A_{q_l}$ is the infinitesimal transition of the state; $B_{q_l}$ is the gain matrix for the control; $C_{q_l}$ is the transformation matrix from state to observation.

For each characteristic interval, this embodiment of the model realization system uses the impulse response data to construct the matrix parameters of a minimal state-space realization, with the impulse response of the system given in Equation (II) is:

$$h(t)=Ce^{At}B \quad \text{(III)}$$

For simplicity, $q_l$ is suppressed in (III) and following formulas, and h(t) is a vector signal of dimension m that represents the response of the system to an impulse as the input. The algorithm solves equation (III) for the system parameters C, A and B, based on the determination of a series of matrices for the right-hand-side of (III) that are referred to as Markov parameters.

The minimal state-space realization approach discussed above may be implemented using, for example, Kalman's algorithm. If so, and given the Markov parameters block series $[M_0, M_1, M_2, \ldots, M_N]$ (e.g., computed by the Cayley Hamilton theorem), where the number of time points N is greater than or equal to the number of matrices' entries in the minimum realization, the approach first constructs a Hankel matrix as follows:

$$H = \begin{bmatrix} M_1 & \cdots & M_r \\ \vdots & \ddots & \vdots \\ M_r & \cdots & M_{2r-1} \end{bmatrix}_{r \times r} \quad \text{(IV)}$$

and the shifted Hankel matrix $$H = \begin{bmatrix} M_2 & \cdots & M_{r+1} \\ \vdots & \ddots & \vdots \\ M_{r+1} & \cdots & M_{2r} \end{bmatrix}_{r \times r} \quad \text{(V)}$$

where r is the rank of the Hankel matrix. When r is sufficiently large, it is the minimum dimension of the state of the system. Once the minimum Hankel matrix is constructed, the next step is to find a (P, Q) decomposition of the Hankel matrix H such that $$PHQ = \begin{bmatrix} I_\rho & 0 \\ 0 & 0 \end{bmatrix} \quad \text{(VI)}$$

where $I_p$ is an identify matrix of rank ρ.

To obtain (P, Q), Singular Value Decomposition (SVD) may, for example, be used to find another Hankel matrix S as well as matrices U and V that satisfy the following:

$$USV=H \quad \text{(VII)}$$

It follows that $$P=(US^{1/2})^{-1} \quad \text{(VIII)}$$

$$Q=(S^{1/2}V)^{-1} \quad \text{(IX)}$$

provide a decomposition (matrices P and Q) that satisfies Equation (VI). This iteration also guarantees to terminate in finite time provided that A, B and C do exist. The system matrices are then given by the following:

$$A=[P\overline{H}Q]_{n \times n} \quad \text{(X)}$$

$$B=[PH]_{n \times m} \quad \text{(XI)}$$

$$C=[HQ]_{k \times n} \quad \text{(XII)}$$

Continuing with the approach for this example embodiment of a model realization system, FIG. 2D provides a schematic diagram 200D for use in the determination of a parametric linear model for the dynamics of an example illustrated battery cell (e.g., a lithium-ion battery). In this example, the battery is loaded with a variable resistor, and for each level interval, a fixed value of the load is selected and kept constant during the level interval. The measurement system is composed of two loops in this example, with a DC loop that includes the load, and an AC loop that includes high response voltage and current sensors and implements the impulse response functionality of the model realization system—in this example, each of the current and voltage sensors is equipped with a 4th-order elliptic filter, which is designed to achieve SNR≥120 dB/decade around the 60 Hz frequency. Those components in this example include two high-speed ammeters, two high-speed voltmeters, an impulse current generator and a processor to capture the impulse response, to compute the current charge of the battery, and to generate the resulting realization model based on an expectation that by feeding an impulse to the battery, the natural frequencies of the free ions are expected to be resonated. The DC circuit controls the operations of the battery at low frequencies to maintain close response to a DC current tracking signal generated by the processor. This tracking signal is specified so that the battery maintains a more or less constant DC current for each tested load. The DC circuit behavior is measured by the DC current meter. The controller of the battery is mediated by a FET-based (Field Effect Transistor) impedance actuator that is controlled by the control signal generated in the processor. The DC controller is described further below.

Measurements for the model realization system embodiment are performed with the AC circuit shown in FIG. 2D, which includes an impulse generator (shown further in information 200E of FIG. 2E) and time-resolved data acquisition via AC sensors. The small current impulses are injected into the battery system via a signal-coupling transformer as shown in FIG. 2D. FIG. 2F further illustrates an example routine 200F that may, in at least some embodiments, be implemented for each charge interval to implement the approach described above, as part of an offline learning algorithm.

While conducting the measurements discussed above, free electrons may be injected into and pulled out of the cathode and anode, respectively, at high intensity within very short periods of time. As a result, oscillatory interactions may occur between the free electrons and the ions inside the Li-ion battery, which may lead to oscillatory current output at frequencies characteristic to the battery. If uncontrolled, the battery may be irreversibly damaged. To control the oscillatory current output (typically 1-5 Hz), an impedance actuator in parallel to the load may be used, such as for an impedance actuator constructed from a high-current rating MOSFET (metal-oxide-semiconductor field-effect transistor) controlled by a real-time PID controller.

With respect to such a PID controller, it may take into account the proportion (P), integral (I), and differential (D) of the error between the output and target signals, in order to achieve the control objectives of a feedback loop. Coefficients $k_P$, $k_i$, and $k_D$ represent such proportional, integral, and differential parameters of the PID controller, respectively, and the relationship between the control u(t) and the error e(t) at time t is given by $$u(t) = k_P e(t) + k_I \int_0^t e(\tau)d\tau + k_D \frac{de(\tau)}{d\tau}\bigg|_{\tau=t} \quad \text{(XXI)}$$

where e(t) is the error measurement that satisfies:

$$e(t)=x(t)-y(t)$$

where x(t) is the measured DC current of the battery, and y(t)) is the desired current generated by the processor. At time t+Δ, the control is given by $$u(t+\Delta) = k_P e(t+\Delta) + k_I \int_0^{t+\Delta} e(\tau)d\tau + k_D \frac{de(\tau)}{d\tau}\bigg|_{\tau=t+\Delta} \quad \text{(XXII)}$$

Subtracting Equation XXI from Equation XXII gives:

$$u(t+\Delta) = u(t) + k_P[e(t+\Delta) - e(t)] + \quad \text{(XXIII)}$$
$$k_I \int_0^{t+\Delta} e(\tau)d\tau + k_D\left[\frac{de(\tau)}{d\tau}\bigg|_{\tau=t+\Delta} - \frac{de(\tau)}{d\tau}\bigg|_{\tau=t}\right]$$

In Equation XXIII, the integral term and differential term may be estimated by numerical algorithms such as, for example, Adam-Bashfort for the integration, and modified trapezoidal for the derivative, with the numerical algorithms chosen in this example so that the order of the error is $O(\Delta^3)$. For numerical purposes, equation (XXIII) may be implemented with two time scales as follows: 2Δ for control implementation, and for data collection. The parameters of the controller may be computed using, for example, a modified Routh-Hurwicz algorithm in a pole allocation schema. An example embodiment of a routine 200G for implementing operations of a real-time modified PID controller is shown in FIG. 2G.

The example approach described above provides quality control determination of battery cells or other components of distributed energy resource (DER) systems. In addition, a behavioral model for a reference battery (e.g., a battery cell of high quality) may be generated using a sequence of parametric models for a set of charge levels and a set of loads, with such a battery referred to at times as a 'reference standard' battery and/or 'standard cell' (e.g., for a type of battery, such as lithium-ion, nickel-cadmium, nickel-metal-hydride, small sealed lead acid batteries, etc.; for an associated group of batteries, such as to be used together in a common target system and/or for a common purpose; etc.), and with the generated behavioral model for the battery referred to at times as a 'reference standard behavioral model' and stored for use in comparison to other behavioral models of other batteries of that type or for potential inclusion in the associated group. Each battery that is a candidate for an implementation may be evaluated using this approach, and the resulting generated models may be compared against the model for the 'reference standard' (e.g., to provide a standardized or normed comparison against a fixed standard) and/or against each other (e.g., to provide a relative comparison). If the differences between a candidate battery and the standard battery are calculated and are sufficiently low (e.g., below a defined threshold), the candidate battery may be treated as acceptable or good, such as to be used in a particular battery system. If the differences between two or more candidate batteries are calculated, some quantity or group of the candidate batteries (e.g., the top 1, the top X, the top X %, etc., with respect to one or more measures of the generated parametric models) may similarly be treated as acceptable or good, or more generally zero or more of the group of candidate batteries may be treated as acceptable or good if they satisfy one or more satisfied criteria (e.g., with respect to one or more performance criteria, such as with respect to current and/or voltage produced at one or more charge levels and/or resistive loads), such as to be used in one or more particular battery systems. Such a proposed test of a candidate battery may, for example, take only a couple of seconds.

In addition, the generation of the parametric model for the standard battery cell may be repeated for many charge/discharge cycles in at least some embodiments to determine, for the particular standard battery cell and/or the type of battery of the standard battery cell, the marginal degradation of the battery performance. The measured degradation may further be extrapolated to determine an estimated longevity of this particular battery cell and/or type of battery cell, such as for use in establishing rules for future operation of the battery that maximize one or more goals (e.g., battery life, economic value, etc.).

Another possible application of the approach described above in some embodiments is for selecting battery groups whose batteries exhibit nearly uniform behavior, such as for implementing quality operation on industrial batteries.

Another possible application of the approach described above in some embodiments is to generate initial models for a particular battery and/or a particular type of battery that are used in subsequent implementation of battery control (e.g., real-time or near-real-time control).

It will be appreciated that the approach described above may be used in other manners in other embodiments, some of which are further described herein.

Some further aspects of performing automated operations to control such a target system with one or more batteries and/or other types are target systems are included in U.S. patent application Ser. No. 16/103,788, filed Aug. 14, 2018 and entitled "Using Battery State Excitation To Control Battery Operations;" in U.S. patent application Ser. No. 15/096,091, filed Apr. 11, 2016 and entitled "Using Battery DC Characteristics To Control Power Output;" and in U.S. patent application Ser. No. 15/410,647, filed Jan. 19, 2017 and entitled "Using Sensor Data To Assist In Controlling A Target System By Modeling The Functionality Of The Target System," which claims the priority benefit of U.S. Provisional Patent Application No. 62/336,418, filed May 13, 2016 and entitled "Using Sensor Data To Assist In Controlling A Target System By Modeling The Functionality Of The Target System;" each of which is hereby incorporated by reference in its entirety.

In at least some embodiments, initial modeling of a state of a target system is performed using one or more data Hamiltonian functions, and the described techniques include generate, update and/or improve such data Hamiltonian function(s) (e.g., in order to complete an underlying Hamiltonian-based model) based on analysis of one or more types of sensor data. A CDD system controlling such a target system may, in at least some embodiments and situations, implement multiple CDD decision modules or sub-systems (also referred to at times herein as CDI, or Collaborative Distributed Inferencing, control agents, such that a particular embodiment of the CDD system with one or more such CDI control agents may be referred to as a CDI system) to distribute the control and management through an agent-based network with synchronization via a mean field Hamiltonian approach, such as with each agent characterized by a data Hamiltonian that defines the dynamics and interaction of one or more corresponding components in the target system, and with each such data Hamiltonian of an agent being dynamically computed from sensory data and actions. Such a data Hamiltonian (for a single target system component) and/or mean field Hamiltonian (for multiple coordinated target system components) can be thought of as a mathematical function that helps navigate a query through huge bodies of information by defining a spectrum of possible outcomes, including to model history, current situation and possible options. Non-exclusive example embodiments using such techniques are further described herein, but it will be appreciated that other embodiments may differ in one or more manners from these example embodiments.

As noted above, a data Hamiltonian may be implemented as a function that captures the flow and interdependence of a data domain, and may have three types of variables (e.g., state variables, flow variables, and decision or control variables). A CDI control agent may be implemented as an optimization-based engine operating in a data domain that belongs to a multi-data domain, with agent optimization functionality encoded in the agent's Hamiltonian. The CDD system may be implemented as a formal, distributed rule-based optimization process for resolving time-based queries from a distributed agent-based domain in real-time. A CDI control agent of the CDD system may be implemented using Horn clause rules of three types, as follows: absolute rules that characterize the physics of a physical target system being controlled (or otherwise describe unchangeable rules in other types of target systems), and have truth value equal to true in any Hamiltonian realization (e.g., a value of 0 for false or 1 for true); hard rules that characterize the desired behavior and goals, and have truth value equal to true in any Hamiltonian realization (e.g., a value of 0 for false or 1 for true); and soft rules that characterize the empirical knowledge of the operation, heuristic strategies, economic dispatch, and response to anomalies and learning strategies, and have a variable, probabilistic truth value in [0,1], as well as an associated confidence value for that variable, probabilistic truth value in some embodiments. Meta-rules are special kinds of soft rules used to transform sensory data and desired behavior into constraint data Hamiltonians. Soft rules can be thought of as being used to navigate queries through "gradients" (information that is neither true nor false), as a means of identifying what areas of data are pertinent to any given query. Thus, such rules for a CDI control agent define the constraints for a data Hamiltonian for the agent, and may be converted to a constraint optimization problem that a corresponding CDD system solves. For example, such conversion may include the following: transform truth values {0,1} to a [0,1] interval; transform variables and parameters to continuous variables and parameters; transform absolute rules to equality constraints; transform hard rules to equality constraints; transform soft rules to inequality constraints; transform inclusion sets to functional forms; transform algorithms to differential equations; etc.

Some further aspects of implementing such techniques for modeling target systems and performing automated operations to control such target systems, including in a distributed manner using multiple agents, are included in U.S. patent application Ser. No. 14/746,738, filed Jun. 22, 2015 and entitled "Cooperative Distributed Control Of Target Systems;" in U.S. Patent Application No. 62/182,968, filed Jun. 22, 2015 and entitled "Applications Of Cooperative Distributed Control Of Target Systems;" in U.S. Patent Application No. 62/182,796, filed Jun. 22, 2015 and entitled "Gauge Systems;" and in international PCT Patent Application No. PCT/US2015/037022, filed Jun. 22, 2015 and entitled "Cooperative Distributed Control Of Target Systems," each of which is hereby incorporated by reference in its entirety.

In addition, while the operation of the model realization system may be performed only once in some embodiments and situations, such as to learn a battery behavior model that is subsequently used, in other embodiments the model realization system may be used in a similar manner multiple times (e.g., periodically, continuously or substantially continuously, etc.), such as to continue to improve the control agent over time (e.g., to structurally adapt the control agent to changes that occur to the system over time, such as the addition and/or removal and/or modification of one or more loads, the addition and/or removal and/or modification of one or more sources, changes to the internal state and operational characteristics of the battery, changes to one or more other elements, etc.). Furthermore, while not illustrated in the examples of FIGS. 2A-2H, in some embodiments multiple batteries (e.g., tens, hundreds, thousands, millions, etc.) may each have an associated control agent that controls actions of that battery in a similar manner, and with the various batteries acting together in a coordinated manner to supply aggregate power to the utility or to other entities. In such embodiments, the utility or other external entity may send synchronization and monitoring signals for use by the various systems including the batteries, and the multiple control agents associated with the various batteries may interact to exchange information and maintain at least partial coordination between the operations of the batteries. In such situations, one or more model realization systems may be used to generate models of the batteries.

It will be appreciated that the examples of FIGS. 2A-2H are provided for illustrative purposes and are simplified for the sake of brevity, and the inventive techniques may be used in a wide variety of other situations, including in other environments and with other types of automated control action determination techniques, some of which are discussed below.

Figure 3:
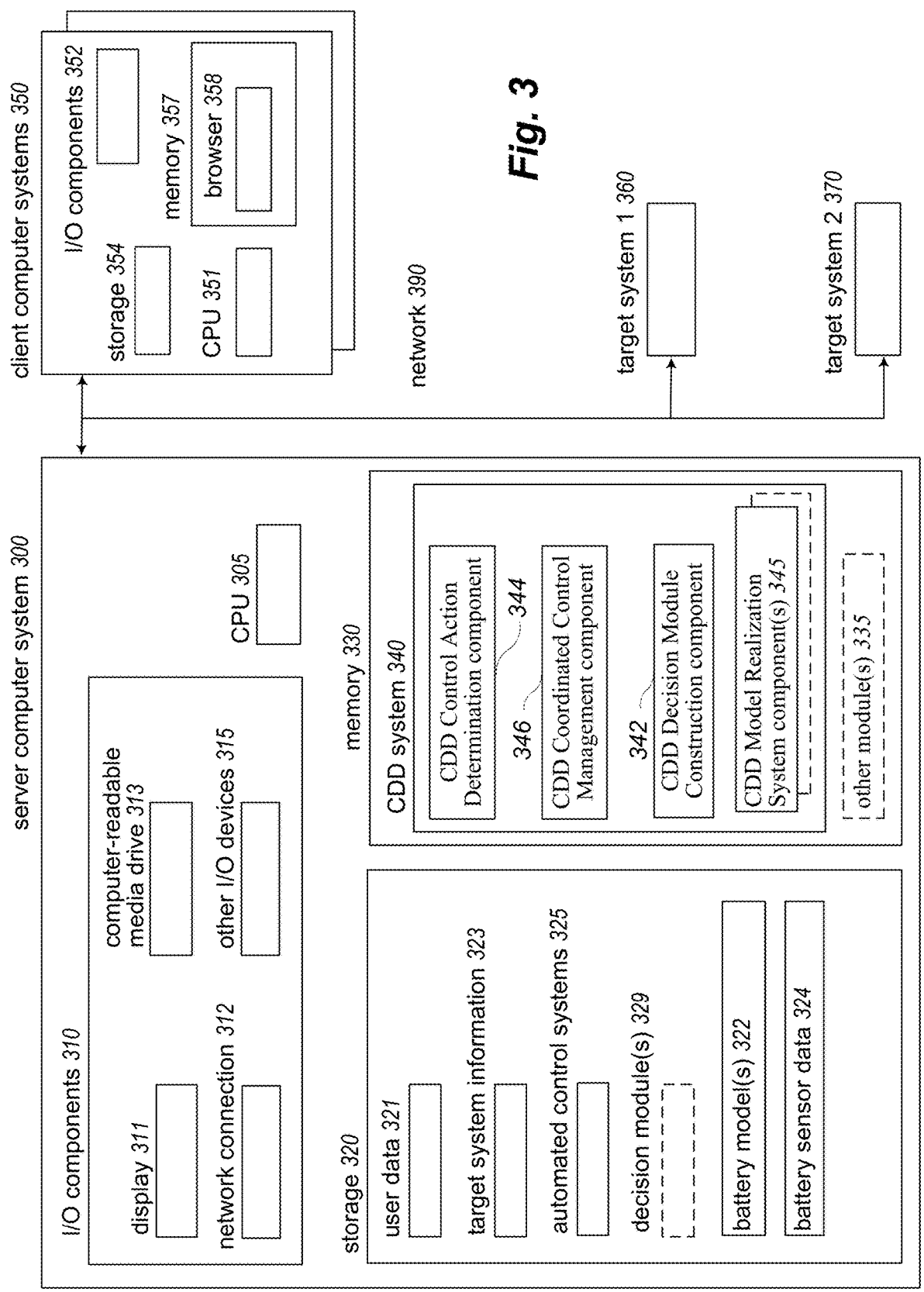
FIG. 3 is a block diagram illustrating example computing systems suitable for executing an embodiment of a system for performing cooperative distributed control of target systems in configured manners.

FIG. 3 is a block diagram illustrating example computing systems suitable for performing techniques for implementing automated control systems to control or otherwise manipulate at least some operations of specified physical systems or other target systems that include one or more batteries in configured manners based at least in part on internal battery state information generated using described techniques of a model realization system, as discussed in greater detail elsewhere herein. In particular, FIG. 3 illustrates a server computing system 300 suitable for providing at least some functionality of a CDD system including one or more model realization system components, although in other embodiments multiple computing systems may be used for the execution (e.g., to have distinct computing systems executing the CDD Decision Module Construction component for initial configuration and setup before run-time control occurs, and one or more copies of the CDD Control Action Determination component 344 and/or the CDD Coordinated Control Managements component 346 and/or CDD Model Realization System component 345 for the actual run-time control; to have one or more computing systems executing the model realization system components that are separate from one or more other computing systems executing some or all of a CDD system with which the model realization system components interact; to have different computing systems executing different model realization systems; etc.). FIG. 3 also illustrates various client computer systems 350 that may be used by customers or other users of the CDD system 340, as well as one or more target systems to be controlled (in this example, target system 1 360 and target system 2 370, which are accessible to the CDD system 340 and its model realization system components 345 over one or more computer networks 390, although in other embodiments the model realization system components and/or other CDD components may execute local to a target system that they are controlling).

In the illustrated embodiment, the one or more model realization system components 345 are executing in memory 330 as part of the CDD system 340, and in some embodiments the component(s) each includes various software instructions that when executed program one or more of the hardware CPU processors 305 to provide an embodiment of a model realization system as described elsewhere herein. During operation, in at least some embodiments, each model realization system component may obtain various input data 324 (e.g., from one or more active sensors, not shown) and modify one or more target battery state models (e.g., copies of models 322 stored on storage 320), as well as exchange various information with other executing components, as discussed in greater detail elsewhere herein.

The server computing system 300 has components in the illustrated embodiment that include one or more hardware CPU ("central processing unit") computer processors 305, various I/O ("input/output") hardware components 310, storage 320, and memory 330. The illustrated I/O components include a display 311, a network connection 312, a computer-readable media drive 313, and other I/O devices 315 (e.g., a keyboard, a mouse, speakers, etc.). In addition, the illustrated client computer systems 350 may each have components similar to those of server computing system 300, including one or more hardware CPUs 351, I/O components 352, storage 354, and memory 357, although some details are not illustrated for the computing systems 350 for the sake of brevity. The target systems 360 and 370 may also each include one or more computing systems (not shown) having components that are similar to some or all of the components illustrated with respect to server computing system 300, including to optionally locally execute one or more CDD components, but such computing systems and components are not illustrated in this example for the sake of brevity.

The CDD system 340 is executing in memory 330 and includes components 342-346, and in some embodiments the system and/or components each includes various software instructions that when executed program one or more of the CPU processors 305 to provide an embodiment of a CDD system as described elsewhere herein. The CDD system 340 may interact with computing systems 350 over the network 390 (e.g., via the Internet and/or the World Wide Web, via a private cellular network, etc.), as well as the target systems 360 and 370 in this example. In this example embodiment, the CDD system includes functionality related to generating and deploying decision modules in configured manners for customers or other users, as discussed in greater detail elsewhere herein, as well as generating or deploying model realization system components 345 at runtime to improve modeled state information of a corresponding target system. The other computing systems 350 may also be executing various software as part of interactions with the CDD system 340 and/or its components. For example, client computing systems 350 may be executing software in memory 357 to interact with CDD system 340 (e.g., as part of a Web browser, a specialized client-side application program, etc.), such as to interact with one or more interfaces (not shown) of the CDD system 340 to configure and deploy automated control systems (e.g., stored automated control systems 325 that were previously created by the CDD system 340 for use in controlling one or more physical target systems) or other decision modules 329, as well as to perform various other types of actions, as discussed in greater detail elsewhere. Various information related to the functionality of the CDD system 340 may be stored in storage 320, such as information 321 related to users of the CDD system (e.g., account information), and information 323 related to one or more target systems (e.g., systems that have batteries to be controlled).

It will be appreciated that computing systems 300 and 350 and target systems 360 and 370 are merely illustrative and are not intended to limit the scope of the present invention. The computing systems may instead each include multiple interacting computing systems or devices, and the computing systems/nodes may be connected to other devices that are not illustrated, including through one or more networks such as the Internet, via the Web, or via private networks (e.g., mobile communication networks, etc.). More generally, a computing node or other computing system or device may comprise any combination of hardware that may interact and perform the described types of functionality, including without limitation desktop or other computers, database servers, network storage devices and other network devices, PDAs, cell phones, wireless phones, pagers, electronic organizers, Internet appliances, television-based systems (e.g., using set-top boxes and/or personal/digital video recorders), and various other consumer products that include appropriate communication capabilities. In addition, the functionality provided by the illustrated CDD system 340 and its components may in some embodiments be distributed in additional components. Similarly, in some embodiments some of the functionality of the CDD system 340 and/or CDD components 342-346 may not be provided and/or other additional functionality may be available.

As part of implementing an automated control system for a particular target system, an embodiment of a Collaborative Distributed Decision (CDD) system may use the described techniques to perform various automated activities involved in constructing and implementing the automated control system, including generating one or more CDI agents (also referred to as a CDD decision module or system, or a portion of such module or system) for use as some or all of an automated control system in controlling particular target systems.

In particular, the CDD system may in some embodiments implement a Decision Module Construction component that interacts with one or more users to obtain a description of a target system, including restrictions related to the various elements of the target system, and one or more goals to be achieved during control of the target system—the Decision Module Construction component then performs various automated actions to generate, test and deploy one or more executable decision modules (also referred to at times as "decision elements" and/or "agents") to use in performing the control of the target system. When the one or more executable decision modules are deployed and executed, the CDD system may further provide various components within or external to the decision modules being executed to manage their control of the target system, such as a Control Action Determination component of each decision module as part of a control system to optimize or otherwise enhance the control actions that the decision module generates, a model realization system component to determined modeled battery information for the target system, and/or one or more Coordinated Control Management components to coordinate the control actions of multiple decision modules that are collectively performing the control of the target system.

As noted above, a Collaborative Distributed Decision (CDD) system may in some embodiments use at least some of the described techniques to perform various automated activities involved in constructing and implementing an automated control system for a specified target system, such as to modify or otherwise manipulate inputs or other control elements of the target system that affect its operation (e.g., affect one or more outputs of the target system). An automated control system for such a target system may in some situations have a distributed architecture that provides cooperative distributed control of the target system, such as with multiple decision modules that each control a portion of the target system and that operate in a partially decoupled manner with respect to each other. If so, the various decision modules' operations for the automated control system may be at least partially synchronized, such as by each reaching a consensus with one or more other decision modules at one or more times, even if a fully synchronized convergence of all decision modules at all times is not guaranteed or achieved.

The CDD system may in some embodiments implement a Decision Module Construction component that interacts with one or more users to obtain a description of a target system, including restrictions related to the various elements of the target system, and one or more goals to be achieved during control of the target system—the Decision Module Construction component then performs various automated actions to generate, test and deploy one or more executable decision modules to use in performing the control of the target system. The Decision Module Construction component may thus operate as part of a configuration or setup phase that occurs before a later run-time phase in which the generated decision modules are executed to perform control of the target system, although in some embodiments and situations the Decision Module Construction component may be further used after an initial deployment to improve or extend or otherwise modify an automated control system that has one or more decision modules (e.g., while the automated control system continues to be used to control the target system), such as to add, remove or modify decision modules for the automated control system.

In some embodiments, some or all automated control systems that are generated and deployed may further provide various components within them for execution during the runtime operation of the automated control system, such as by including such components within decision modules in some embodiments and situations. Such components may include, for example, a Control Action Determination component of each decision module (or of some decision modules) to optimize or otherwise determine and improve the control actions that the decision module generates, and/or a model realization system component of each decision module (or of some decision modules) to determine modeled battery information for the target system. For example, such a Control Action Determination component in a decision module may in some embodiments attempt to automatically determine the decision module's control actions for a particular time to reflect a near-optimal solution with respect to or one more goals and in light of a model of the decision module for the target system that has multiple inter-related constraints and based on current state information that is modeled for the target system—if so, such a near-optimal solution may be based at least in part on a partially optimized solution that is within a threshold amount of a fully optimized solution. Such determination of one or more control actions to perform may occur for a particular time and for each of one or more decision modules, as well as be repeated over multiple times for ongoing control by at least some decision modules in some situations. In some embodiments, the model for a decision module is implemented as a Hamiltonian function that reflects a set of coupled differential equations based in part on constraints representing at least part of the target system, such as to allow the model and its Hamiltonian function implementation to be updated over multiple time periods by adding additional expressions within the evolving Hamiltonian function, as discussed in greater detail elsewhere herein.

In some embodiments, the components included within a generated and deployed automated control system for execution during the automated control system's runtime operation may further include one or more Coordinated Control Management components to coordinate the control actions of multiple decision modules that are collectively performing the control of a target system for the automated control system. For example, some or all decision modules may each include such a Coordinated Control Management component in some embodiments to attempt to synchronize that decision module's local solutions and proposed control actions with those of one or more other decision modules in the automated control system, such as by determining a consensus shared model with those other decision modules that simultaneously provides solutions from the decision module's local model and the models of the one or more other decision modules. Such inter-module synchronizations may occur repeatedly to determine one or more control actions for each decision module at a particular time, as well as to be repeated over multiple times for ongoing control. In addition, each decision module's model is implemented in some embodiments as a Hamiltonian function that reflects a set of coupled differential equations based in part on constraints representing at least part of the target system, such as to allow each decision module's model and its Hamiltonian function implementation to be combined with the models of one or more other decision modules by adding additional expressions for those other decision modules' models within the initial Hamiltonian function for the local model of the decision module, as discussed in greater detail elsewhere herein.

It will also be appreciated that, while various items are illustrated as being stored in memory or on storage while being used, these items or portions of them may be transferred between memory and other storage devices for purposes of memory management and data integrity. Alternatively, in other embodiments some or all of the software modules and/or systems may execute in memory on another device and communicate with the illustrated computing systems via inter-computer communication. Thus, in some embodiments, some or all of the described techniques may be performed by hardware means that include one or more processors and/or memory and/or storage when configured by one or more software programs (e.g., by the model realization system components 345 and/or other of the CDD components 342-346, or more generally by the CDD system 340) and/or data structures, such as by execution of software instructions of the one or more software programs and/or by storage of such software instructions and/or data structures. Furthermore, in some embodiments, some or all of the systems and/or components may be implemented or provided in other manners, such as by using means that are implemented at least partially or completely in firmware and/or hardware, including, but not limited to, one or more application-specific integrated circuits (ASICs), standard integrated circuits, controllers (e.g., by executing appropriate instructions, and including microcontrollers and/or embedded controllers), field-programmable gate arrays (FPGAs), complex programmable logic devices (CPLDs), etc. Some or all of the components, systems and data structures may also be stored (e.g., as software instructions or structured data) on a non-transitory computer-readable storage medium, such as a hard disk or flash drive or other non-volatile storage device, volatile or non-volatile memory (e.g., RAM), a network storage device, or a portable media article to be read by an appropriate drive (e.g., a DVD disk, a CD disk, an optical disk, etc.) or via an appropriate connection. The systems, components and data structures may also in some embodiments be transmitted as generated data signals (e.g., as part of a carrier wave or other analog or digital propagated signal) on a variety of computer-readable transmission mediums, including wireless-based and wired/cable-based mediums, and may take a variety of forms (e.g., as part of a single or multiplexed analog signal, or as multiple discrete digital packets or frames). Such computer program products may also take other forms in other embodiments. Accordingly, the present invention may be practiced with other computer system configurations.

Figure 4:
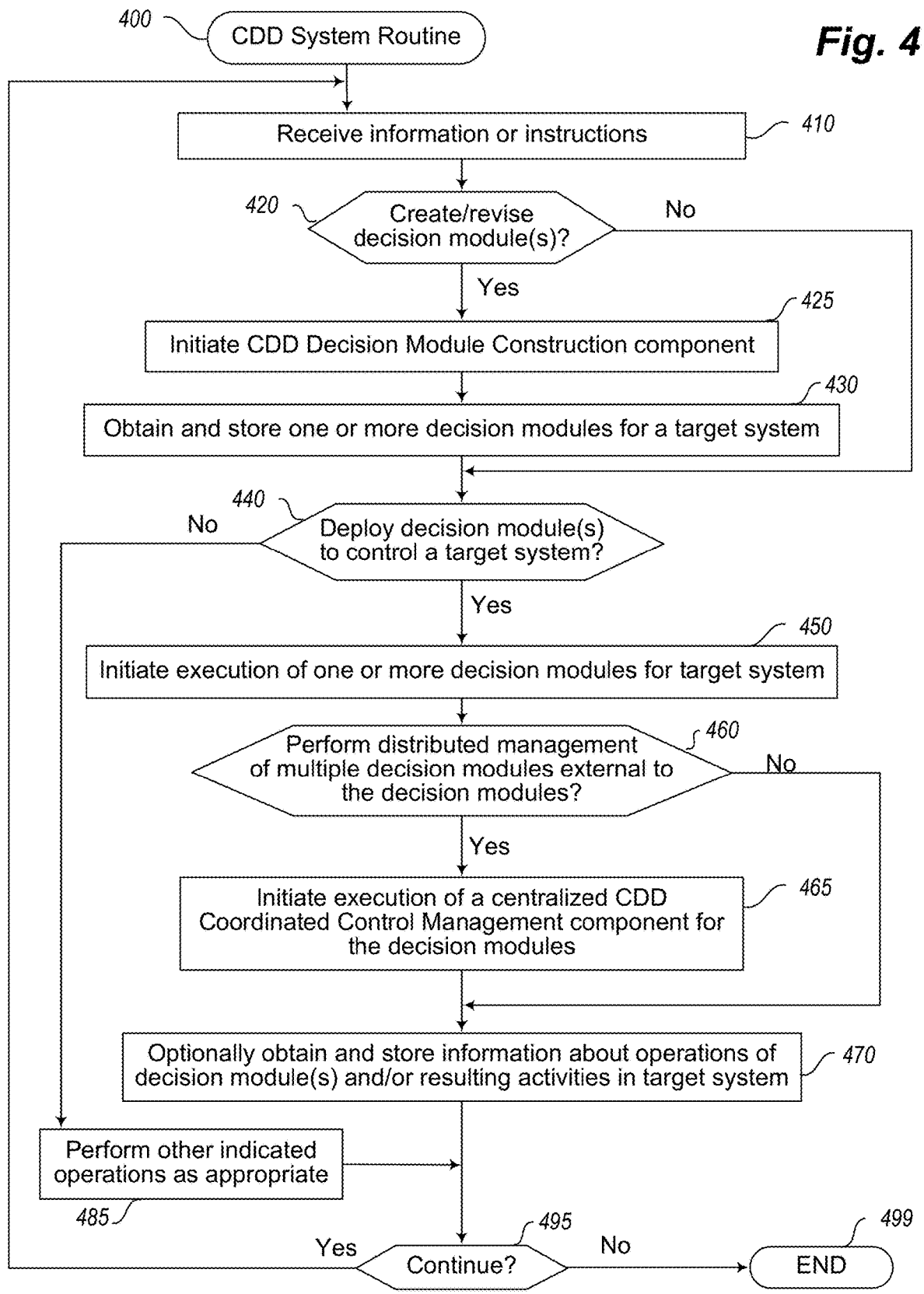
FIG. 4 illustrates a flow diagram of an example embodiment of a Collaborative Distributed Decision (CDD) System routine.

FIG. 4 is a flow diagram of an example embodiment of a Collaborative Distributed Decision (CDD) system routine 400. The routine may, for example, be provided by execution of the CDD system 340 of FIG. 3 and/or the CDD system 140 of FIG. 1B, such as to provide functionality to construct and implement automated control systems for specified target systems. In the example following flow charts, a model realization system component is discussed as being included in and deployed with a decision module, such that deployment of a decision module may include deploying its model realization system (e.g., to optionally execute before other components of the decision module), although in other embodiments a model realization system may be deployed separately from any decision modules.

The illustrated embodiment of the routine begins at block 410, where information or instructions are received. If it is determined in block 420 that the information or instructions of block 410 include an indication to create or revise one or more decision modules for use as part of an automated control system for a particular target system, the routine continues to block 425 to initiate execution of a Decision Module Construction component, and in block 430 obtains and stores one or more resulting decision modules for the target system that are created in block 425. One example of a routine for such a Decision Module Construction component is discussed in greater detail with respect to FIGS. 5A-5B.

After block 430, or if it is instead determined in block 420 that the information or instructions received in block 410 are not to create or revise one or more decision modules, the routine continues to block 440 to determine whether the information or instructions received in block 410 indicate to deploy one or more created decision modules to control a specified target system, such as for one or more decision modules that are some or all of an automated control system for that target system. The one or more decision modules to deploy may have been created immediately prior with respect to block 425, such that the deployment occurs in a manner that is substantially simultaneous with the creation, or in other situations may include one or more decision modules that were created at a previous time and stored for later use. If it is determined to deploy one or more such decision modules for such a target system, the routine continues to block 450 to initiate the execution of those one or more decision modules for that target system, such as on one or more computing systems local to an environment of the target system, or instead on one or more remote computing systems that communicate with the target system over one or more intermediary computer networks (e.g., one or more computing systems under control of a provider of the CDD system).

After block 450, the routine continues to block 460 to determine whether to perform distributed management of multiple decision modules being deployed in a manner external to those decision modules, such as via one or more centralized Coordinated Control Management components. If so, the routine continues to block 465 to initiate execution of one or more such centralized CDD Coordinated Control Management components for use with those decision modules. After block 465, or if it is instead determined in block 460 to not perform such distributed management in an external manner (e.g., if only one decision module is executed, if multiple decision modules are executed but coordinate their operations in a distributed peer-to-peer manner via local CDD Coordinated Control Management components, etc.), the routine continues to block 470 to optionally obtain and store information about the operations of the one or more decision modules and/or resulting activities that occur in the target system, such as for later analysis and/or reporting.

If it is instead determined in block 440 that the information or instructions received in block 410 are not to deploy one or more decision modules, the routine continues instead to block 485 to perform one or more other indicated operations if appropriate. For example, such other authorized operations may include obtaining results information about the operation of a target system in other manners (e.g., by monitoring outputs or other state information for the target system), analyzing results of operations of decision modules and/or activities of corresponding target systems, generating reports or otherwise providing information to users regarding such operations and/or activities, etc. In addition, in some embodiments the analysis of activities of a particular target system over time may allow patterns to be identified in operation of the target system, such as to allow a model of that target system to be modified accordingly (whether manually or in an automated learning manner) to reflect those patterns and to respond based on them. In addition, as discussed in greater detail elsewhere, distributed operation of multiple decision modules for an automated control system in a partially decoupled manner allows various changes to be made while the automated control system is in operation, such as to add one or more new decision modules, to remove one or more existing decision modules, to modify the operation of a particular decision module (e.g., by changing rules or other information describing the target system that is part of a model for the decision module), etc. In addition, the partially decoupled nature of multiple such decision modules in an automated control system allows one or more such decision modules to operate individually at times, such as if network communication issues or other problems prevent communication between multiple decision modules that would otherwise allow their individualized control actions to be coordinated—in such situations, some or all such decision modules may continue to operate in an individualized manner, such as to provide useful ongoing control operations for a target system even if optimal or near-optimal solutions cannot be identified from coordination and synchronization between a group of multiple decision modules that collectively provide the automated control system for the target system.

After blocks 470 or 485, the routine continues to block 495 to determine whether to continue, such as until an explicit indication to terminate is received. If it is determined to continue, the routine returns to block 410, and otherwise continues to block 499 and ends.

Figure 5A:
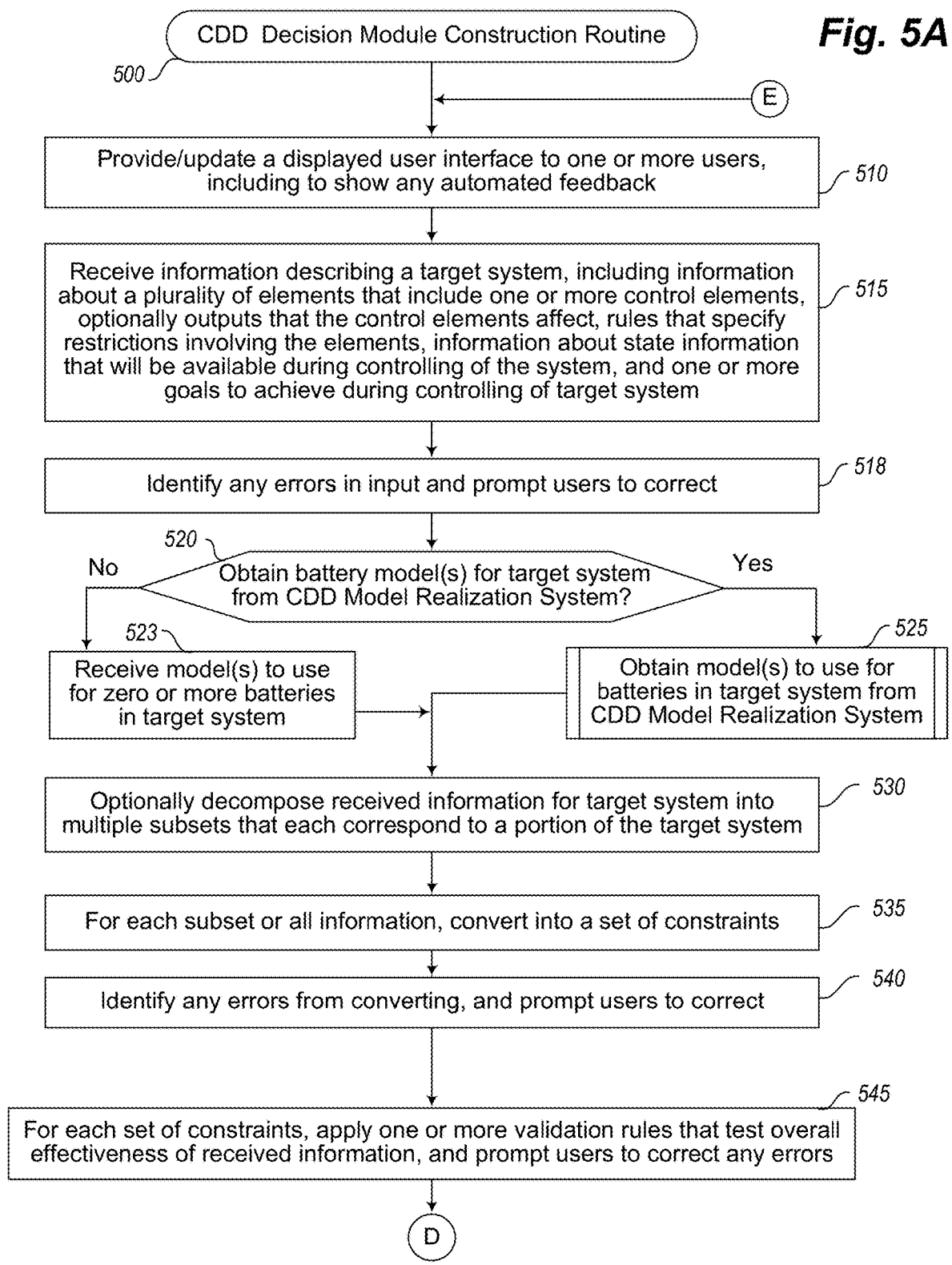
FIGS. 5A-5B illustrate a flow diagram of an example embodiment of a CDD Decision Module Construction routine.
Figure 5B:
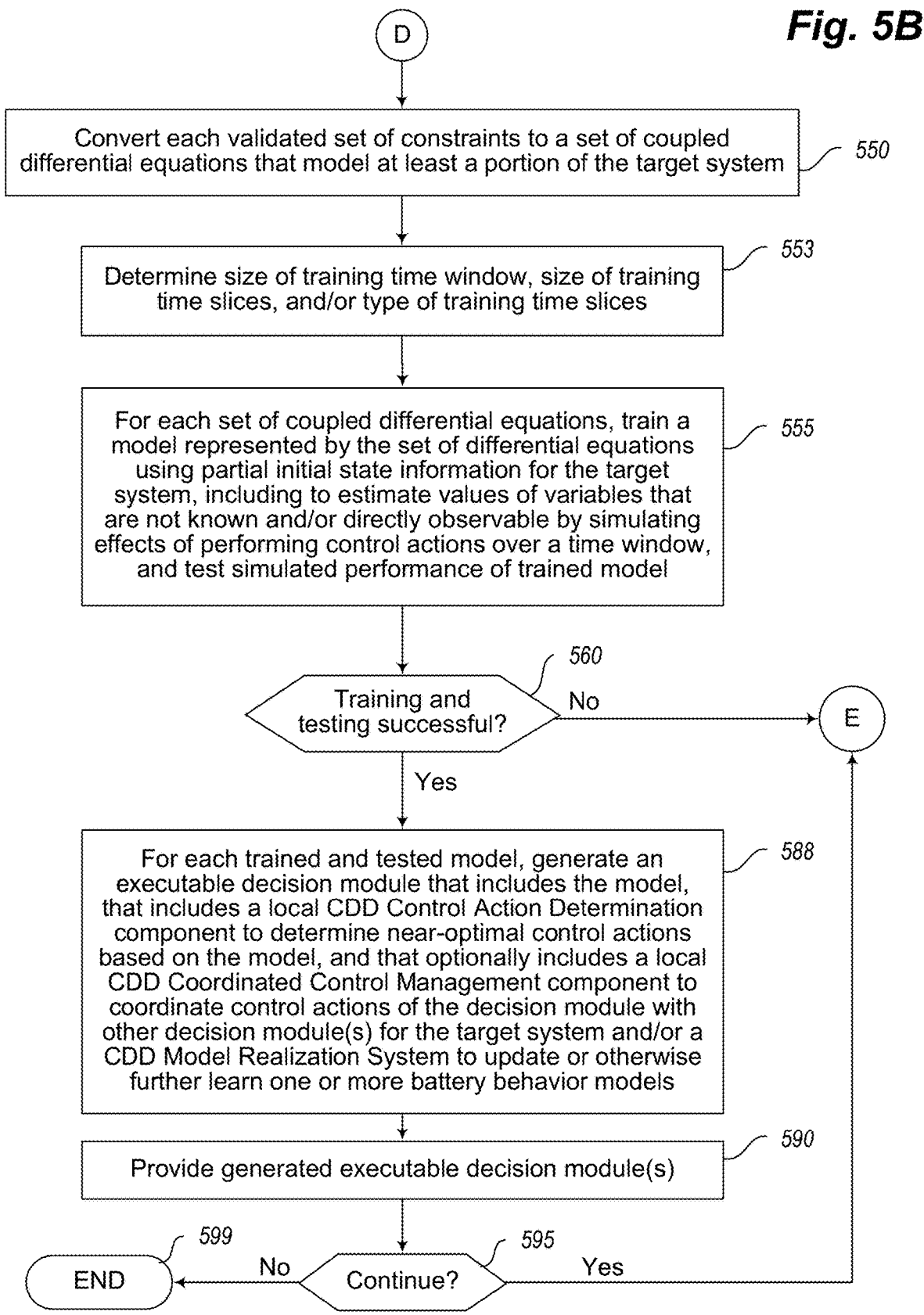

FIGS. 5A-5B illustrate a flow diagram of an example embodiment of a CDD Decision Module Construction routine 500. The routine may, for example, be provided by execution of the component 342 of FIG. 3 and/or the component 142 of FIG. 1B, such as to provide functionality to allow users to provide information describing a target system of interest, and to perform corresponding automated operations to construct one or more decision modules to use to control the target system in specified manners. While the illustrated embodiment of the routine interacts with users in particular manners, such as via a displayed GUI (graphical user interface), it will be appreciated that other embodiments of the routine may interact with users in other manners, such as via a defined API (application programming interface) that an executing program invokes on behalf of a user. In some embodiments, the routine may further be implemented as part of an integrated development environment or other software tool that is available for one or more users to use, such as by implementing an online interface that is available to a variety of remote users over a public network such as the Internet, while in other embodiments a copy of the CDD system and/or particular CDD components may be used to support a single organization or other group of one or more users, such as by being executed on computing systems under the control of the organization or group. In addition, the CDD Decision Module Construction component may in some embodiments and situations be separated into multiple sub-components, such as a rules editor component that users interact with to specify rules and other description information for a target system, and a rules compiler engine that processes the user-specified rules and other information to create one or more corresponding decision modules.

The illustrated embodiment of the routine 500 begins at block 510, where the routine provides or updates a displayed user interface to one or more users, such as via a request received at an online version of component that is implementing the routine, or instead based on the routine being executed by one or more such users on computing systems that they control. While various operations are shown in the illustrated embodiment of the routine as occurring in a serial manner for the purpose of illustration, it will be appreciated that user interactions with such a user interface may occur in an iterative manner and/or over multiple periods of time and/or user sessions, including to update a user interface previously displayed to a user in various manners (e.g., to reflect a user action, to reflect user feedback generated by operation of the routine or from another component, etc.), as discussed further below.

After block 510, the routine continues to block 515 to receive information from one or more such users describing a target system to be controlled, including information about a plurality of elements of the target system that include one or more manipulatable control elements and optionally one or more outputs that the control elements affect, information about rules that specify restrictions involving the elements, information about state information that will be available during controlling of the system (e.g., values of particular elements or other state variables, such as from passive sensors), and one or more goals to achieve during the controlling of the target system. It will be appreciated that such information may be obtained over a period of time from one or more users, including in some embodiments for a first group of one or more users to supply some information related to a target system and for one or more other second groups of users to independently provide other information about the target system, such as to reflect different areas of expertise of the different users and/or different parts of the target system. After block 515, the routine continues to block 518 to identify any errors that have been received in the user input, and to prompt the user(s) to correct those errors, such as by updating the display in a corresponding manner as discussed with respect to block 510. While the identification of such errors is illustrated as occurring after the receiving of the information in block 515, it will be appreciated that some or all such errors may instead be identified as the users are inputting information into the user interface, such as to identify syntax errors in rules or other information that the users specify.

After block 518, the routine continues to block 520 to determine whether, if there are one or more batteries in the target system, to obtain one or more models for the one or more batteries from the CDD Model Realization System, and if so continues to block 525 to obtain the model(s). One example embodiment of a routine for implementing operations of the CDD Model Realization System is further illustrated with respect to FIG. 9, and the obtaining of any battery models may include retrieving previously determined models (e.g., for a type of battery, for a particular battery, etc.) and/or dynamically generating any such models. If it is instead determined in block 520 to not obtain any such battery models from the CDD Model Realization System, the routine continues instead to block 523 to, if the target system includes one or more batteries, receive one or more corresponding models, such as via the user interface for one or more previously generated models. After blocks 523 or 525, the illustrated embodiment of the routine continues to block 530 to optionally decompose the information about the target system into multiple subsets that each correspond to a portion of the target system, such as with each subset having one or more different control elements that are manipulatable by the automated control system being created by the routine, and optionally have overlapping or completely distinct goals and/or sets of rules and other information describing the respective portions of the target system. As discussed in greater detail elsewhere, such decomposition, if performed, may in some situations be performed manually by the users indicating different sub-groups of information that they enter, and/or in an automated manner by the routine based on an analysis of the information that has been specified (e.g., based on the size of rules and other descriptive information supplied for a target system, based on inter-relationships between different rules or goals or other information, etc.). In other embodiments, no such decomposition may be performed.

After block 530, the routine continues to block 535 to, for each subset of target system description information (or for all the received information if no such subsets are identified), convert that subset (or all the information) into a set of constraints that encapsulate the restrictions, goals, and other specified information for that subset (or for all the information). In block 540, the routine then identifies any errors that occur from the converting process, and if any are identified, may prompt the user to correct those errors, such as in a manner similar to that described with respect to blocks 518 and 510. While not illustrated in this example, the routine may in some situations in blocks 518 and/or 540 return to block 510 when such errors are identified, to display corresponding feedback to the user(s) and to allow the user(s) to make corrections and re-perform following operations such as those of blocks 515-540. The errors identified in the converting process in block 540 may include, for example, errors related to inconsistent restrictions, such as if the restrictions as a group are impossible to satisfy.

After block 540, the routine continues to block 545 to, for each set of constraints (or a single constraint set if no subsets were identified in block 530), apply one or more validation rules to the set of constraints to test overall effectiveness of the corresponding information that the constraints represent, and to prompt the one or more users to correct any errors that are identified in a manner similar to that with respect to blocks 518, 540 and 510. Such validation rules may test one or more of controllability, observability, stability, and goal completeness, as well as any user-added validation rules, as discussed in greater detail elsewhere. In block 550, the routine then converts each validated set of constraints to a set of coupled differential equations that model at least a portion of the target system to which the underlying information corresponds.

After block 550, the routine continues to block 553 to perform activities related to training a model for each set of coupled differential equations, including to determine one or more of a size of a training time window to use, size of multiple training time slices within the time window, and/or a type of training time slice within the time window. In some embodiments and situations, the determination of one or more such sizes or types of information is performed by using default or pre-specified information, while in other embodiments and situations the users may specify such information, or an automated determination of such information may be performed in one or more manners (e.g., by testing different sizes and evaluating results to find sizes with the best performance). Different types of time slices may include, for example, successions of time slices that overlap or do not overlap, such that the training for a second time slice may be dependent only on results of a first time slice (if they do not overlap) or instead may be based at least in part on updating information already determined for at least some of the first time slice (if they do overlap in part or in whole). After block 553, the routine continues to block 555 to, for each set of coupled differential equations representing a model, train the model for that set of coupled differential equations using partial initial state information determined externally for the target system (e.g., from passive sensors), including to estimate values of variable that are not known and/or directly observable for the target system by simulating effects of performing control actions over the time window, such as for successive time slices throughout the time window, and to test the simulated performance of the trained model. Additional details related to training and testing are included elsewhere herein.

After block 555, the routine continues to block 560 to determine whether the training and testing was successful, and if not returns to block 510 to display corresponding feedback information to the users to allow them to correct errors that caused the lack of success. If it is instead determined in block 560 that the testing and training were successful, however, or after block 583 with a model updated with one or more learned soft rules, the routine continues instead to block 588 to generate an executable decision module for each trained and tested model that includes that model, as well as a local CCD Control Action Determination component that the decision module will use when executed to determine optimal or near-optimal control actions to perform for the target system based on the information included in the model and in light of the one or more goals for that decision module, and that includes or uses at least one CCD Model Realization System component generated in block 542. The generated executable decision module may in some embodiments and situations further include a local CCD Coordinated Control Management component to coordinate control actions of multiple decision modules that collectively will provide an automated control system for the target system, such as by synchronizing respective models of the various decision modules over time. In addition, the generated executable decision module may in some embodiments and situations further include a local CCD Model Realization System component to use to generate one or more battery models during execution of the decision module, such as to update a battery model that was present in the decision module at the time execution began, to create a new battery model for one or more batteries added to the target system while the decision module is operating (e.g., to replace or supplement one or more batteries present when the decision module began operating), etc. After block 588, the routine continues to block 590 to provide the generated executable decision modules for use, including to optionally store them for later execution and/or deployment.

It if was determined in block 505 to use a model realization system, the routine continues to block 565, where the model realization system is used to determine and generate a battery behavior model for each of one or more batteries in the target system, as discussed in greater detail elsewhere herein. The routine then continues to block 583 to store and/or provide information about the determined battery behavior model(s), such as for use in further decision module construction with respect to blocks 510-560 and 588, before continuing to block 505.

After block 590, the routine continues to block 595 to determine whether to continue, such as until an explicit indication to terminate is received. If it is determined to continue, the routine returns to block 510, and otherwise continues to block 599 and ends.

Figure 6A:
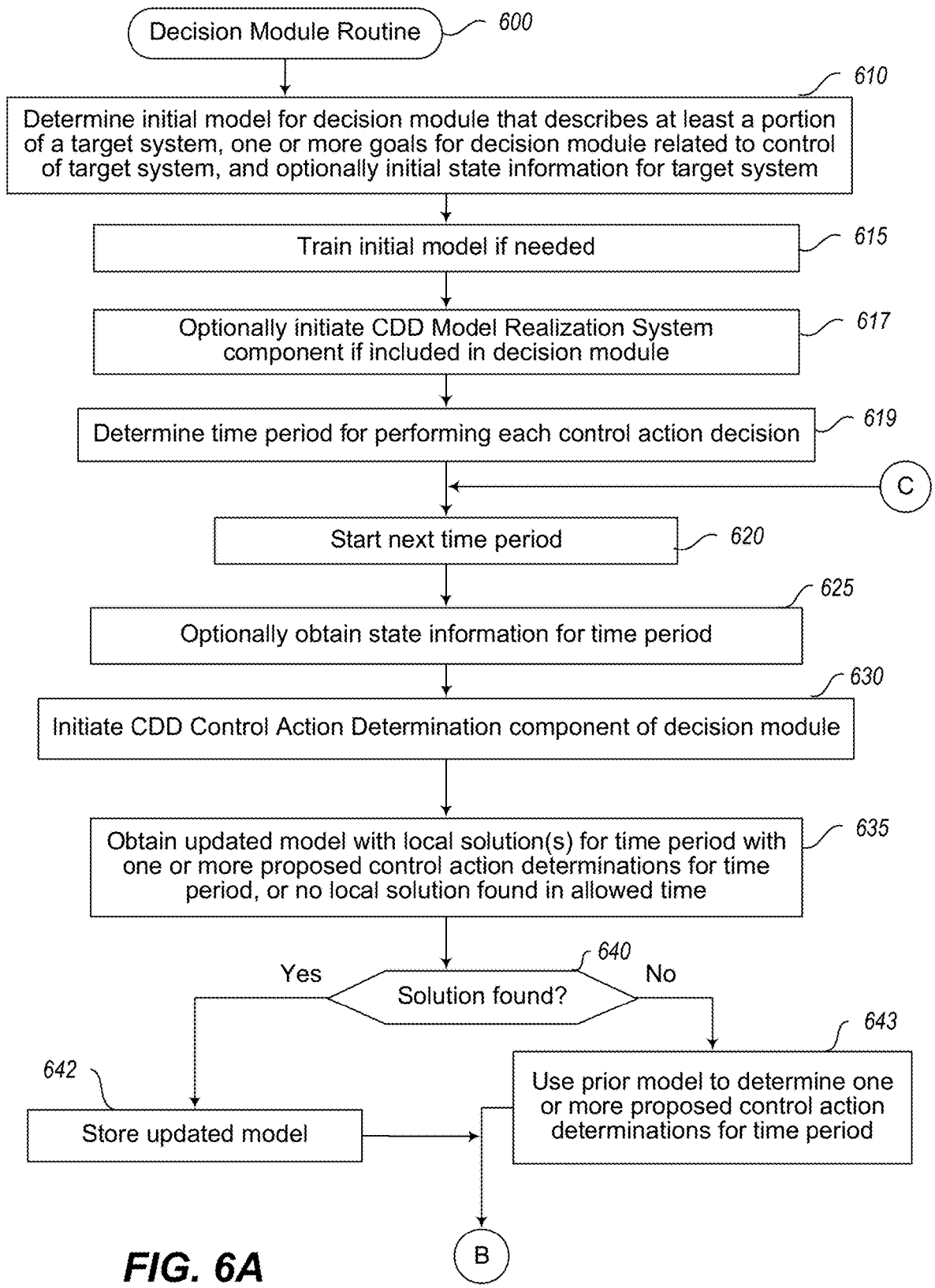
FIGS. 6A-6B illustrate a flow diagram of an example embodiment of a decision module routine.
Figure 6B:
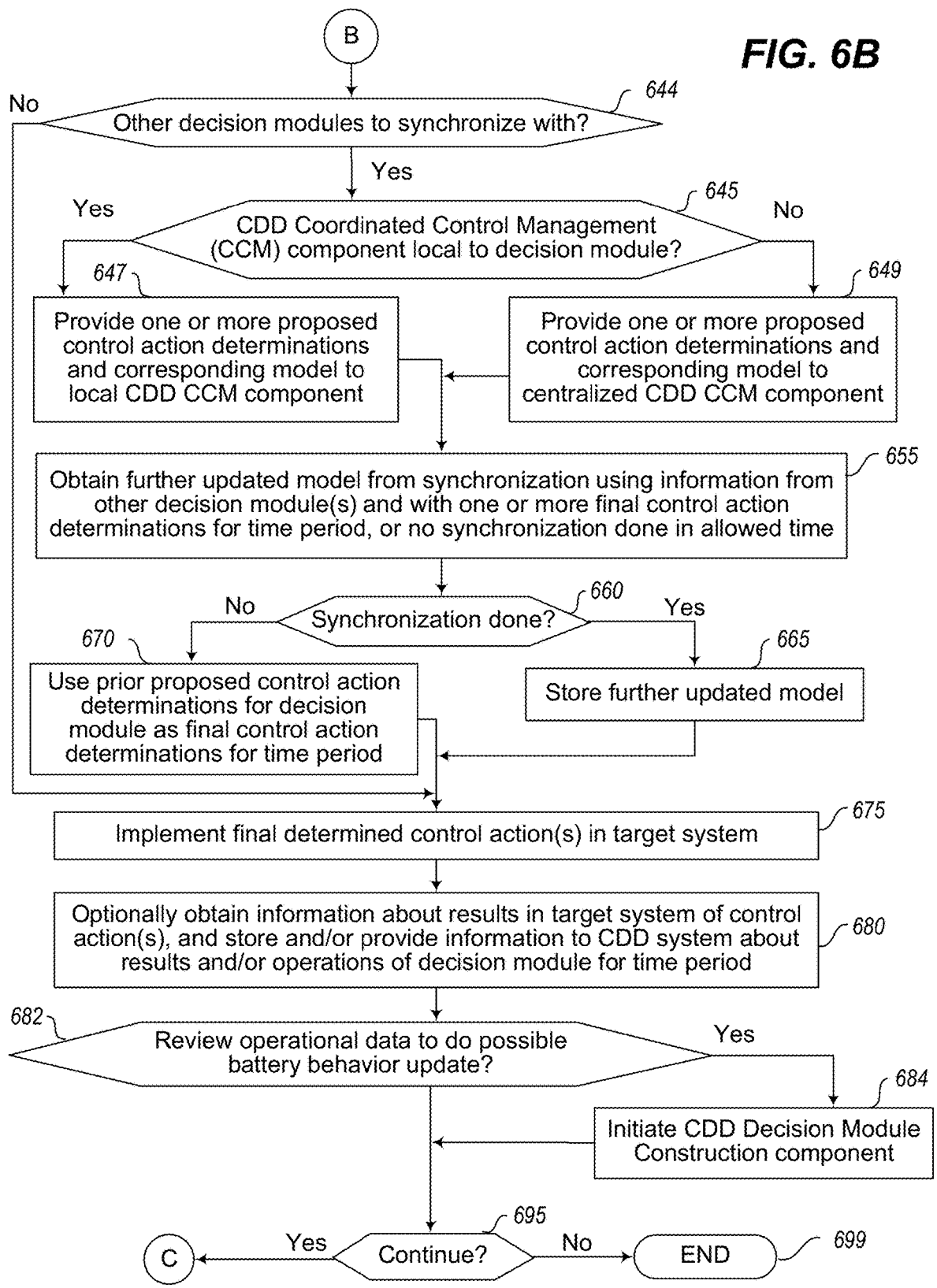

FIGS. 6A-6B illustrate a flow diagram of an example embodiment of a routine 600 corresponding to a generic representation of a decision module that is being executed. The routine may, for example, be provided by execution of a decision module 329 or as part of an automated control system 325 of FIG. 3, the automated control system 195a of FIG. 1A, the automated control system 205a of FIG. 2A, and/or a decision module 124 or 128 of FIG. 1B or 1C, such as to provide functionality for controlling at least a portion of a target system in a manner specific to information and a model encoded for the decision module, including to reflect one or more goals to be achieved by the decision module during its controlling activities. As discussed in greater detail elsewhere, in some embodiments and situations, multiple decision modules may collectively and cooperatively act to control a particular target system, such as with each decision module controlling one or more distinct control elements for the target system or otherwise representing or interacting with a portion of the target system, while in other embodiments and situations a single decision module may act alone to control a target system. The routine 600 further reflects actions performed by a particular example decision module when it is deployed in controlling a portion of a target system, although execution of at least portions of a decision module may occur at other times, such as initially to train a model for the decision module before the decision module is deployed, as discussed in greater detail with respect to the CDD Decision Module Construction routine 500 of FIGS. 5A-5B. In addition, the illustrated embodiment of the routine assumes that any battery behavior models were previously created by the CDD Decision Module Construction routine 500 of FIGS. 5A-5B before the decision module begins, although in other embodiments could instead, before performing other indicated operations, execute a model realization system of the decision module to generate and incorporate such battery behavior models.

The illustrated embodiment of the routine 600 begins at block 610, where an initial model for the decision module is determined that describes at least a portion of a target system to be controlled, one or more goals for the decision module to attempt to achieve related to control of the target system, and optionally initial state information for the target system. The routine continues to block 615 to perform one or more actions to train the initial model if needed, as discussed in greater detail with respect to blocks 553 and 555 of FIGS. 5A-5B—in some embodiments and situations, such training for block 615 is performed only if initial training is not done by the routine 500 of FIGS. 5A-5B, while in other embodiments and situations the training of block 615 is performed to capture information about a current state of the target system at a time that the decision module begins to execute (e.g., if not immediately deployed after initial creation and training) and/or to re-train the model at times as discussed in greater detail with respect to routine 700 of FIGS. 7A-7B as initiated by block 630.

Figure 9:
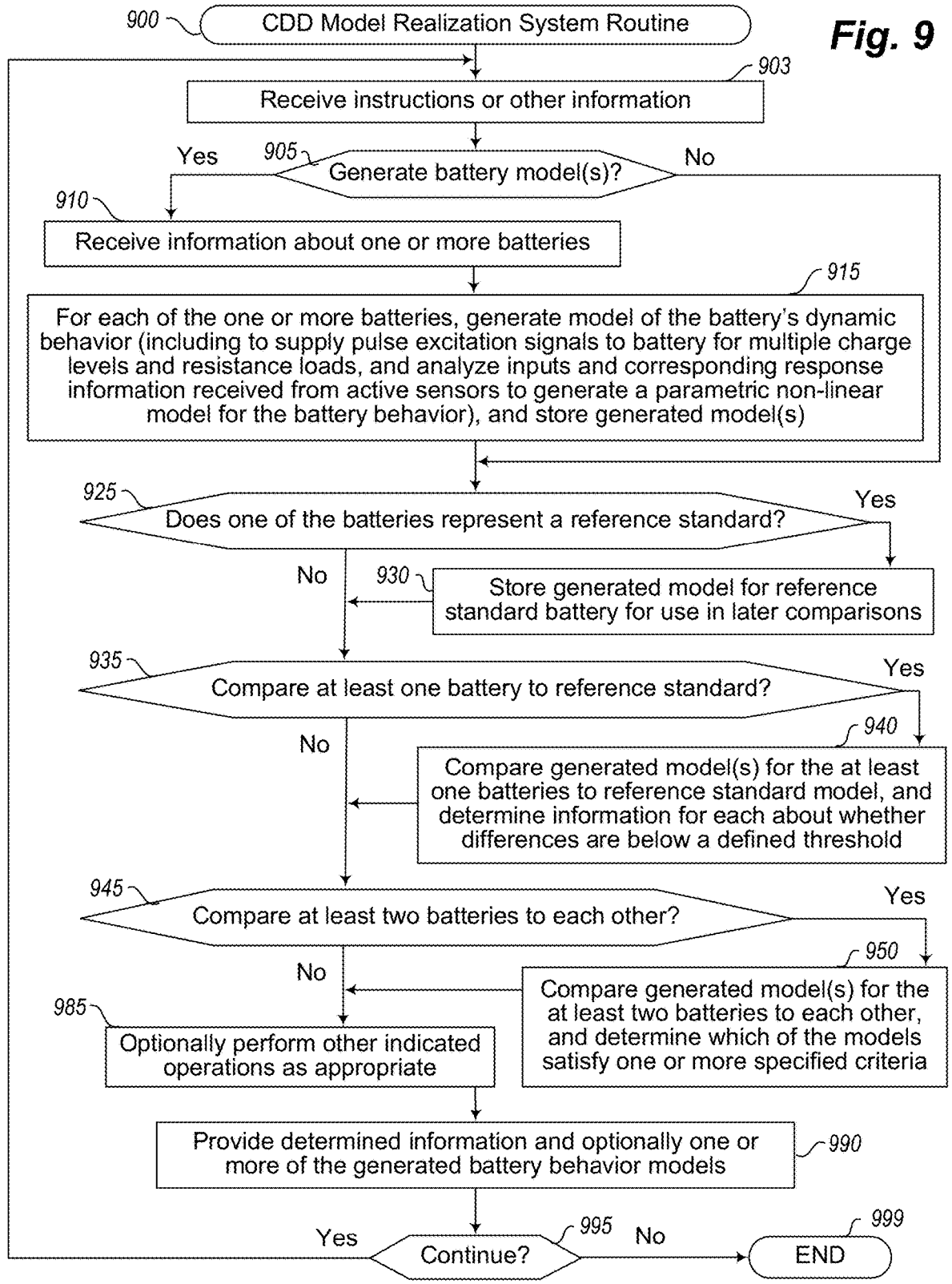
FIG. 9 illustrates a flow diagram of an example embodiment of a CDD Model Realization System routine.

After block 615, the routine continues to block 617 to optionally initiate execution of a CDD Model Realization System component if one is included with the decision module. One example of execution of such a CDD Model Realization System is illustrated in FIG. 9.

After block 617, the routine continues to block 619 to determine a time period to use for performing each control action decision for the decision module, such as to reflect a rate at which control element modifications in the target system are needed and/or to reflect a rate at which new incoming state information is received that may alter future manipulations of the control elements. The routine then continues to block 620 to start the next time period, beginning with a first time period moving forward from the startup of the execution of the decision module. Blocks 620-680 are then performed in a control loop for each such time period going forward until execution of the decision module is suspended or terminated, although in other embodiments a particular decision module may execute for only a single time period each time that it is executed.

In block 625, the routine optionally obtains state information for the time period, such as current state information that has been received from the target system (e.g., via one or more passive sensors) or one or more related external sources since the last time period began, and/or by actively retrieving current values of one or more elements of the target system or corresponding variables as needed. In block 630, the routine then initiates execution of a local CCD Control Action Determination component of the decision module, with one example of such a routine discussed in greater detail with respect to routine 700 of FIGS. 7A-7B. In block 635, the results of the execution of the component in block 630 are received, including to either obtain an updated model for the decision module with a local solution for the current time period and decision module that includes one or more proposed control action determinations that the decision module may perform for the current time period, or to receive an indication that no local solution was found for the decision module in the allowed time for the execution of the component in block 630. It is then determined in block 640 whether a solution was found, and if so continues to block 642 to store the updated model for the decision module, and otherwise continues to block 643 to use the prior model for the decision module to determine one or more control action determinations that are proposed for the current time period based on a previous model (e.g., that does not reflect recent changes in state information and/or recent changes in activities of other decision modules, if any), as discussed in greater detail with respect to routine 700 of FIGS. 7A-7B.

After blocks 642 or 643, the routine continues to block 644 to determine if other decision modules are collectively controlling portions of the current target system, such as part of the same automated control system as the local decision module, and if so continues to block 645. Otherwise, the routine selects the local proposed control actions of the decision module as a final determined control action to perform, and continues to block 675 to implement those control actions for the current time period.

If there are other operating decision modules, the routine in block 645 determines if the local decision module includes a local copy of a CDD Coordinated Control Management (CCM) component for use in synchronizing the proposed control action determinations for the decision module's local solutions with activities of other decision modules that are collectively controlling the same target system. If so, the routine continues to block 647 to provide the one or more proposed control action determinations of the decision module and the corresponding current local model for the decision module to the local CDD CCM component, and otherwise continues to block 649 to provide the one or more proposed control action determinations for the decision module and the corresponding local model of the decision module to one or more centralized CDD CCM components.

After blocks 647 or 649, the routine continues to block 655 to obtain results of the actions of the CDD CCM component(s) in blocks 647 or 649, including to either obtain a further updated model resulting from synchronization of the local model for the current decision module with information from one or more other decision modules, such that the further updated model indicates one or more final control action determinations to perform for the time period for the current decision module, or an indication that no such synchronization was completed in the allowed time. The routine continues to block 660 to determine whether the synchronization was completed, and if so continues to block 665 to store the further updated model from the synchronization, and otherwise continues to block 670 to use the prior proposed control action determinations locally to the decision module as the final control action determinations for the time period.

After blocks 665 or 670, the routine continues to block 675 to implement the one or more final determined control actions for the decision module in the target system, such as by interacting with one or more effectuators in the target system that modify values or otherwise manipulate one or more control elements of the target system, or by otherwise providing input to the target system to cause such modifications or other manipulations to occur. In block 680, the routine optionally obtains information about the results in the target system of the control actions performed, and stores and/or provides information to the CDD system about such obtained results and/or about the activities of the decision module for the current time period. After block 680, the routine continues to block 682 to determine whether to do a possible update of a behavior model for a battery by the model realization system, such as periodically or as otherwise determined. If so, the routine continues to block 684 to initiate operations of the CDD Decision Module Construction component with respect to the model realization system component in blocks 565-583, such as to return with an updated version of the model and/or a corresponding decision module.

After block 684, or if it was determined in block 682 to not do a possible structural model adaptation update based on learned soft rules, the routine continues to block 695 to determine whether to continue, such as until an indication to terminate or suspend is received (e.g., to reflect an end to current operation of the target system or an end of use of the decision module to control at least a portion of the target system). If it is determined to continue, the routine returns to block 620 to start the next time period, and otherwise continues to block 699 and ends.

Figure 7A:
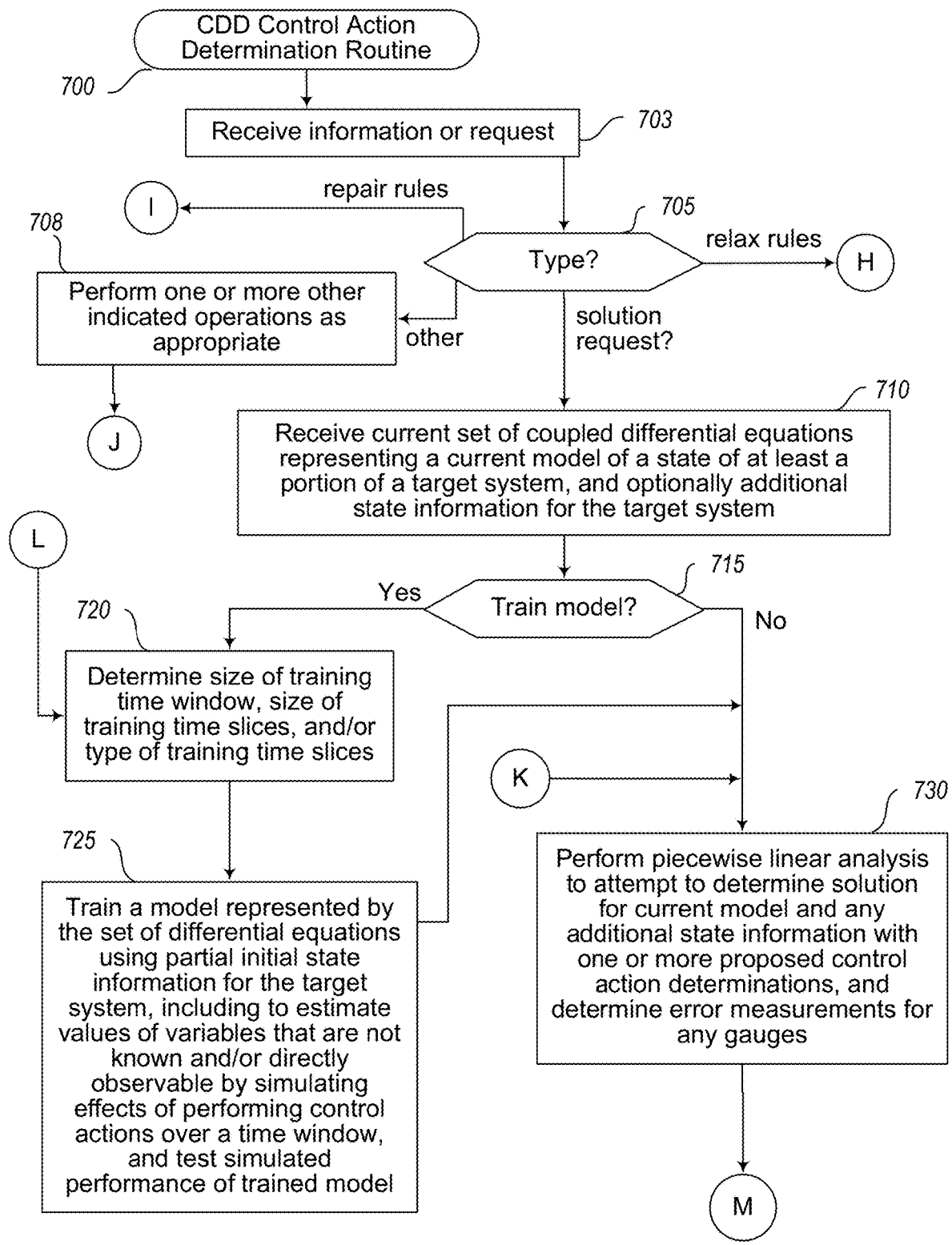
FIGS. 7A-7B illustrate a flow diagram of an example embodiment of a CDD Control Action Determination routine.
Figure 7B:
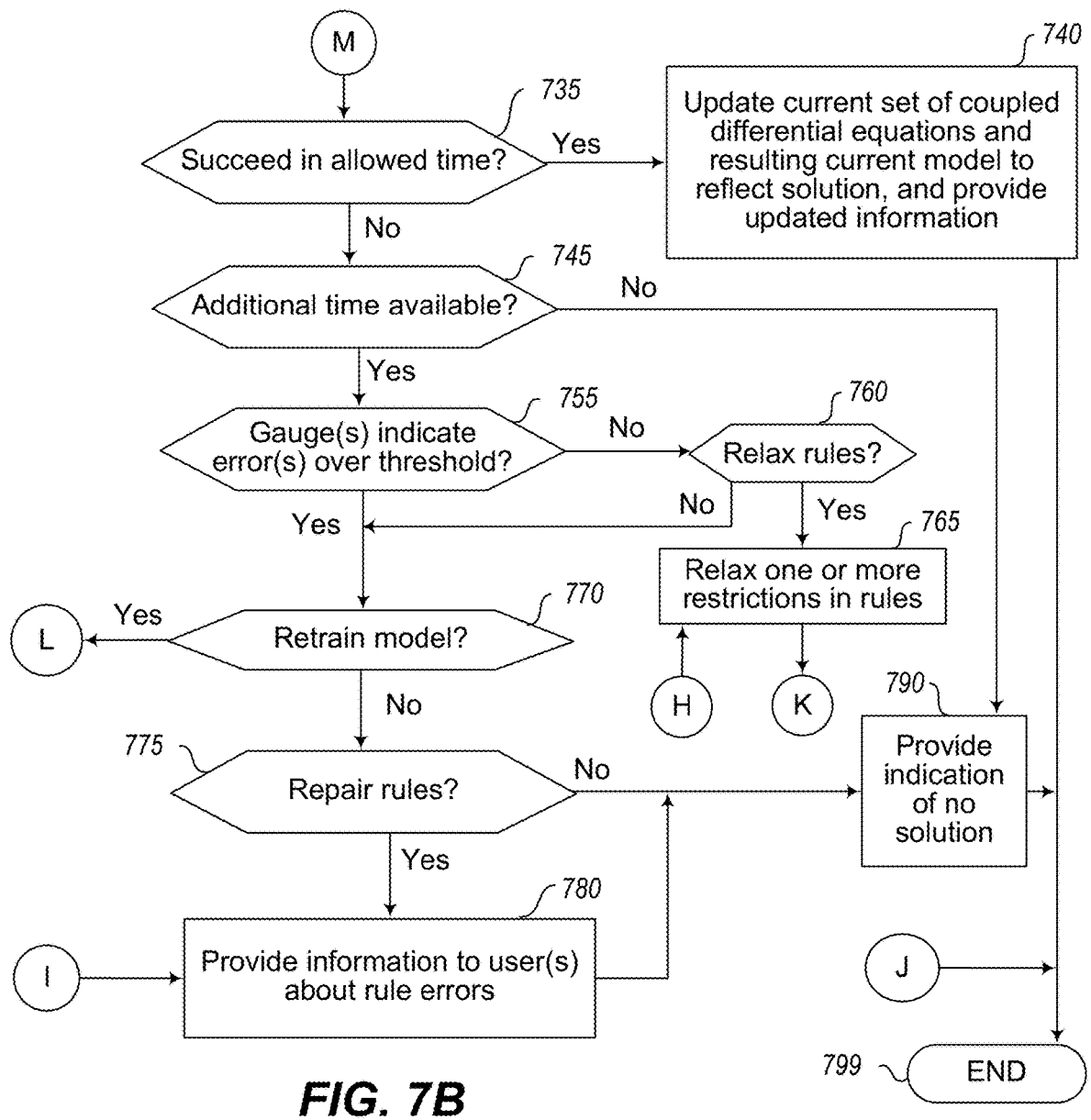

FIGS. 7A-7B are a flow diagram of an example embodiment of a CDD Control Action Determination routine 700. The routine may, for example, be provided by execution of the component 344 of FIG. 3 and/or components 144a-n or 184 of FIG. 1C, such as to determine control actions for a decision module to propose and/or implement for a target system during a particular time period, including in some embodiments to perform an optimization to determine near-optimal actions (e.g., within a threshold of an optimal solution) to perform with respect to one or more goals if possible. While the illustrated embodiment of the routine is performed in a manner local to a particular decision module, such that some or all decision modules may each implement a local version of such a routine, in other embodiments the routine may be implemented in a centralized manner by one or more components with which one or more decision modules interact over one or more networks, such as with a particular decision module indicated to be used at a particular time rather than acting on behalf of the local decision module.

The illustrated embodiment of the routine 700 begins at block 703, where information or a request is received. The routine continues to block 705 to determine a type of the information or request, and to proceed accordingly. In particular, if a request is received in block 703 to attempt to determine a solution for a current time period given a current model of the local decision module, the routine continues to block 710 to begin to perform such activities, as discussed in greater detail with respect to block 710-790. If it is instead determined in block 705 that a request to relax one or more rules or other restrictions for the current model of the local decision module is received, such as discussed in greater detail with respect to blocks 760 and 765, the routine continues to block 765. If it is determined in block 705 that a request is received to repair one or more rules or other restrictions for the current model of the local decision module, such as discussed in greater detail with respect to blocks 775 and 780, the routine continues to block 780 to obtain user input to use during the rule repair process (e.g., to interact with a CDD Decision Module Construction component, or to instead interact with one or more users in another manner), such as to allow the current model for the local decision module to later be updated and replaced based on further resulting user actions, or if operation of the target system can be suspended, to optionally wait to further perform the routine 700 until such an updated model is received. If it is instead determined in block 705 that the information or request is of another type, the routine continues instead to block 708 to perform one or more other indicated operations as appropriate, and to then proceed to block 799. Such other indicated operations may include, for example, receiving information about current models and/or control actions proposed or performed by one or more other decision modules that are collectively controlling a target system with the local decision module (such as for use in synchronizing the model of the local decision module with such other decision modules by generating a consensus or converged shared model, as discussed in greater detail with respect to routine 800 of FIGS. 8A-8B), to receive updates to a model or underlying information for the model for use in ongoing operation of the routine 700 (e.g., from a CDD Decision Module Construction component, such as results from interactions performed in block 780; from a CDD Model realization system component, such as discussed in FIG. 9; etc.), to receive current state information for the target system, such as for use as discussed in routine 600 of FIGS. 6A-6B, etc.

If it determined in block 705 that a request for a solution was received in block 703 for a current time period and based on a current model of the local decision module, the routine continues to block 710 to receive a current set of coupled differential equations that represent the current model for the local decision module of at least a portion of the target system, optionally along with additional state information for the target system for the current time. The routine then continues to block 715 to determine whether to train or re-train the model, such as if the routine is called for a first time upon initial execution of a corresponding decision module or if error measurements from ongoing operations indicate a need for re-training, as discussed in greater detail with respect to blocks 755, 770 and 730. If it is determined to train or re-train the model, the routine continues to block 720 to determine one or more of the size of a training time window, size of training time slices within the time window, and/or type of training time slices within the training time window, such as in a manner similar to that previously discussed with respect to block 553 of routine 500 of FIGS. 5A-5B. After block 720, the routine continues to block 725 to use partial initial state information for the target system to train the model, including to estimate values of state variables for the target system that are not known and/or directly observable, by simulating effects of performing control actions over the time window for each of the time slices, as discussed in greater detail with respect to block 555 of routine 500 of FIGS. 5A-5B.

After block 725, or if it is instead determined in block 715 not to train or re-train the model, the routine continues to block 730 to perform a piecewise linear analysis to attempt to determine a solution for the current model and any additional state information that was obtained in block 710, with the solution (if determined) including one or more proposed control action determinations for the local decision module to take for a current time period, as well as in some embodiments to use one or more model error gauges to make one or more error measurements with respect to the current model, as discussed in greater detail elsewhere. The routine then continues to block 735 to determine if the operations in block 730 determined a solution within an amount of time allowed for the operation of block 730 (e.g., a defined subset or fraction of the current time period), and if so continues to block 740 to update the current set of coupled differential equations and the resulting current model for the local decision module to reflect the solution, with the resulting updated information provided as an output of the routine 700.

If it is instead determined in block 735 that the operations in block 730 did not determine a solution, the routine continues to block 745 to determine if additional time is available within the current time period for further attempts to determine a solution, and if not continues to block 790 to provide output of the routine 700 indicating that no solution was determined for the current time period.

If additional time is available within the current time period, however, the routine continues to perform blocks 755-780 to perform one or more further attempts to identify the solution—it will be appreciated that one or more of the operations of blocks 755-780 may be repeatedly performed multiple times for a given time period if sufficient time is available to continue further solution determination attempts. In particular, the routine continues to block 755 if additional time is determined to be available in block 745, where it determines whether the measurements from one or more gauges indicate model error measurements that are over one or more thresholds indicating modifications to the model are needed, such as based on the model error measurements from the gauges discussed with respect to block 730. If not, the routine continues to block 760 to determine whether there are one or more rules or other restrictions in the current model that are available to be relaxed for the current time period (that have not previously attempted to be relaxed during the time period, if this is not the first pass through this portion of the routing for the current time period), and if so continues to block 765 to relax one or more such rules or other restrictions and to return to block 730 to re-attempt the piecewise linear analysis with the revised model based on those relaxed rules or other restrictions.

If it is instead determined in block 755 that the model error measurements from one or more of the gauges are sufficient to satisfy one or more corresponding thresholds, the routine continues instead to block 770 to determine whether to re-train the model based on one or more of the gauges indicating sufficient errors to do so, such as based on accumulated errors over one or more time periods of updates to the model. If so, the routine returns to block 720 to perform such re-training in blocks 720 and 725, and then continues to block 730 to re-attempt the piecewise linear analysis with the resulting re-trained model.

If it is instead determined in block 770 not to re-train the model (or if the model was re-trained already for the current time period and the resulting re-attempt in block 730 again failed to find a solution), the routine continues to block 775 to determine whether the model error measurements from one or more of the gauges indicate a subset of one or more rules or other restrictions in the model that potentially have errors that need to be repaired. If so, the routine continues to block 780 to provide information to one or more users via the CDD Decision Module Construction component, to allow the users to revise the rules or other restrictions as appropriate, although in other embodiments some or all such rule repair activities may instead be attempted or performed in an automated manner. After block 780, or if it is instead determined in block 775 not to repair any rules, the routine continues to block 790 to provide an indication that no solution was determined for the current time period. After blocks 740, 708, or 790, the routine continues to block 799 and ends. It will be appreciated that if the routine 700 was instead implemented as a centralized routine that supports one or more decision modules remote from the executing component for the routine, the routine 700 may instead return to block 703 to await further information or requests.

Figure 8A:
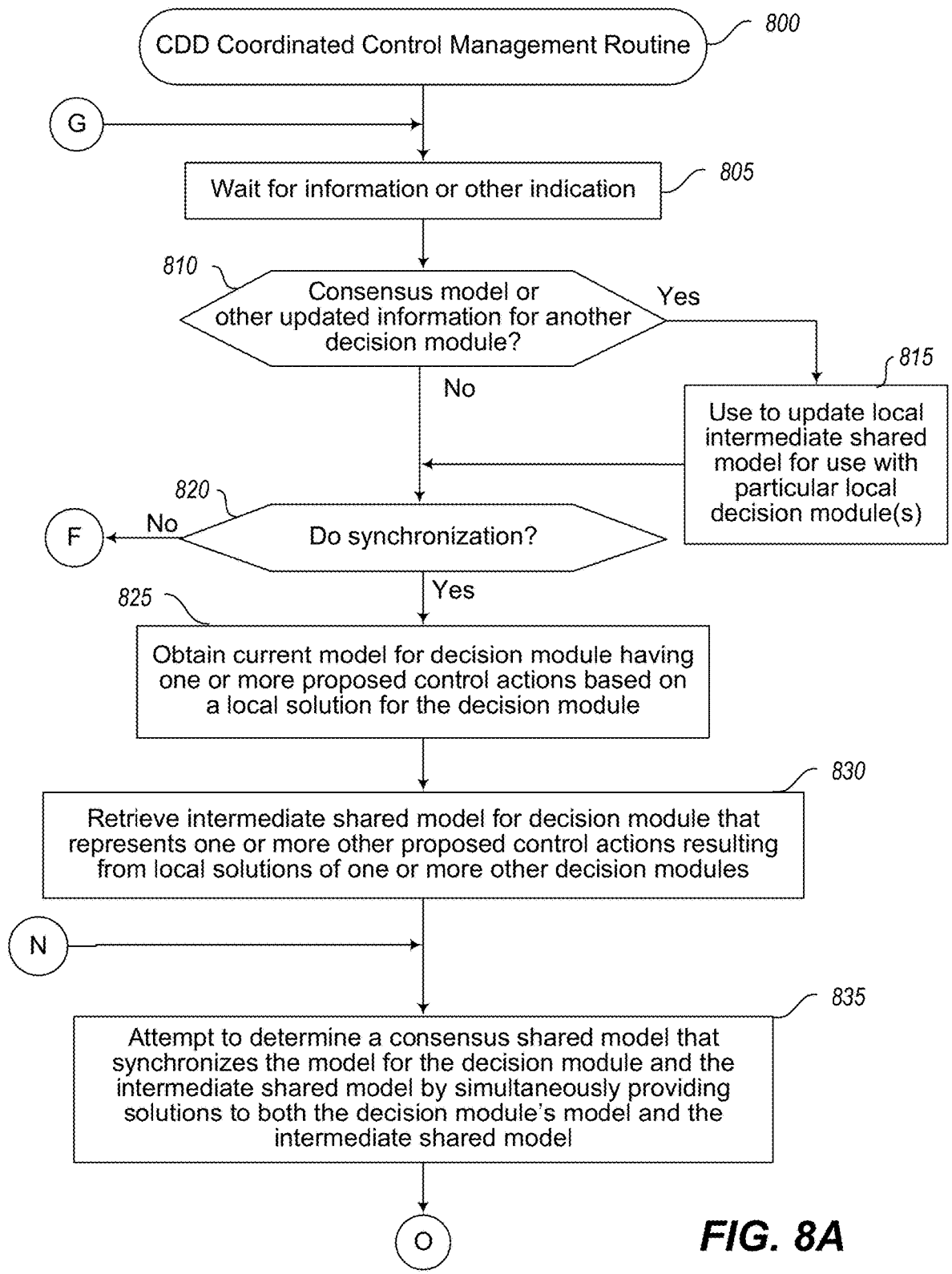
FIGS. 8A-8B illustrate a flow diagram of an example embodiment of a CDD Coordinated Control Management routine.
Figure 8B:
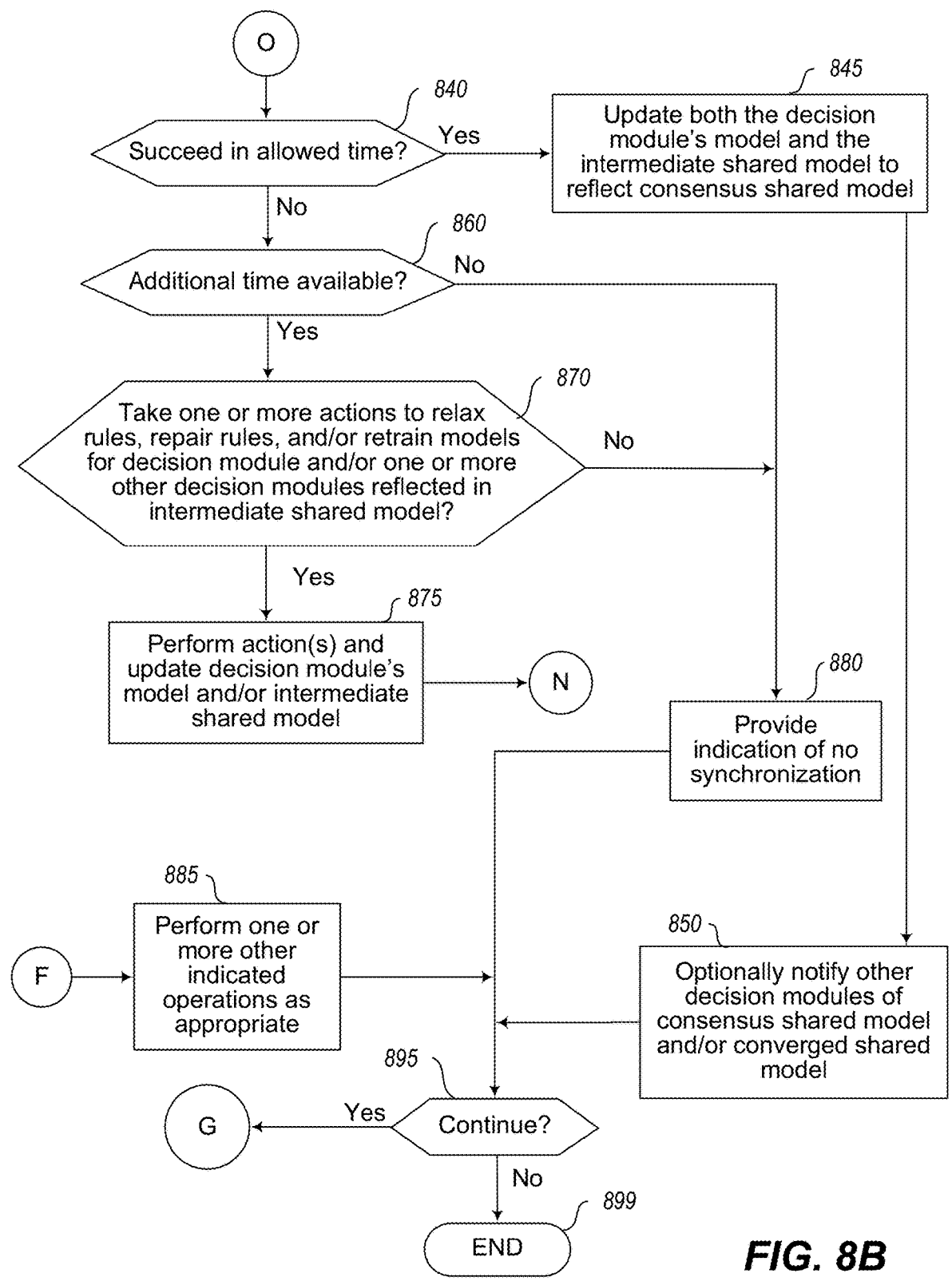

FIGS. 8A-8B are a flow diagram of an example embodiment of a CDD Coordinated Control Management routine 800. The routine may, for example, be provided by execution of the component 346 of FIG. 3 and/or the components 146a-n of FIG. 1C, such as to attempt to synchronize current models and their proposed control actions between multiple decision modules that are collectively controlling a target system. In the illustrated embodiment of the routine, the synchronization is performed in a pairwise manner between a particular local decision module's local current model and an intermediate shared model for that decision module that is based on information about the current state of one or more other decision modules, by using a Pareto game technique to determine a Pareto equilibrium if possible that is represented in a consensus shared model, although in other embodiments other types of synchronization methods may be used. In addition, in the illustrated embodiment, the routine 800 is performed in a local manner for a particular local decision module, such as by being included within that local decision module, although in other embodiments the routine 800 may be implemented in a centralized manner to support one or more decision modules that are remote from a computing system implementing the component for the routine and that communicate with those decision modules over one or more computer networks, such as with a particular decision module indicated to be used at a particular time rather than acting on behalf of the local decision module.

The illustrated embodiment of the routine 800 begins at block 805, where it waits to receive information or another indication. The routine continues to block 810 to determine if a consensus model or other updated information for another decision module has been received, such as from a copy of the routine 800 executing for that other decision module, and if so continues to block 815 to use the received information to update local intermediate shared model information for use with the local decision module on whose behalf the current copy of the routine 800 is executing, as discussed in greater detail with respect to block 830. If it is instead determined in block 810 that the information or request received in block 805 is not information related to one or more other decision modules, or after block 815, the routine continues to block 820 to determine whether to currently perform a synchronization for the current local model of the local decision module by using information about an intermediate shared model of the local decision module that includes information for one or more other decision modules, such as to do such synchronization each time that an update to the local decision module's model is received (e.g., based on operation of the routine 700 for a copy of the CDD Control Action Determination component local to that decision module) in block 805 and/or each time that information to update the local decision module's intermediate shared model is received in block 805 and used in block 815, or instead as explicitly indicated in block 805—if the synchronization is to currently be performed, the routine continues to block 825 and begins to perform blocks 820-880 related to such synchronization activities. Otherwise, the routine continues to block 885 to perform one or more other indicated operations as appropriate, such as to receive requests from the CDD system or other requestor for current information about operation of the routine 800 and/or to provide corresponding information to one or more entities (e.g., to reflect prior requests), etc.

If it is determined in block 820 that synchronization is to be currently performed, such as based on updated model-related information that is received in block 805, the routine continues to block 825 to obtain a current local model for the local decision module to use in the synchronizing, with the model including one or more proposed control actions to perform for a current time period based on a local solution for the local decision module. The routine then continues to block 830 to retrieve information for an intermediate shared model of the local decision module that represents information for one or more other decision modules (e.g., all other decision modules) that are collectively participating in controlling the target system, with that intermediate shared model similarly representing one or more other proposed control actions resulting from local solutions of those one or more other decision modules, optionally after partial or complete synchronization has been performed for those one or more other decision modules between themselves.

The routine then continues to block 835 to attempt to determine a consensus shared model that synchronizes the current model of the local decision module and the intermediate shared model by simultaneously providing solutions to both the local decision module's current model and the intermediate shared model. In some embodiments, the operations of block 835 are performed in a manner similar to that discussed with respect to blocks 710-730 of routine 700 of FIG. 7A-7B, such as if the local model and the intermediate shared model are combined to create a combination model for whom one or more solutions are to be identified. As discussed in greater detail elsewhere, in some embodiments, the local current model and intermediate shared model may each be represented by a Hamiltonian function to enable a straightforward creation of such a combined model in an additive manner for the respective Hamiltonian functions, with the operations of routines 600 and/or 700 of FIGS. 6A-6B and 7A-7B, respectively, similarly representing the models that they update and otherwise manipulate using such Hamiltonian functions.

After block 835, the routine continues to block 840 to determine whether the operations of block 835 succeeded in an allowed amount of time, such as a fraction or other portion of the current time period for which the synchronization is attempted to be performed, and if so the routine continues to block 845 to update both the local model and the intermediate shared model of the local decision module to reflect the consensus shared model. As earlier noted, if sufficient time is allowed for each decision module to repeatedly determine a consensus shared model with changing intermediate shared models representing one or more other decision modules of a collective group, the decision modules of the collective group may eventually converge on a single converged shared model, although in other embodiments and situations there may not be sufficient time for such convergence to occur, or other issues may prevent such convergence. After block 845, the routine continues to block 850 to optionally notify other decision modules of the consensus shared model determined for the local decision module (and/or of a converged shared model, if the operations of 835 were a last step in creating such a converged shared model), such as if each of the notified decision modules is implementing its own local version of the routine 800 and the provided information will be used as part of an intermediate shared model of those other decision modules that includes information from the current local decision module's newly constructed consensus shared model.

If it is instead determined in block 840 that a synchronization did not occur in the allowed time, the routine continues to perform blocks 860-875 to re-attempt the synchronization with one or more modifications, sometimes repeatedly if sufficient time is available, and in a manner similar to that discussed with respect to blocks 745-780 of routine 700 of FIGS. 7A-7B. In the illustrated example, the routine determines in block 860 if additional time is available for one or more such re-attempts at synchronization, and if not the routine continues to block 880 to provide an indication that no synchronization was performed within the allowed time. Otherwise, the routine continues to block 870 to take one or more actions to perform one or more of relaxing rules or other restrictions, repairing rules or other restrictions, and/or re-training a model, with respect to one or both of the current model of the local decision module and/or one or more other decision modules whose information is represented in the intermediate shared model of the local decision module. If it is determined in block 870 to proceed in this manner, the routine continues to block 875 to perform corresponding actions, sometimes one at a time in a manner similar to that discussed with respect to routine 700, including to cause resulting updates to the current model of the local decision module and/or to the local intermediate shared model of the local decision module, after which the routine returns to block 835 to re-attempt to synchronize the local model and the intermediate shared model of the local decision module.

If it is instead determined in block 870 that no further actions are to be performed with respect to relaxation, repair and/or re-training, the routine continues instead to block 880. After blocks 850, 880 or 885, the routine continues to block 895 to determine whether to continue, such as until an explicit indication to terminate or suspend operation of the routine 800 is received, such as to reflect an end to operation of the target system and/or an end to use of the local decision module and/or a collective group of multiple decision modules to control the target system. If it is determined to continue, the routine returns to block 805, and otherwise continues to block 899 and ends.

FIG. 9 is a flow diagram of an example embodiment of a CDD Model Realization System routine 900. The routine may, for example, be provided by execution of the component 195c of FIG. 1A, the example model realization system (s) discussed with respect to FIGS. 2A-2H, component 345 of FIG. 3 and/or as otherwise discussed herein. In the illustrated embodiment of the routine, the routine 900 may be performed as a stand-alone and/or centralized system that supports multiple decision modules (e.g., to generate battery models before or during construction of the decision modules for their later use), such as for decision modules implemented on systems that are remote from a computing system implementing the component for the routine and that communicate with the computing system over one or more computer networks, although in other embodiments the routine may instead be performed in a local manner for a particular local decision module, such as by being included within that local decision module.

The illustrated embodiment of the routine 900 begins at block 903, where it receives instructions or other information. In block 905, the routine then determines whether instructions received in block 903 are to generate one or more battery models for indicated batteries, and if so continues to block 910, where it receives information about one or more batteries of a target system. In block 915, the routine then determines and generates a battery behavior model for each of the one or more indicated batteries, as discussed in greater detail elsewhere herein, and stores those generated models for subsequent use.

After block 915, or if it is instead determined in block 905 that the instructions received in block 903 are not to generate one or more battery models for indicated batteries, the routine continues to block 925 to determine if the instructions received in block 903 indicate to use a battery as a reference standard (e.g., for a type of battery, for a particular target system, etc.) against which to compare other batteries, and if so continues to block 930 to store a model for that battery to be a reference standard model (e.g., for one of the battery models just generated in block 915, for a previously generated and stored model for a battery, for a battery model received in block 903, etc.).

After block 930, or if it is instead determined in block 925 that the instructions received in block 903 are not to use a battery as a reference standard, the routine continues to block 935 to determine if the instructions received in block 903 indicate to compare at least one battery to a reference standard battery (e.g., with models for the at least one battery and/or the reference standard battery just generated in block 915), and if so continues to block 940. In block 940, the model for each of the indicated batteries is compared to the reference standard model, and a determination is made of whether differences between the two models are sufficiently small (e.g., below a defined threshold), such as to indicate that the battery whose model is being compared to the reference standard is of sufficiently high quality (or otherwise sufficiently similar to the reference standard battery) for subsequent use in a target system.

After block 940, or if it is instead determined in block 935 that the instructions received in block 903 are not to compare at least one battery to a reference standard battery, the routine continues to block 945 to determine if the instructions received in block 903 indicate to compare two or more batteries to each other (e.g., with models for some or all of the two or more batteries just generated in block 915), and if so continues to block 950. In block 950, the model for each of the indicated batteries is compared to each other (e.g., with respect to one or more performance metrics for the batteries, such as voltage and/or current output under one or more battery charge levels and/or loads; to one or more error measures associated with the batteries' model generation; etc.), and a determination is made of zero or more of the models that satisfy one or more indicated criteria (e.g., the top 1 or N batteries from the comparison, the top X % of batteries from the comparison, all batteries that satisfy a specified performance metric, etc.), such as to indicate that the corresponding batteries (if any) for the determined one or more models are of sufficiently high quality (or otherwise sufficiently satisfy the indicated criteria) for subsequent use in a target system.

After block 950, or if it is instead determined in block 945 that the instructions received in block 903 are not to compare two or more batteries to each other, the routine continues to block 985 to optionally perform one or more indicated operations if appropriate. Non-exclusive examples of such other operations may include, for example, retrieving a previously generated model for a particular battery or battery type (e.g., a reference standard model for the battery type) for use in a decision module being constructed or for another purpose, receiving information at other times than initial model generation (e.g., to update a battery model, such as based on additional information obtained during use of the battery in a target system) and storing and/or using that received information (e.g., to perform a corresponding model update), etc. After bock 985, the routine continues to block 990 to provide requested information and/or information determined during the routine execution (e.g., in one or more of blocks 940 and 950) to a requester (e.g., another routine from which the routine 900 was invoked, such as with respect to block 525 of routine 500), and then continues to block 995.

In block 995 the routine determines whether to continue, such as until an explicit indication to terminate is received. If it is determined to continue, the routine returns to block 910, such as to perform further updates to the total system model, and otherwise continues to block 999 and ends.

FIG. 10 illustrates a flow diagram of an example embodiment of a routine 1000 performed for a representative generic target system, with respect to interactions between the target system and one or more decision modules that are controlling at least a portion of the target system. The routine may, for example, be provided by execution of a target system 360 and/or 370 of FIG. 3, an electrical device 195b of FIG. 1A, a battery 205b discussed with respect to FIGS. 2A-2H, and/or a target system 160 and/or 170 of FIGS. 1B and 1C, such as to implement operations specific to the target system. It will be appreciated that the illustrated embodiment of the routine focuses on interactions of the target system with the one or more decision modules, and that many or all such target systems will perform many other operations in a manner specific to those target systems that are not illustrated here for the purpose of brevity.

The routine begins at block 1010, where it optionally provides initial state information for the target system to a CDD system for use in an automated control system of the CDD system for the target system, such as in response to a request from the CDD system or its automated control system for the target system, or instead based on configuration specific to the target system (e.g., to be performed upon startup of the target system). After block 1010, the routine continues to block 1020 to receive one or more inputs from a collective group of one or more decision modules that implement the automated control system for the target system, including one or more modified values for or other manipulations of one or more control elements of a plurality of elements of the target system that are performed by one or more such decision modules of the automated control system. As discussed in greater detail elsewhere, the blocks 1020, 1030, 1040 may be repeatedly performed for each of multiple time periods, which may vary greatly in time depending on the target system (e.g., a microsecond, a millisecond, a hundredth of a second, a tenth of a second, a second, 2 seconds, 5 seconds, 10 seconds, 15 seconds, 30 seconds, a minute, 5 minutes, 10 minutes, 15 minutes, 30 minutes, an hour, etc.).

After block 1020, the routine continues to block 1030 to perform one or more actions in the target system based on the inputs received, including to optionally produce one or more resulting outputs or other results within the target system based on the manipulations of the control elements. In block 1040, the routine then optionally provides information about the outputs or other results within the target system and/or provides other current state information for the target system to the automated control system of the CDD system and/or to particular decision modules of the automated control system, such as to be obtained and measured or otherwise analyzed via passive sensors and/or active sensors. The routine then continues to block 1095 to determine whether to continue, such as until an explicit indication to terminate or suspend operation of the target system is received. If it is determined to continue, the routine returns to block 1020 to begin a next set of control actions for a next time period, and otherwise continues to block 1099 and ends. As discussed in greater detail elsewhere, state information that is provided to a particular decision module may include requests from external systems to the target system, which the automated control system and its decision modules may determine how to respond to in one or more manners.

It will also be appreciated that in some embodiments the functionality provided by the routines discussed above may be provided in alternative ways, such as being split among more routines or consolidated into fewer routines. Similarly, in some embodiments illustrated routines may provide more or less functionality than is described, such as when other illustrated routines instead lack or include such functionality respectively, or when the amount of functionality that is provided is altered. In addition, while various operations may be illustrated as being performed in a particular manner (e.g., in serial or in parallel, synchronously or asynchronously, etc.) and/or in a particular order, those skilled in the art will appreciate that in other embodiments the operations may be performed in other orders and in other manners. Those skilled in the art will also appreciate that the data structures discussed above may be structured in different manners, such as by having a single data structure split into multiple data structures or by having multiple data structures consolidated into a single data structure. Similarly, in some embodiments illustrated data structures may store more or less information than is described, such as when other illustrated data structures instead lack or include such information respectively, or when the amount or types of information that is stored is altered.

From the foregoing it will be appreciated that, although specific embodiments have been described herein for purposes of illustration, various modifications may be made without deviating from the spirit and scope of the invention. Accordingly, the invention is not limited except as by the appended claims and the elements recited therein. In addition, while certain aspects of the invention are presented below in certain claim forms, the inventors contemplate the various aspects of the invention in any available claim form. For example, while only some aspects of the invention may currently be recited as being embodied in a computer-readable medium, other aspects may likewise be so embodied.

What is claimed is:

1. A computer-implemented method comprising:
   generating, by a model realization system implemented on one or more first configured computing systems, a behavioral model for a battery that represents behavior at multiple charge levels and multiple resistive loads, including:
      learning, for each of a plurality of combinations of one of the multiple charge levels and one of the multiple resistive loads, the behavior of the battery for a combination of the one charge level and the one resistive load by:
         applying, while a charge level of the battery corresponds to the one charge level, the one resistive load to the battery;
         supplying one or more first multi-frequency microvolt pulses into an anode of the battery;
         supplying one or more second multi-frequency microvolt pulses into a cathode of the battery; and
         using active sensors to measure changes in responses of the battery over time to the supplied one or more first multi-frequency microvolt pulses and to the supplied one or more second multi-frequency microvolt pulses; and
      combining the learned behavior of the battery for each of the plurality of combinations to produce the behavioral model for the battery;
   generating, by a decision module construction component implemented on one or more second configured computing systems, and for a physical system that includes the battery and one or more controls that are manipulatable to modify at least one output of the physical system, a model representing the physical system that is based on the behavioral model for the battery and is further based on binary rules using operating principles of the physical system and evaluating state information for the battery to reach true or false values for control actions to perform to manipulate the one or more controls; and
   controlling, by at least one third configured computing system, operations of the physical system that involve supplying electrical power from the battery, including using state information for the battery and the generated model representing the physical system to determine one or more control actions to perform, and performing the one or more control actions to manipulate the one or more controls and modify the at least one output of the physical system.

2. The computer-implemented method of claim 1 wherein the learning of the behavior of the battery for each of the plurality of combinations of a charge level and a resistive load includes generating a parametric non-linear model of the battery for that charge level and resistive load, and wherein the combining of the learned behavior of the battery for each of the plurality of combinations includes combining the generated parametric non-linear models for the plurality of combinations to generate an incremental parametric non-linear behavioral model for the battery.

3. The computer-implemented method of claim 1 wherein the battery is of an indicated type of battery, and wherein the method further comprises storing the generated behavioral model as a reference standard behavioral model for the indicated type of the battery, and using the stored reference standard behavioral model to evaluate additional generated behavior models for respective additional batteries of the indicated type of battery.

4. The computer-implemented method of claim 3 wherein the stored reference standard behavioral model represents an acceptable battery for the indicated type of battery, and wherein the using of the stored reference standard behavioral model to evaluate the additional generated behavior models for the respective additional batteries of the indicated type of battery includes, for each of the respective additional batteries:
   generating, by the model realization system implemented on the one or more first configured computing systems, the additional behavioral model for the respective additional battery that represents behavior at multiple charge levels and multiple resistive loads, including learning the behavior of the respective additional battery by supplying electrical pulses into the respective additional battery for the multiple charge levels and multiple resistive loads and by measuring changes in responses of the respective additional battery to the supplied electrical pulses;
   determining, by the model realization system implemented on the one or more first configured computing systems, differences between the generated additional behavioral model and the stored reference standard behavioral model; and
   providing information, by the model realization system implemented on the one or more first configured computing systems, indicating that the respective additional battery is acceptable for use if the determined differences are below a defined threshold, and otherwise indicating that the respective additional battery is not acceptable for use.

5. The computer-implemented method of claim 3 wherein the stored reference standard behavioral model represents batteries to be used in a target system having multiple batteries of the indicated type that produce consistent behavior, and wherein the using of the stored reference standard behavioral model to evaluate the additional generated behavior models for the respective additional batteries of the indicated type of battery includes, for each of the respective additional batteries:

generating, by the model realization system implemented on the one or more first configured computing systems, the additional behavioral model for the respective additional battery that represents behavior at multiple charge levels and multiple resistive loads, including learning the behavior of the respective additional battery by supplying electrical pulses into the respective additional battery for the multiple charge levels and multiple resistive loads and by measuring changes in responses of the respective additional battery to the supplied electrical pulses;

determining, by the model realization system implemented on the one or more first configured computing systems, differences between the generated additional behavioral model and the stored reference standard behavioral model; and providing information, by the model realization system implemented on the one or more first configured computing systems, indicating that the respective additional battery is acceptable for use in the target system if the determined differences are below a defined threshold, and otherwise indicating that the respective additional battery is not acceptable for use in the target system.

6. The computer-implemented method of claim 3 further comprising:

generating, for a target system that includes a second battery of the indicated type of battery and one or more second controls that are manipulatable to modify at least one second output of the target system, a second model representing the target system that is based on the stored reference standard behavioral model and is further based on binary rules using operating principles of the target system and evaluating state information for the second battery to reach true or false values for control actions to perform to manipulate the one or more second controls; and controlling operations of the target system that involve supplying electrical power from the second battery, including using state information for the second battery and the generated second model to determine one or more second control actions to perform, and performing the one or more second control actions to manipulate the one or more second controls and modify the at least one second output of the target system.

7. The computer-implemented method of claim 6 further comprising:

learning, during the controlling of the operations of the target system, an update for the stored reference standard behavioral model used in the generated second model to reflect actual operations of the second battery;

updating the generated second model to include the update for the stored reference standard behavioral model; and using the updated generated second model and further state information for the second battery to determine one or more additional control actions to perform in the target system, and performing the one or more additional control actions to further manipulate the one or more second controls and further modify the at least one second output of the target system.

8. The computer-implemented method of claim 7 wherein the controlling of the operations of the physical system includes using a control loop to implement determining of control actions to perform and performing of determined control actions, and using a separate learning feedback loop to perform the learning of the update and the updating of the generated second model.

9. The computer-implemented method of claim 1 further comprising:

generating, by the model realization system implemented on the one or more first configured computing systems, multiple additional behavioral models for multiple respective additional batteries by, for each of the multiple respective additional batteries, learning behavior of the respective additional battery at multiple charge levels and multiple resistive loads by supplying electrical pulses into the respective additional battery for the multiple charge levels and multiple resistive loads and by measuring changes in responses of the respective additional battery to the supplied electrical pulses, and combining the learned behavior of the respective additional battery for the multiple charge levels and multiple resistive loads to produce the additional behavioral model for the respective additional battery;

comparing, by the model realization system implemented on the one or more first configured computing systems, the multiple additional behavioral models to each other to determine at least one of the respective additional batteries that satisfies one or more indicated relative criteria better than other of the respective additional batteries; and providing information, by the model realization system implemented on the one or more first configured computing systems, indicating to use the determined at least one respective additional battery for use in a target system.

10. The computer-implemented method of claim 9 further comprising storing the additional behavior model for one of the determined at least one respective additional batteries as a reference standard behavioral model to represent an acceptable battery for at least one of an indicated type of battery or an associated group of batteries to be used together, and using the stored reference standard behavioral model to evaluate further generated behavior models for respective further batteries for the at least one of the indicated type of battery or the associated group of batteries to be used together.

11. The computer-implemented method of claim 1 wherein the generating of the behavioral model for the battery is performed at a first time, and wherein the method further comprises:

generating, by the model realization system implemented on one or more first configured computing systems, and at each of multiple additional times after the first time, a respective additional behavioral model for the battery;

comparing, by the model realization system implemented on one or more first configured computing systems, the generated behavioral model for the first time and the generated respective additional behavioral model for each of the multiple additional times to determine degradation in performance of the battery over use from the first time to an end of the multiple additional times; and providing, by the model realization system implemented on one or more first configured computing systems, information about the degradation in the performance of the battery.

12. The computer-implemented method of claim 1 wherein the applying, for a combination of one of the multiple charge levels and one of the multiple resistive loads, of the one resistive load to the battery further includes:
  estimating, by the model realization system implemented on one or more first configured computing systems, the one charge level for the battery based at least in part on information about previous interactions with the battery; and
  selecting, by the model realization system implemented on one or more first configured computing systems, the combination of the one charge level and the one resistive load for which to learn the behavior of the battery based at least in part on the estimated one charge level.

13. The computer-implemented method of claim 1 wherein the controlling of the operations of the physical system is performed repeatedly for a plurality of times and involves determining and performing further control actions at one or more of the plurality of times that manipulate the one or more controls to cause electrical power to be supplied to the battery for storage.

14. The computer-implemented method of claim 1 wherein the controlling of the operations of the physical system is performed repeatedly for a plurality of times and involves determining and performing second control actions at one of the plurality of times that manipulate the one or more controls to cause a first amount of electrical power requested for the one time to be supplied from the battery for use by an electrical load, and further involves, at another of the plurality of times different from the one time, determining and performing third control actions that manipulate the one or more controls to prevent a second amount of electrical power requested for the another time to be supplied from the battery for use by the electrical load.

15. The computer-implemented method of claim 1 wherein determining of the one or more control actions to perform includes determining an amount of electrical power to supply from the battery based at least in part on the state information for the battery, and manipulating the one or more controls to cause the determined amount of electrical power to be supplied from the battery.

16. The computer-implemented method of claim 1 wherein the physical system includes an electrical vehicle, wherein the one or more controls provide instructions that result in modifying movement of the electrical vehicle, wherein the at least one output includes the modified movement of the electrical vehicle, and wherein the generated model representing the physical system is further based on at least one specified goal that includes maximizing life of the battery while supplying energy to and/or from the battery according to indicated criteria.

17. The computer-implemented method of claim 1 wherein the physical system includes an electricity generating facility that stores generated electricity in the battery, wherein the one or more controls provide instructions that result in supplying electricity to and/or from the battery, wherein the at least one output includes the supplying of the electricity to and/or from the battery, and wherein the generated model representing the physical system is further based on at least one specified goal that includes maximizing life of the battery.

18. The computer-implemented method of claim 1 wherein the physical system further includes one or more super capacitor elements that store and/or supply electricity, wherein the one or more controls provide instructions that result in supplying electricity to and/or from the one or more super capacitor elements according to indicated criteria, and wherein the at least one output includes the supplying of the electricity to and/or from the one or more super capacitor elements.

19. The computer-implemented method of claim 18 wherein determining of the one or more control actions to perform includes determining to supply electricity to and/or from the one or more super capacitor elements during times when a change in rate of supply and/or demand exceeds a defined threshold, and wherein the generated model representing the physical system is further based on at least one specified goal that includes maximizing life of the battery.

20. The computer-implemented method of claim 1 wherein the generated model representing the physical system includes a total Hamiltonian function that is based on the binary rules and on historical data from previous operations of the physical system, wherein the binary rules include one or more absolute rules that specify non-modifiable restrictions that are requirements regarding the operations of the physical system, and further include one or more hard rules that specify restrictions regarding the operations of the physical system that can be modified in specified situations, and wherein the total Hamiltonian function is further based in part on one or more soft rules that each specifies one or more additional conditions to be evaluated to reach one of multiple possible values other than true or false with an associated likelihood.

21. A non-transitory computer-readable medium having stored contents that cause one or more computing systems to perform automated operations, the automated operations comprising:
  generating, by at least one of the one or more computing systems, a behavioral model for a battery that represents behavior of the battery at multiple charge levels and multiple resistive loads, including learning the behavior of the battery by supplying electrical signals into the battery for the multiple charge levels and multiple resistive loads and by measuring changes in responses of the battery to the supplied electrical signals, including learning, for each of a plurality of combinations of one of the multiple charge levels and one of the multiple resistive loads, the behavior of the battery for a combination of the one charge level and the one resistive load by:
    applying, while a charge level of the battery corresponds to the one charge level, the one resistive load to the battery;
    supplying each of multiple multi-frequency microvolt pulses into at least one of an anode or a cathode of the battery; and
    measuring changes in responses of the battery over time to the supplied multiple multi-frequency microvolt pulses;
  combining the learned behavior of the battery for each of the plurality of combinations to produce the behavioral model for the battery; and
  controlling, by at least one of the one or more computing systems and using the generated behavioral model, operations of the battery by using state information for the battery and the generated behavioral model to determine one or more control actions to perform, performing the one or more control actions to modify the operations of the battery, and obtaining further state information for the battery from multiple sensors about characteristics of the battery during the operations.

22. The non-transitory computer-readable medium of claim 21 wherein the generated behavioral model is an incremental parametric non-linear behavioral model for the battery, and wherein the stored contents are software instructions of a model realization system.

23. The non-transitory computer-readable medium of claim 21 wherein the battery is part of a physical system further having one or more outputs and having one or more controls that are manipulatable to modify at least one output and having sensors to measure the state information for the battery, and wherein the controlling of the operations of the battery further includes using a model for the physical system with binary rules that use operating principles of the physical system and that evaluate the state information for the battery to reach true or false values for control actions to perform to manipulate the one or more controls.

24. A non-transitory computer-readable medium having stored contents that cause one or more computing systems to perform automated operations, the automated operations comprising:
  generating, by at least one of the one or more computing systems, a behavioral model for a battery that represents behavior of the battery at multiple charge levels and multiple resistive loads, including learning the behavior of the battery by supplying electrical signals into the battery for the multiple charge levels and multiple resistive loads and by measuring changes in responses of the battery to the supplied electrical signals; and
  controlling, by at least one of the one or more computing systems and using the generated behavioral model, operations of the battery by using state information for the battery and the generated behavioral model to determine one or more control actions to perform, performing the one or more control actions to modify the operations of the battery, and obtaining further state information for the battery from multiple sensors about characteristics of the battery during the operations,
  wherein the battery is part of a physical system further having one or more outputs and having one or more controls that are manipulatable to modify at least one output and having sensors to measure the state information for the battery,
  wherein the controlling of the operations of the battery further includes using a model for the physical system with binary rules that use operating principles of the physical system and that evaluate the state information for the battery to reach true or false values for control actions to perform to manipulate the one or more controls,
  wherein the model for the physical system includes a total Hamiltonian function that is based at least in part on the binary rules and on historical data from previous use of the physical system,
  wherein the binary rules include one or more absolute rules that specify non-modifiable restrictions that are requirements regarding ongoing operations of the physical system, and further include one or more hard rules that specify restrictions regarding the ongoing operations of the physical system that can be modified in specified situations, and
  wherein the stored contents include software instructions that, when executed, further cause the one or more computing systems to generate the total Hamiltonian function based in part on the binary rules and further based on one or more soft rules that each specifies one or more additional conditions to be evaluated to reach one of multiple possible values other than true or false with an associated likelihood.

25. The non-transitory computer-readable medium of claim 24 wherein the generated behavioral model is an incremental parametric non-linear behavioral model for the battery, and wherein the stored contents are software instructions of a model realization system.

26. A system comprising:
  one or more hardware processors of one or more computing systems; and
  one or more memories storing instructions that, when executed by at least one of the one or more hardware processors, cause the system to perform automated operations including at least:
    generating a behavioral model for a type of battery that represents behavior of the type of battery at multiple charge levels and multiple resistive loads, including learning the behavior of the type of battery by supplying electrical signals into one or more first batteries of the type for the multiple charge levels and multiple resistive loads and by measuring changes in responses of the one or more first batteries to the supplied electrical signals, including learning, for each of a plurality of combinations of one of the multiple charge levels and one of the multiple resistive loads, the behavior of the type of battery for a combination of the one charge level and the one resistive load by:
      applying, while a charge level of one of the first batteries corresponds to the one charge level, the one resistive load to the one first battery;
      supplying each of multiple multi-frequency microvolt pulses into at least one of an anode or a cathode of the one first battery; and
      measuring changes in responses of the one first battery over time to the supplied multiple multi-frequency microvolt pulses; and
    combining the learned behavior of the type of battery for each of the plurality of combinations to produce the behavioral model for the type of battery; and
    controlling, by using the generated behavioral model, operations of a second battery of the type of battery by determining one or more control actions to perform based at least in part on the generated behavioral model, and performing the one or more control actions to modify operations of the second battery.

27. The system of claim 26 wherein the generated behavioral model is an incremental parametric non-linear behavioral model for the type of battery, wherein the stored instructions include software instructions of a model realization system, and wherein the second battery is one of the one or more first batteries.

28. The system of claim 26 wherein the second battery is part of a physical system further having one or more outputs and having one or more controls that are manipulatable to modify at least one output and having sensors to measure state information for the second battery, and wherein the controlling of the operations of the second battery further includes using a model for the physical system with binary rules that use operating principles of the physical system and that evaluate the state information for the second battery to reach true or false values for control actions to perform to manipulate the one or more controls.

29. A system comprising:
  one or more hardware processors of one or more computing systems; and one or more memories storing instructions that, when executed by at least one of the one or more hardware processors, cause the system to perform automated operations including at least:
  generating a behavioral model for a type of battery that represents behavior of the type of battery at multiple charge levels and multiple resistive loads, including learning the behavior of the type of battery by supplying electrical signals into one or more first batteries of the type for the multiple charge levels and multiple resistive loads and by measuring changes in responses of the one or more first batteries to the supplied electrical signals; and
  controlling, by using the generated behavioral model, operations of a second battery of the type of battery by determining one or more control actions to perform based at least in part on the generated behavioral model, and performing the one or more control actions to modify operations of the second battery,
  wherein the second battery is part of a physical system further having one or more outputs and having one or more controls that are manipulatable to modify at least one output and having sensors to measure state information for the second battery,
  wherein the controlling of the operations of the second battery further includes using a model for the physical system with binary rules that use operating principles of the physical system and that evaluate the state information for the second battery to reach true or false values for control actions to perform to manipulate the one or more controls, wherein the model for the physical system includes a total Hamiltonian function that is based at least in part on the binary rules and on historical data from previous use of the physical system,
  wherein the binary rules include one or more absolute rules that specify non-modifiable restrictions that are requirements regarding ongoing operations of the physical system, and further include one or more hard rules that specify restrictions regarding the ongoing operations of the physical system that can be modified in specified situations, and
  wherein the stored instructions further cause the system to generate the total Hamiltonian function based in part on the binary rules and further based on one or more soft rules that each specifies one or more additional conditions to be evaluated to reach one of multiple possible values other than true or false with an associated likelihood.

30. The system of claim 29 wherein the generated behavioral model is an incremental parametric non-linear behavioral model for the type of battery, wherein the stored instructions include software instructions of a model realization system, and wherein the second battery is one of the one or more first batteries.

* * * * *